US012717003B2

(12) United States Patent
Fujiwara et al.

(10) Patent No.: US 12,717,003 B2
(45) Date of Patent: Aug. 25, 2026

(54) LIGHT DETECTOR, LIGHT DETECTION SYSTEM, LIDAR DEVICE, AND MOBILE BODY

(71) Applicant: KABUSHIKI KAISHA TOSHIBA, Tokyo (JP)

(72) Inventors: Ikuo Fujiwara, Yokohama Kanagawa (JP); Mariko Shimizu, Tokyo (JP); Honam Kwon, Kawasaki Kanagawa (JP); Kazuhiro Suzuki, Tokyo (JP)

(73) Assignee: KABUSHIKI KAISHA TOSHIBA, Kawasaki (JP)

( * ) Notice: Subject to any disclaimer, the term of this patent is extended or adjusted under 35 U.S.C. 154(b) by 1216 days.

(21) Appl. No.: 17/682,834

(22) Filed: Feb. 28, 2022

(65) Prior Publication Data

US 2023/0083263 A1 Mar. 16, 2023

(30) Foreign Application Priority Data

Sep. 15, 2021 (JP) ................................ 2021-150469
Jan. 12, 2022 (JP) ................................ 2022-002967

(51) Int. Cl.

| | |
|---|---|
| ***H10F 30/223*** | (2025.01) |
| ***G01S 7/481*** | (2006.01) |
| ***H10F 30/225*** | (2025.01) |
| ***H10F 39/00*** | (2025.01) |

(52) U.S. Cl.

CPC .......... *G01S 7/4816* (2013.01); *H10F 30/223* (2025.01); *H10F 30/225* (2025.01); *H10F 39/8037* (2025.01)

(58) Field of Classification Search

None

See application file for complete search history.

(56) References Cited

U.S. PATENT DOCUMENTS

2019/0333951 A1* 10/2019 Neya .................. H10F 39/8057
2021/0134862 A1* 5/2021 Ishida .................. H10F 30/225
2021/0183917 A1* 6/2021 Otake .................. H10F 39/807
2022/0165902 A1* 5/2022 Okazaki .................. H10F 39/12
2022/0392944 A1* 12/2022 Tochigi .................. H10F 77/147

FOREIGN PATENT DOCUMENTS

WO WO 2019/098035 A1 5/2019

* cited by examiner

*Primary Examiner* — Benjamin P Sandvik

(74) *Attorney, Agent, or Firm* — Finnegan, Henderson, Farabow, Garrett & Dunner, LLP

(57) ABSTRACT

According to one embodiment, a light detector includes a plurality of elements, a plurality of insulating parts, and an intermediate part. The plurality of elements are arranged along a first direction and a second direction. The first direction and the second direction cross each other. Each of the plurality of elements includes a first semiconductor region and a second semiconductor region. The first semiconductor region is of a first conductivity type. The second semiconductor region is located around the first semiconductor region in a first plane. The first plane is along the first and second directions. The second semiconductor region is of a second conductivity type. The plurality of insulating parts are located respectively around the plurality of elements in the first plane. The intermediate part is located around the plurality of insulating parts in the first plane. The intermediate part includes a semiconductor.

26 Claims, 61 Drawing Sheets

LIGHT DETECTOR, LIGHT DETECTION SYSTEM, LIDAR DEVICE, AND MOBILE BODY

CROSS-REFERENCE TO RELATED APPLICATIONS

This application is based upon and claims the benefit of priority from Japanese Patent Application No. 2021-150469, filed on Sep. 15, 2021 and Japanese Patent Application No. 2022-2967, filed on Jan. 12, 2022; the entire contents of which are incorporated herein by reference.

FIELD

Embodiments described herein relate generally to a light detector, a light detection system, a lidar device, and a mobile body.

BACKGROUND

There is a light detector that detects light incident on a semiconductor region. It is desirable to reduce noise of the light detector.

Figure 1:
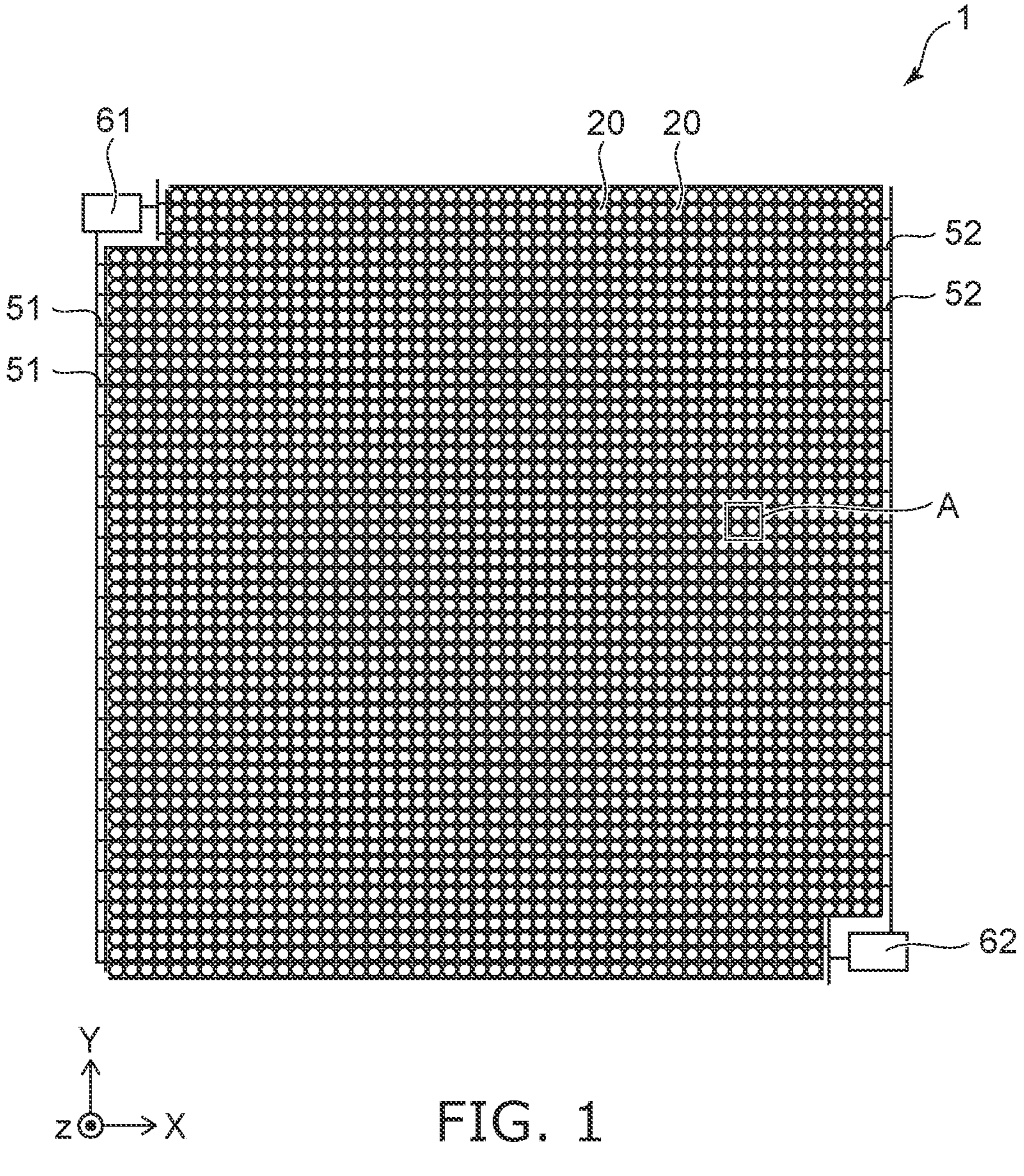
FIG. 1 is a schematic plan view showing a light detector according to a first embodiment.

According to one embodiment, a light detector includes a plurality of elements, a plurality of insulating parts, and an intermediate part. The plurality of elements are arranged along a first direction and a second direction. The first direction and the second direction cross each other. Each of the plurality of elements includes a first semiconductor region and a second semiconductor region. The first semiconductor region is of a first conductivity type. The second semiconductor region is located around the first semiconductor region in a first plane. The first plane is along the first and second directions. The second semiconductor region is of a second conductivity type. The plurality of insulating parts are located respectively around the plurality of elements in the first plane. The intermediate part is located around the plurality of insulating parts in the first plane. The intermediate part includes a semiconductor.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

According to embodiments described below, each embodiment may be implemented by inverting the p-type and the n-type of the semiconductor regions. In such a case, the voltage that is applied to the p-n junctions also is inverted as appropriate.

FIRST EMBODIMENT

Figure 2:
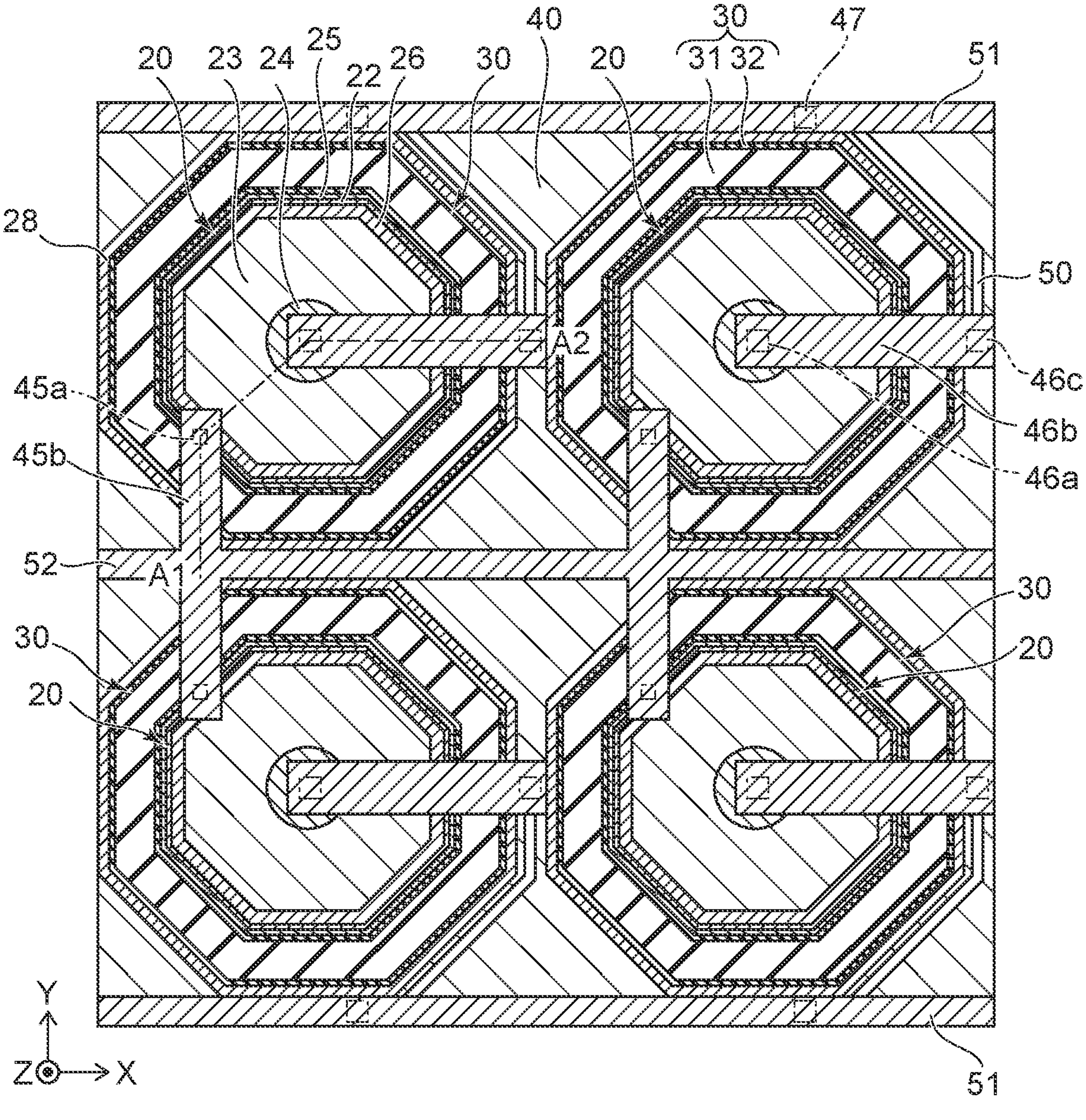
FIG. 2 is an enlarged view of portion A of FIG. 1.
Figure 3:
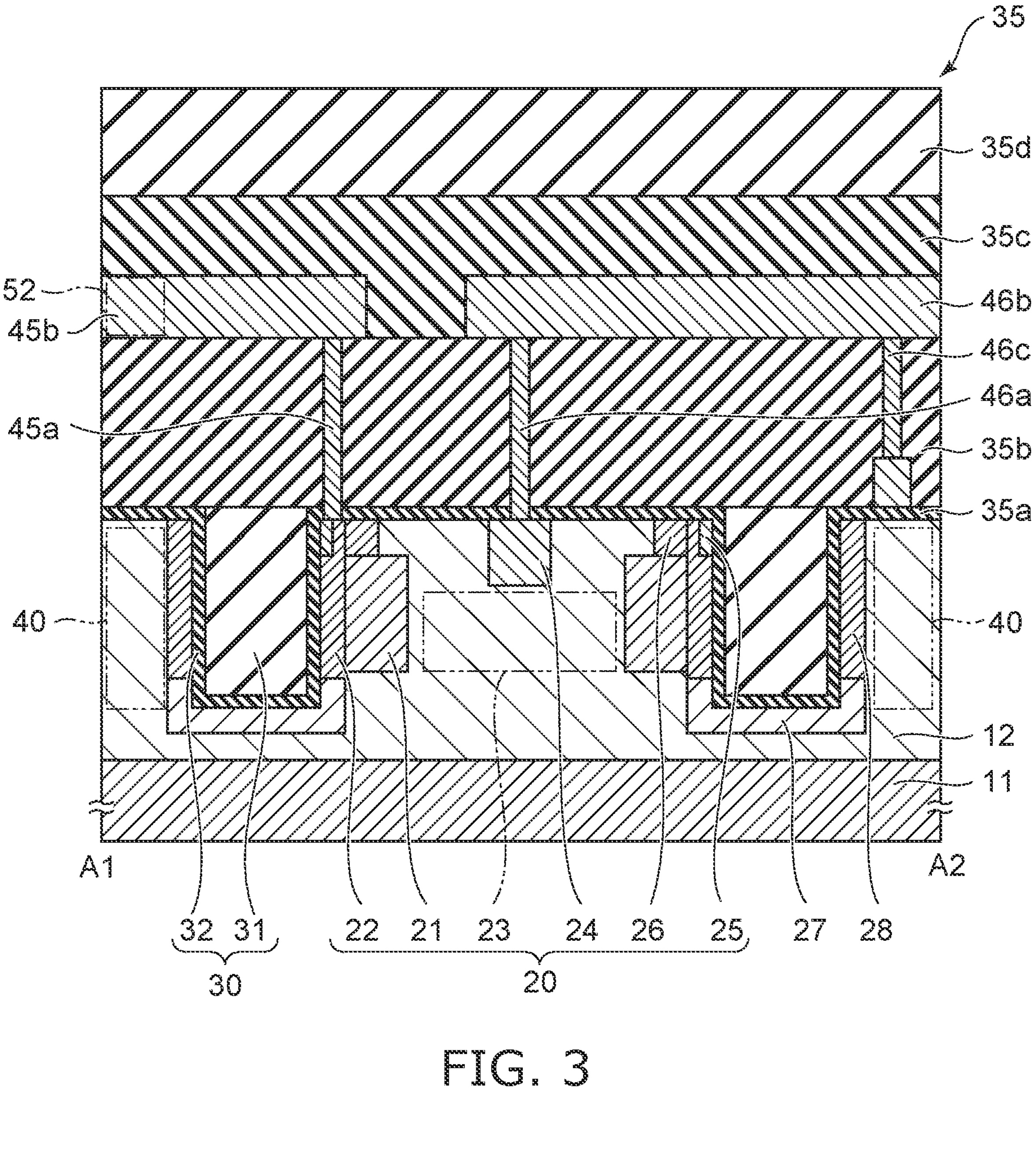
FIG. 3 is an A1-A2 cross-sectional view of FIG. 2.

FIG. 1 is a schematic plan view showing a light detector according to a first embodiment. FIG. 2 is an enlarged view of portion A of FIG. 1. FIG. 3 is an A1-A2 cross-sectional view of FIG. 2.

As shown in FIGS. 1 to 3, the light detector 1 according to the first embodiment includes a p-type semiconductor layer 11 (a first semiconductor layer), a p-type semiconductor layer 12 (a second semiconductor layer), multiple elements 20, multiple insulating parts 30, an insulating layer 35, an intermediate part 40, a quenching part 50, a first interconnect 51, a second interconnect 52, a pad 61 (a first electrode), and a pad 62 (a second electrode). Components other than the element 20, the interconnects, the pad 61, and the pad 62 are not illustrated in FIG. 1. The insulating layer 35 is not illustrated in FIG. 2.

As shown in FIG. 1, the multiple elements 20 are arranged along two directions that cross each other. Here, one arrangement direction is taken as an X-direction (a first direction). Another arrangement direction that crosses the X-direction is taken as a Y-direction (a second direction). In the illustrated example, the X-direction and the Y-direction are mutually-orthogonal.

The pads 61 and 62 are located at the upper surface of the light detector 1 and are separated from each other. The pads 61 and 62 are electrically isolated from each other.

As shown in FIG. 3, the p-type (the first-conductivity-type) semiconductor layer 11 is positioned at the lower part of the light detector 1. The p-type semiconductor layer 12 is located on the p-type semiconductor layer 11. The multiple elements 20, the multiple insulating parts 30, and the intermediate part 40 are located inside the p-type semiconductor layer 12.

Herein, “up” and “down” are used to describe the positional relationships between the components; however, these directions are independent of the direction of gravity. For example, “up” corresponds to the direction from the p-type semiconductor layer 11 toward the p-type semiconductor layer 12; and “down” corresponds to the opposite direction of this direction.

Each element 20 includes a p-type semiconductor region 21 (a first semiconductor region), an n-type (second-conductivity-type) semiconductor region 22 (a second semiconductor region), a p-type semiconductor region 23 (a third semiconductor region), a p-type contact region 24, an n-type contact region 25, and an n-type guard ring region 26 (a fourth semiconductor region).

The n-type semiconductor region 22 is located around the p-type semiconductor region 21 in the X-Y plane. The n-type semiconductor region 22 contacts the p-type semiconductor region 21. A p-n junction is formed between the p-type semiconductor region 21 and the n-type semiconductor region 22. For example, the surface of the p-n junction is parallel to a Z-direction (a third direction) that crosses the X-Y plane. In the illustrated example, the Z-direction is perpendicular to the X-Y plane.

The p-type semiconductor region 23 is surrounded with the p-type semiconductor region 21 in the X-Y plane. The p-type impurity concentration in the p-type semiconductor region 23 is less than the p-type impurity concentration in the p-type semiconductor region 21. The p-type contact region 24 is located on the p-type semiconductor region 23. The p-type impurity concentration in the p-type contact region 24 is greater than the p-type impurity concentration in the p-type semiconductor region 23.

The n-type contact region 25 is located on the n-type semiconductor region 22. The n-type impurity concentration in the n-type contact region 25 is greater than the n-type impurity concentration in the n-type semiconductor region 22. The n-type guard ring region 26 is surrounded with the n-type semiconductor region 22 and the n-type contact region 25 in the X-Y plane. The n-type guard ring region 26 is separated from the p-type contact region 24. The n-type impurity concentration in the n-type guard ring region 26 is less than the n-type impurity concentration in the n-type contact region 25 and less than the n-type impurity concentration in the n-type semiconductor region 22.

As shown in FIG. 2, the multiple insulating parts 30 are located respectively around the multiple elements 20 in the X-Y plane. Similarly to the multiple elements 20, the multiple insulating parts 30 are arranged along the X-direction and the Y-direction.

As shown in FIGS. 2 and 3, the intermediate part 40 is located between the multiple insulating parts 30. Thereby, the insulating parts 30 are separated from each other. The intermediate part 40 surrounds the insulating parts 30 in the X-Y plane. The intermediate part 40 includes a semiconductor. The intermediate part 40 may include an impurity. For example, the intermediate part 40 is a p-type semiconductor region. The intermediate part 40 may be an n-type semiconductor region.

Each insulating part 30 includes, for example, insulating layers 31 and 32. The insulating layer 32 is located between the insulating layer 31 and the p-type semiconductor layer 12, between the insulating layer 31 and the element 20, and between the insulating layer 31 and the intermediate part 40.

As shown in FIG. 3, a guard ring region 27 (a fifth semiconductor region) is located around the bottom portion of the insulating part 30. For example, a portion of the guard ring region 27 is arranged with the n-type semiconductor region 22 in the Z-direction. Another portion of the guard ring region 27 is arranged with the insulating part 30 in the Z-direction. For example, the guard ring region 27 is of the n-type. The n-type impurity concentration in the guard ring region 27 is less than the n-type impurity concentration in the n-type semiconductor region 22. The guard ring region 27 may be of the p-type.

An n-type semiconductor region 28 (a sixth semiconductor region) is located between the insulating part 30 and the intermediate part 40. The n-type semiconductor region 28 is arranged with a portion of the guard ring region 27 in the Z-direction. The n-type impurity concentration in the n-type semiconductor region 28 is greater than the n-type impurity concentration in the guard ring region 27.

The lengths in the Z-direction of the p-type semiconductor region 21, the n-type semiconductor region 22, and the p-type semiconductor region 23 are less than the length in the Z-direction of the insulating part 30 and greater than the lengths in the Z-direction of the p-type contact region 24, the n-type contact region 25, and the n-type guard ring region 26. The p-type contact region 24 is positioned at the center of the element 20 when viewed along the Z-direction. The n-type semiconductor region 22, the n-type contact region 25, and the n-type guard ring region 26 are positioned at the outer perimeter of the element 20.

As shown in FIGS. 2 and 3, the p-type semiconductor region 21 is electrically connected with the quenching part 50 via the p-type semiconductor region 23, the p-type contact region 24, a plug **46*a*, and an interconnect 46*b*. As shown in FIG. 2, the quenching part 50 is electrically connected with the first interconnect 51 via a plug 47. The quenching part 50 is electrically connected between the p-type semiconductor region 21 and the first interconnect 51. The n-type semiconductor region 22 is electrically connected with the second interconnect 52 via the n-type contact region 25, a plug 45*a*, and an interconnect 45*b*. In the illustrated example, the interconnect 45*b* and the second interconnect 52 are formed as a continuous body. The interconnect 45*b* and the second interconnect 52** may be included as separate bodies in mutually-different layers.

The second interconnect 52 is electrically isolated from the first interconnect 51. In the illustrated example, the first interconnect 51 and the second interconnect 52 extend in the X-direction. The first interconnect 51 and the second interconnect 52 are alternately arranged in the Y-direction. One first interconnect 51 is electrically connected with multiple p-type semiconductor regions 21 via multiple quenching parts 50. The multiple first interconnects 51 are electrically connected with the pad 61. One second interconnect 52 is electrically connected with multiple n-type semiconductor regions 22. The multiple second interconnects 52 are electrically connected with the pad 62.

The insulating layer 35 is light-transmissive and is located on the multiple elements 20, the multiple insulating parts 30, and the intermediate part 40. The plug 45*a*, the interconnect 45*b*, the plug 46*a*, the interconnect 46*b*, a plug 46*c*, the plug 47, the quenching part 50, the first interconnect 51, the second interconnect 52, etc., are located inside the insulating layer 35. The insulating layer 35 may include multiple insulating films 35*a* to 35*d*. The insulating film 35*b* is located on the insulating film 35*a*. The insulating film 35*c* is located on the insulating film 35*b*. The insulating film 35*d* is located on the insulating film 35*c*.

Operations of the light detector 1 will now be described.

A reverse voltage is applied between the p-type semiconductor region 21 and the n-type semiconductor region 22. In other words, a positive operating voltage with respect to the pad 61 is applied to the pad 62. The element 20 includes a P-I-N diode or an avalanche photodiode. The operating voltage is, for example, +60 V to +70 V.

When light is incident on the element 20 from above, carriers are generated in the element 20, the p-type semiconductor layer 12, the upper portion of the p-type semiconductor layer 11, etc. The carriers move along the electric field of a depletion layer that spreads from the p-n junction between the p-type semiconductor region 21 and the n-type semiconductor region 22. A current that is due to the carriers passes through the p-type semiconductor region 21 and the first interconnect 51 and flows toward the pad 61. The incidence of the light on the element 20 can be detected based on the current flowing through the pad 61.

A reverse voltage that is greater than the breakdown voltage may be applied between the p-type semiconductor region 21 and the n-type semiconductor region 22. In other words, the element 20 may include an avalanche photodiode that operates in a Geiger mode. By operating in the Geiger mode, a pulse signal that has a high multiplication factor (i.e., a high gain) is output. The light-receiving sensitivity of the light detector 1 can be increased thereby.

The quenching part 50 is included to suppress the continuation of avalanche breakdown when light is incident on the element 20 and avalanche breakdown occurs. The electrical resistance of the quenching part 50 is greater than the electrical resistances of the plugs and the interconnects. It is favorable for the electrical resistance of the quenching part 50 to be not less than 50 kΩ and not more than 6 MΩ. A voltage drop that corresponds to the electrical resistance of the quenching part 50 occurs when avalanche breakdown occurs and a current flows in the quenching part 50. The voltage drop reduces the potential difference between the p-type semiconductor region 21 and the n-type semiconductor region 22 and stops the avalanche breakdown. Thereby, the element 20 has a fast response with a short time constant; and the next light that is incident on the element 20 can be detected again.

An example of materials of the components will now be described.

The p-type semiconductor layer 11, the p-type semiconductor layer 12, the p-type semiconductor region 21, the n-type semiconductor region 22, the p-type semiconductor region 23, the p-type contact region 24, the n-type contact region 25, the n-type guard ring region 26, the guard ring region 27, the n-type semiconductor region 28, and the intermediate part 40 include at least one semiconductor material selected from the group consisting of silicon, silicon carbide, gallium arsenide, and gallium nitride. For example, phosphorus, arsenic, or antimony is used as the n-type impurity when these semiconductor regions include silicon. Boron or boron fluoride is used as the p-type impurity.

The insulating part 30 and the insulating layer 35 include insulating materials. For example, the insulating materials include silicon and one or two selected from oxygen or nitrogen, and are silicon oxide, silicon nitride, or silicon oxynitride. As an example, the insulating layer 31, the insulating layer 32, the insulating film 35*a*, and the insulating film 35*b* include silicon oxide. The insulating films 35*c* and 35*d* include silicon nitride. The quenching part 50 includes polysilicon. An n-type impurity or a p-type impurity may be added to the quenching part 50. The plugs, the interconnects, the pad 61, and the pad 62 include metal materials such as tungsten, titanium, copper, aluminum, etc.

FIGS. 4A to 18 are schematic views showing manufacturing processes of the light detector according to the first embodiment. FIGS. 4B to 17B are respectively B1-B2 cross-sectional views of FIGS. 4A to 17A. FIGS. 4A to 17A are respectively A1-A2 cross-sectional views of FIGS. 4B to 17B.

An example of a favorable method for manufacturing the light detector 1 according to the first embodiment will now be described with reference to FIGS. 4A to 18.

Figure 4A:
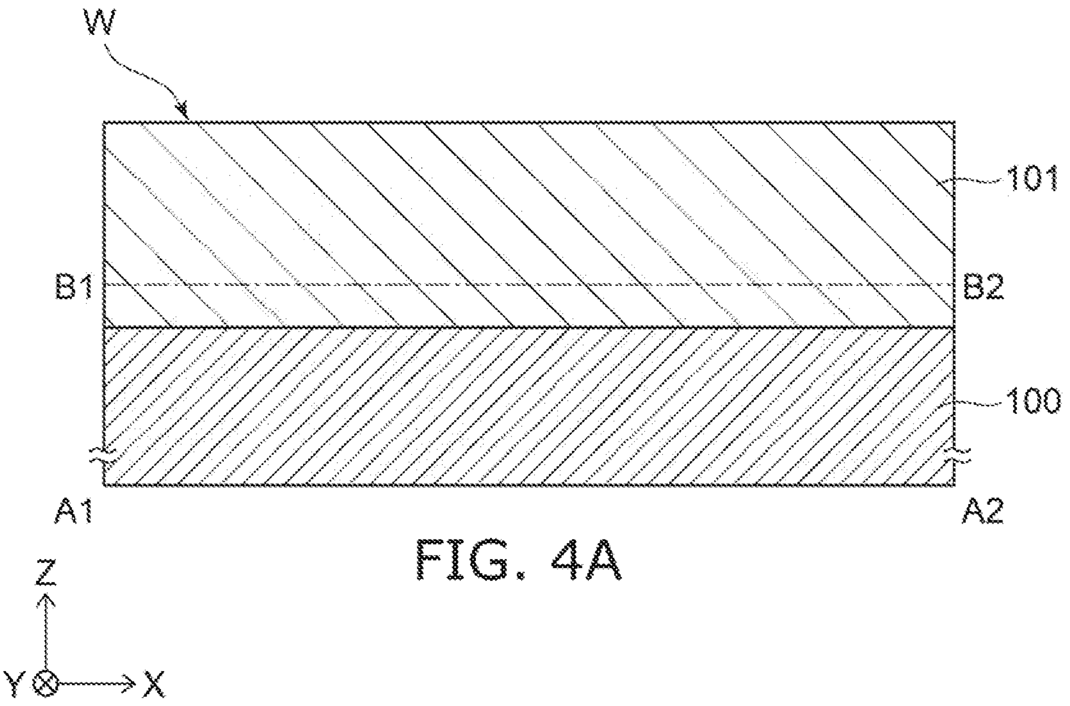
FIGS. 4A, 4B, 5A, 5B, 6A, 6B, 7A, 7B, 8A, 8B, 9A, 9B, 10A, 10B, 11A, 11B, 12A, 12B, 13A, 13B, 14A, 14B, 15A, 15B, 16A, 16B, 17A, 17B, and 18 are schematic views showing manufacturing processes of the light detector according to the first embodiment.
Figure 4B:
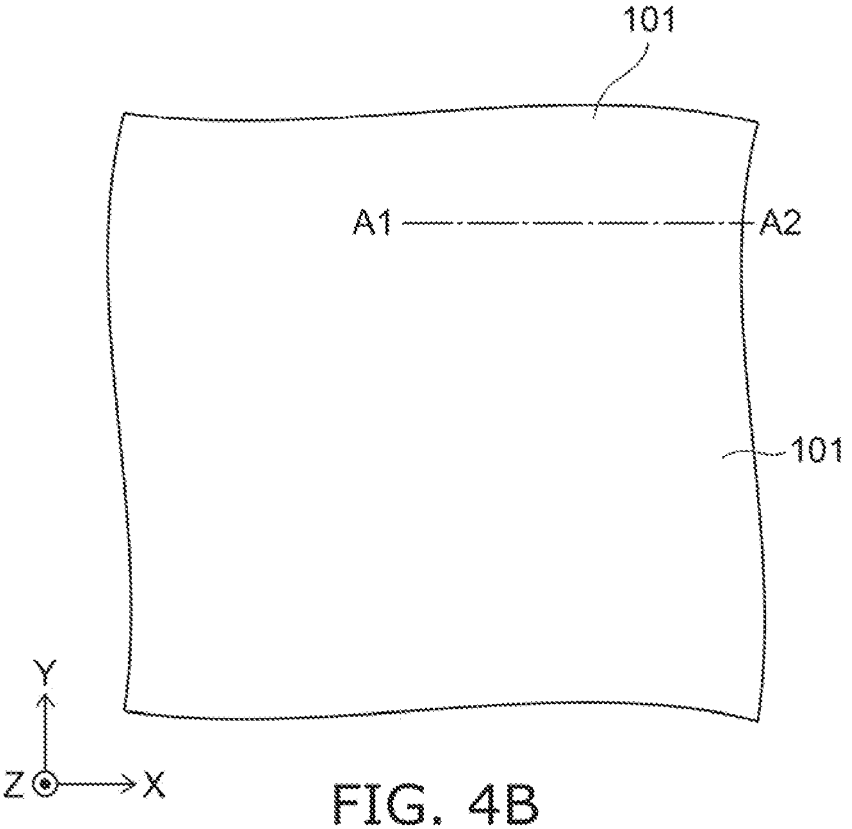

First, a wafer W is prepared as shown in FIGS. 4A and 4B. The wafer W includes a single-crystal p-type silicon substrate 100, and a p-type silicon epitaxial layer 101 located on the p-type silicon substrate 100. The p-type silicon substrate 100 is doped with boron with a concentration of $4.0\times10^{18}/cm^3$. The p-type silicon epitaxial layer 101 is doped with boron with a concentration of $1.0\times10^{15}/cm^3$. The thickness (the length in the Z-direction) of the p-type silicon epitaxial layer 101 is 7 μm.

Figure 5A:
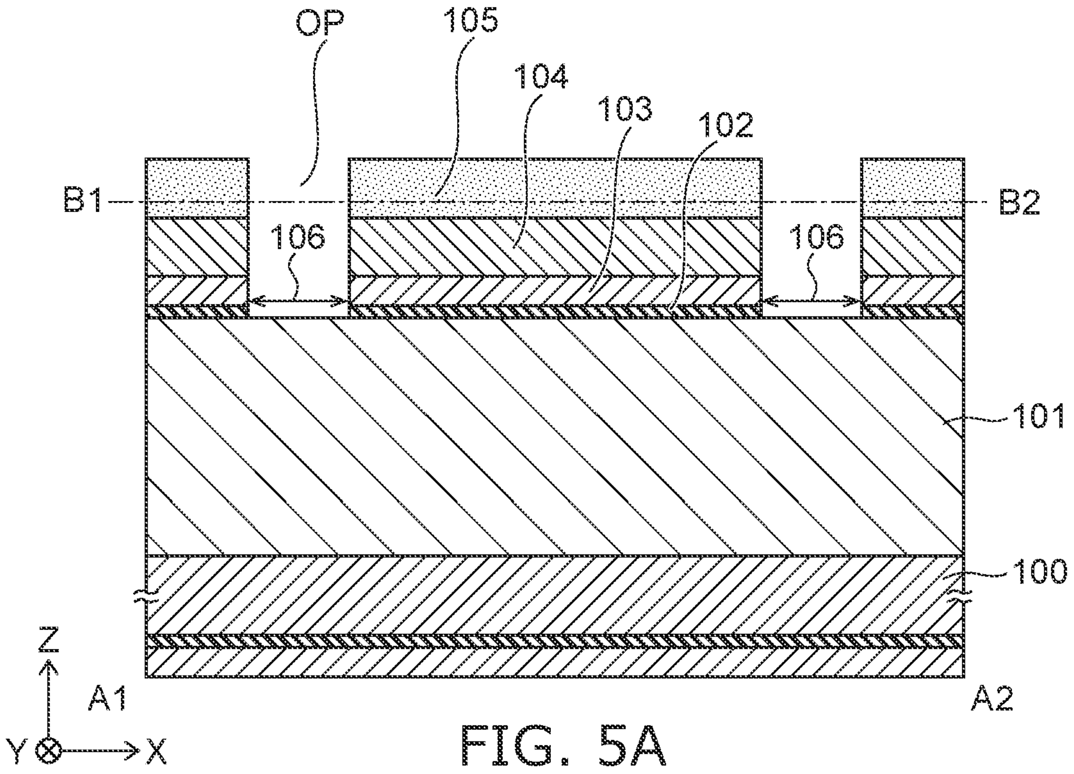
Figure 5B:
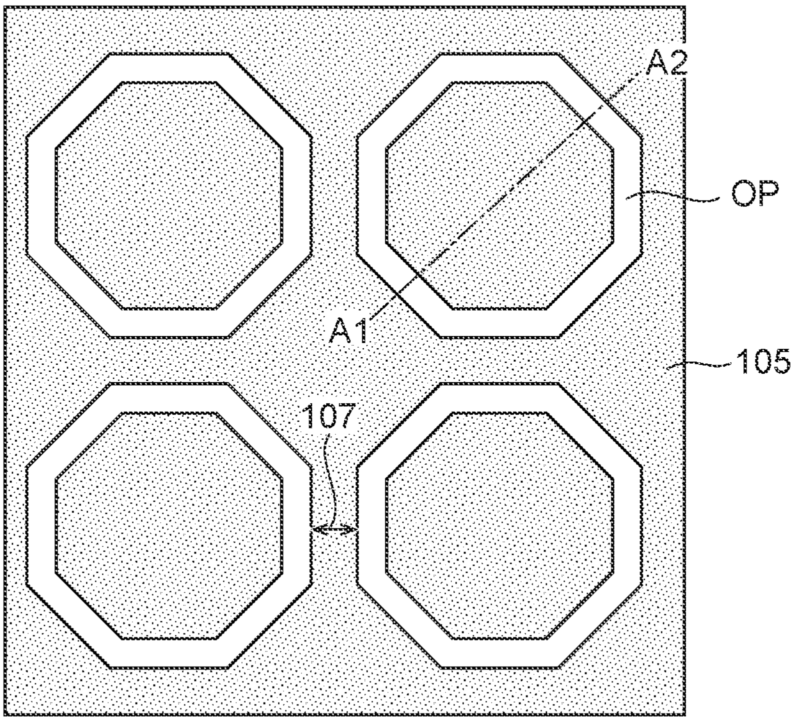

As shown in FIGS. 5A and 5B, a silicon thermal oxide film 102 is formed to have a thickness of 100 nm by oxidizing the surface of the p-type silicon epitaxial layer 101. 300 nm of a silicon nitride film 103 is deposited on the silicon thermal oxide film 102 by low pressure thermal chemical vapor deposition (CVD). 1000 nm of a silicon oxide film 104 is deposited on the silicon nitride film 103 by low pressure thermal CVD. A resist 105 is formed on the silicon oxide film 104. An opening OP is formed in the resist 105 by a lithography process. The position of the opening OP corresponds to the position at which an element separation region 106 is subsequently formed. The silicon oxide film 104, the silicon nitride film 103, and the silicon thermal oxide film 102 are etched by reactive ion etching (RIE) by using the resist 105 as a mask. As an example, the width of the opening OP is designed to be 0.5 μm. An inter-separation region 107 is located between the element separation regions 106 that are next to each other. The width of the inter-separation region 107 is designed to be 2 μm. It is favorable for the sum of the width of the inter-separation region 107 and 2 times the width of the element separation region 106 to be not less than 3 μm. Thereby, secondary photons of the visible region that travel in the lateral direction between cells that are next to each other are sufficiently absorbed by the silicon of the inter-separation region 107.

Figure 6A:
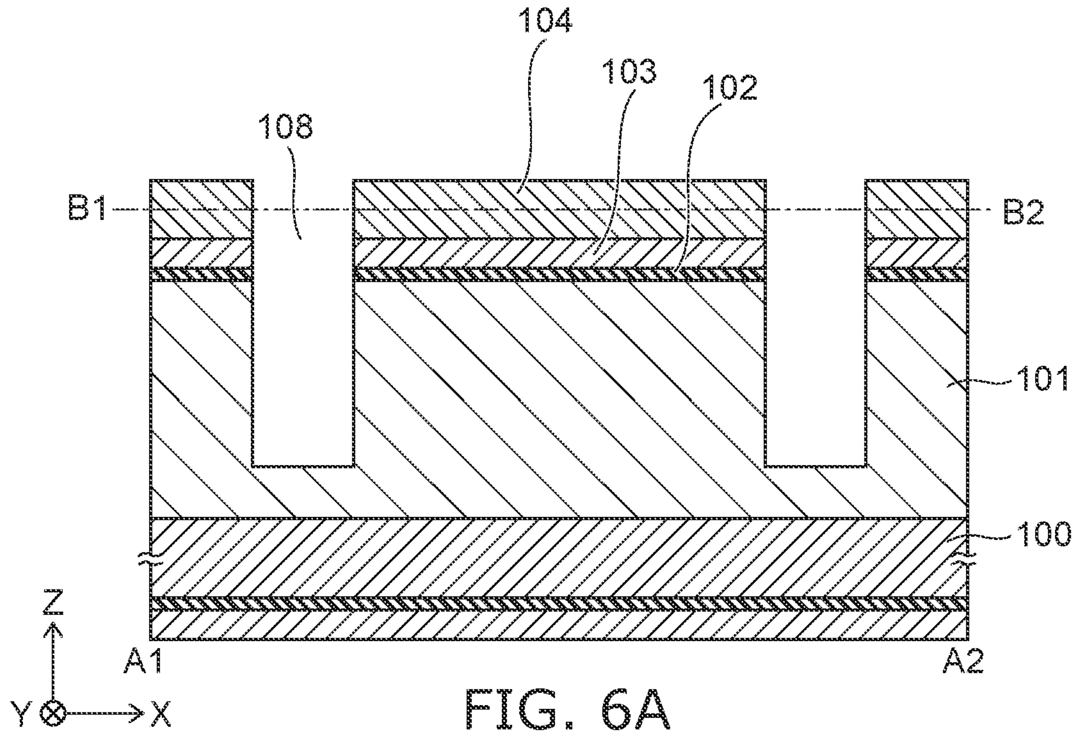
Figure 6B:
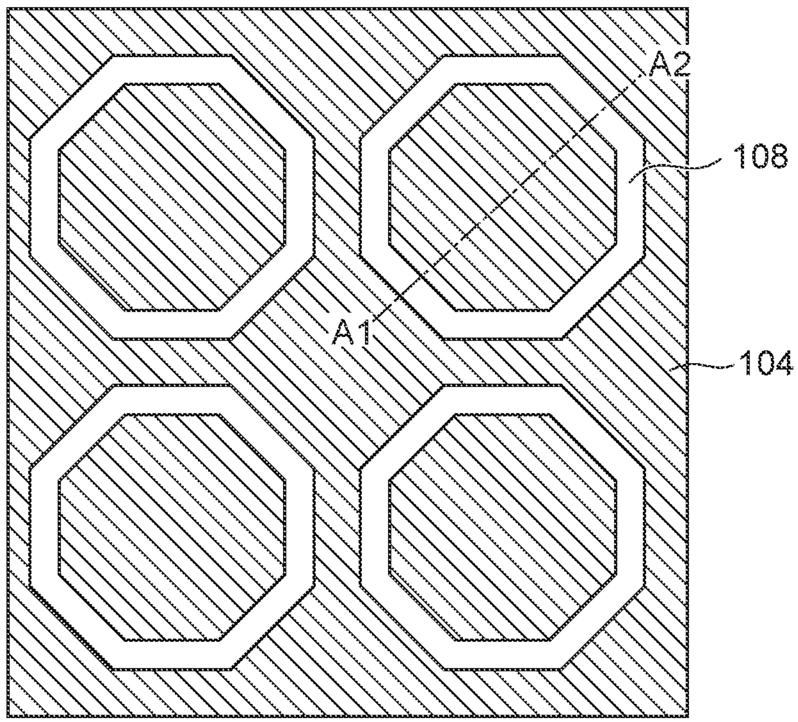

The resist 105 is stripped away as shown in FIGS. 6A and 6B. The p-type silicon epitaxial layer 101 that is exposed via the opening OP is etched using the silicon oxide film 104 as a mask. Thereby, a trench structure 108 is formed in the element separation region 106. The depth of the trench structure 108 is determined by the thickness of the p-type silicon epitaxial layer 101 and the diffusion amount of the boron from the p-type silicon substrate 100 into the p-type silicon epitaxial layer 101 due to the heating processes among all of the processes. As an example, the depth of the trench structure 108 is designed to be 5 μm.

Figure 7A:
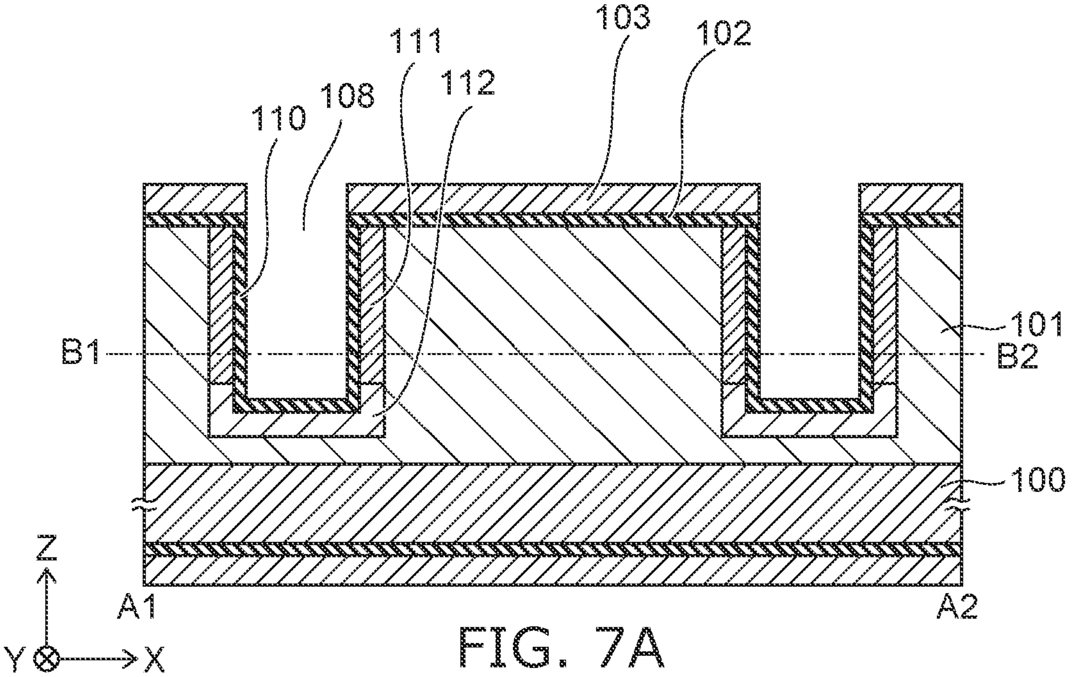
Figure 7B:
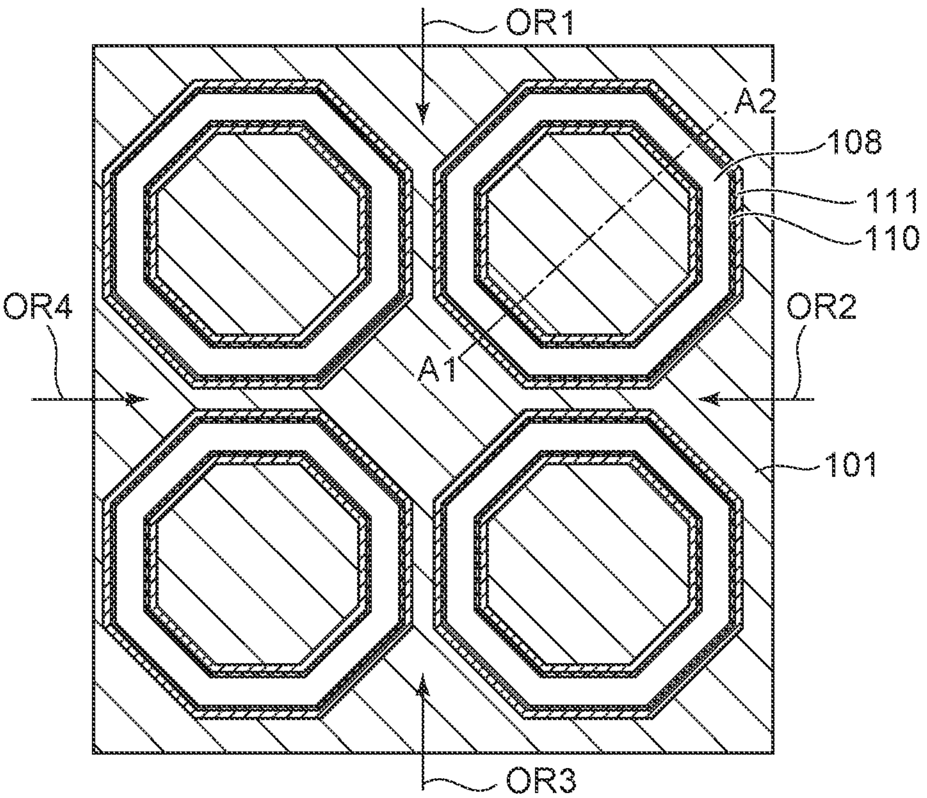

As shown in FIGS. 7A and 7B, a silicon oxide film 110 is formed to have a thickness of 50 nm by oxidizing the surface of the trench structure 108. An n-type avalanche layer 111 is formed in the side surface and the bottom surface of the trench structure 108 by ion implantation. The ions are sequentially implanted along four orientations OR1 to OR4 that are tilted 3 degrees with respect to the Z-direction. The implantation angle of the ion implantation is modifiable according to the design of the width and the depth of the trench structure 108 and the p-n junction depth that is subsequently formed. As an example, the n-type avalanche layer 111 is formed by ion-implanting phosphorus with the conditions of an implantation acceleration voltage of 50 keV and an implantation dose of $5.0\times10^{14}/cm^2$ for each orientation. Counter ion implantation of boron into the bottom portion of the trench structure 108 is performed to increase the breakdown voltage at the corners of the trench structure 108 bottom portion. Thereby, an n-type guard ring layer 112 is formed to have a lower impurity concentration than the n-type avalanche layer 111 in the bottom portion of the trench structure 108. As an example, the n-type guard ring layer 112 is formed by ion-implanting boron with the conditions of an implantation acceleration voltage of 25 keV and an implantation dose of $2.5\times0^{14}/cm^2$.

Figure 8A:
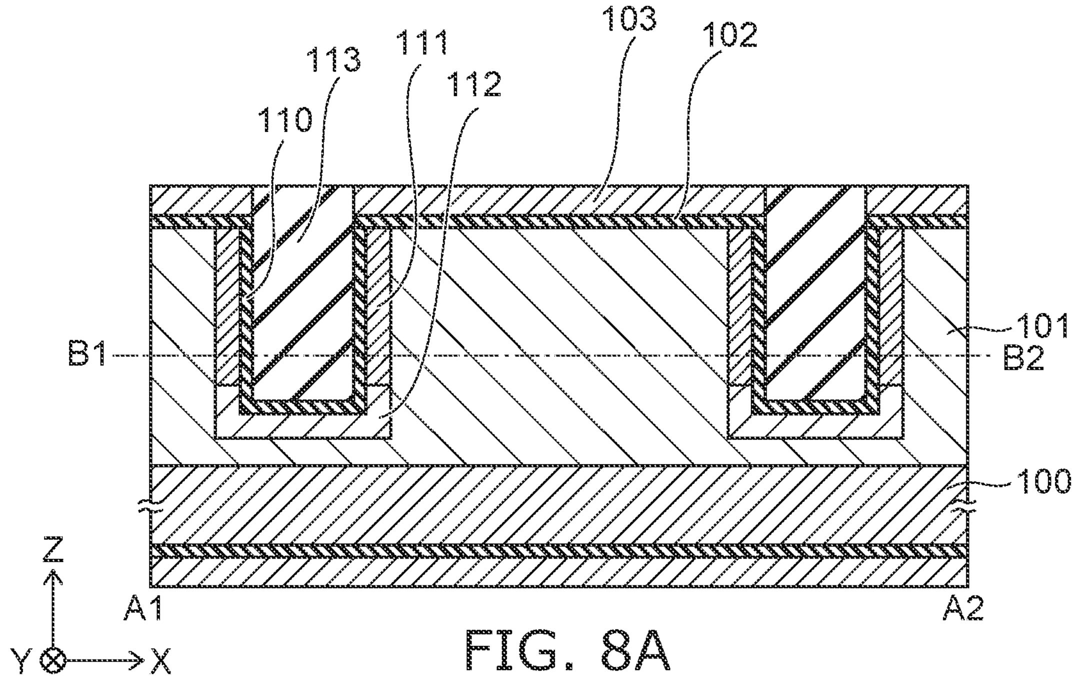
Figure 8B:
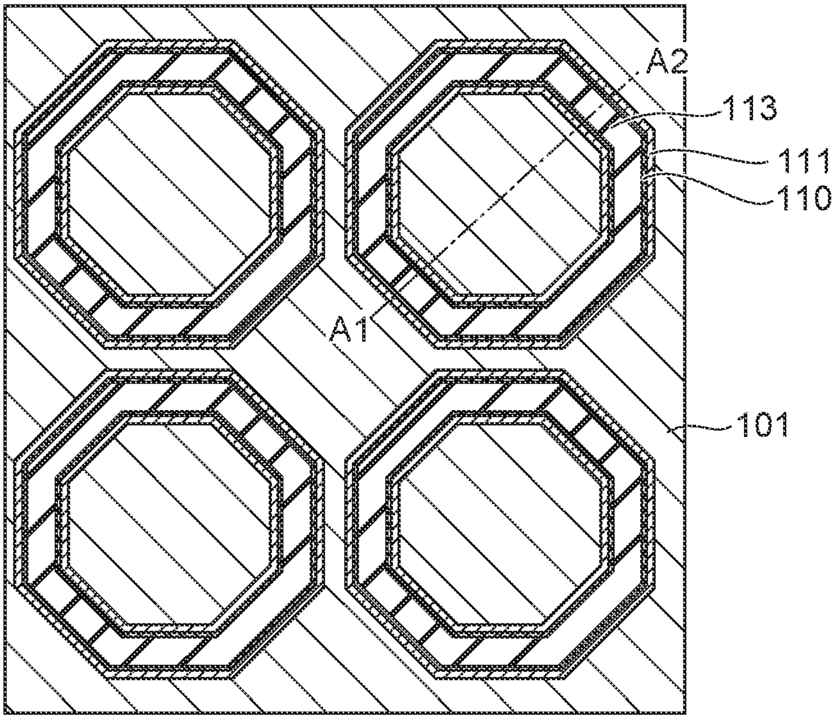

As shown in FIGS. 8A and 8B, 1.2 μm of an oxide film is deposited inside the trench structure 108 by plasma CVD. A buried oxide film 113 is formed by densifying the oxide film by nitrogen annealing at 1000° C. Simultaneously, solid-state diffusion from the buried oxide film 113 toward the n-type avalanche layer 111 and activation of the n-type guard ring layer 112 are performed. The buried oxide film 113 is planarized by CMP using the silicon nitride film 103 as a stopper.

Figure 9A:
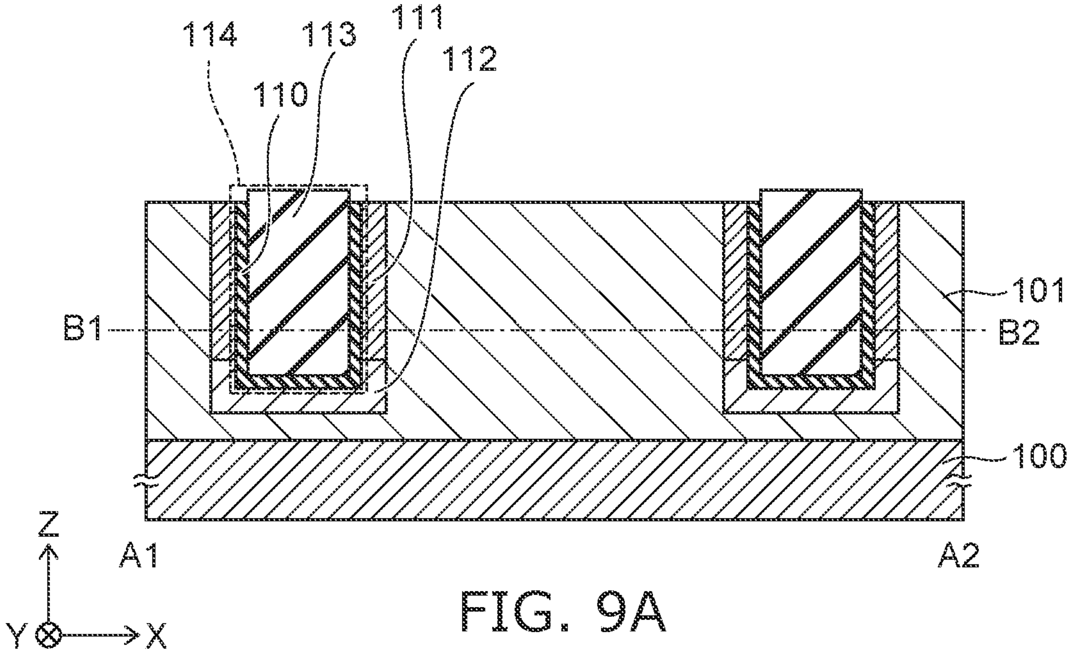
Figure 9B:
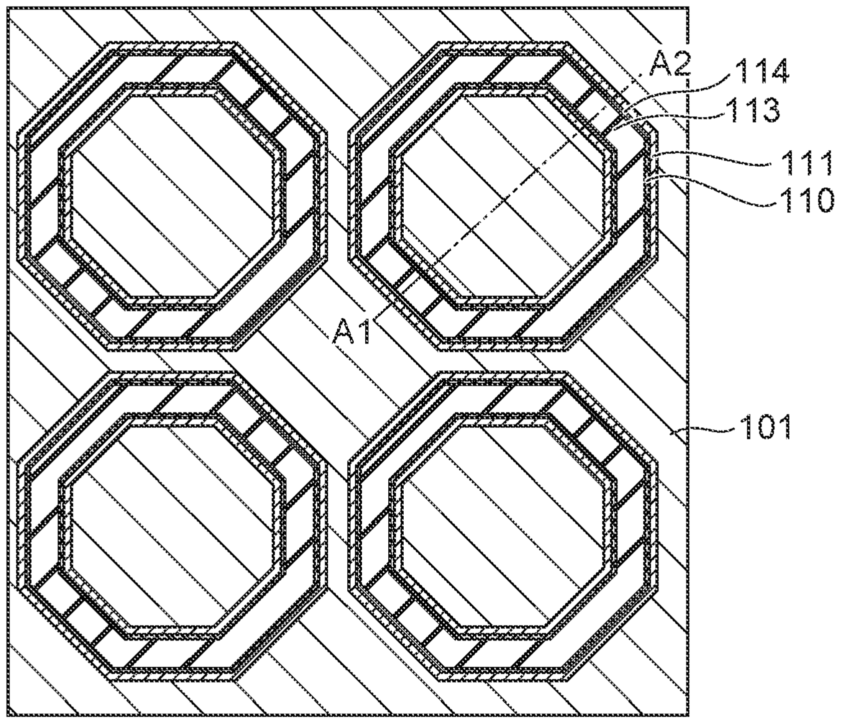

As shown in FIGS. 9A and 9B, the oxide layer that is on the silicon nitride film 103 is removed by hydrofluoric acid treatment. The silicon nitride film 103 is stripped away by hot phosphoric acid treatment. The silicon thermal oxide film 102 is stripped away by hydrofluoric acid treatment. Thereby, an element separation structure 114 that includes the silicon oxide film 110 and the buried oxide film 113 is formed in the element separation region 106.

Figure 10A:
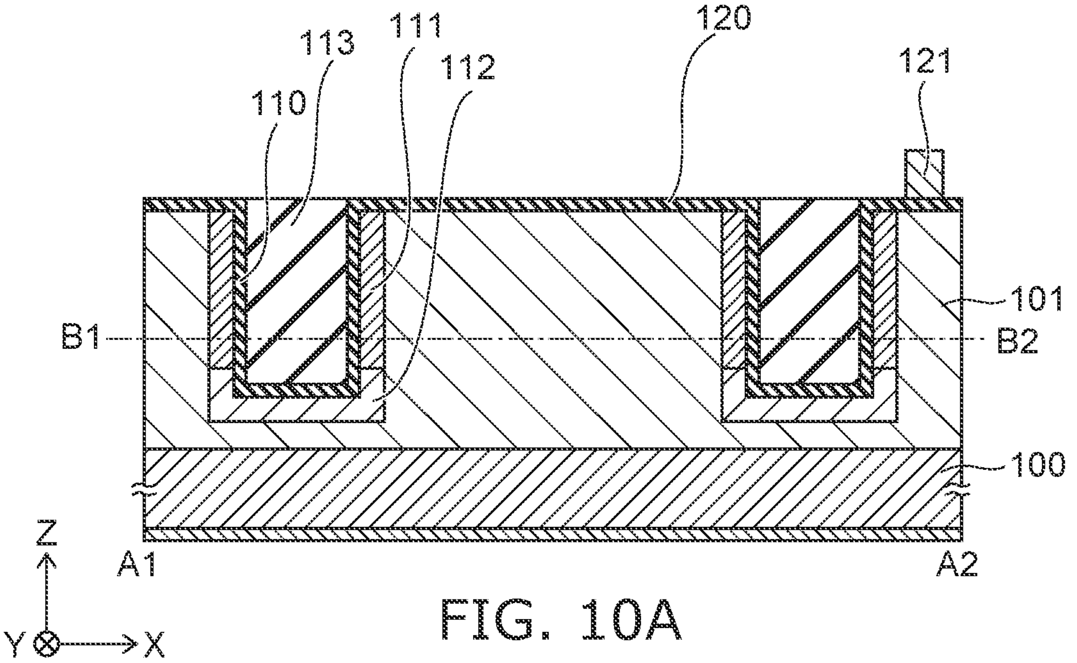
Figure 10B:
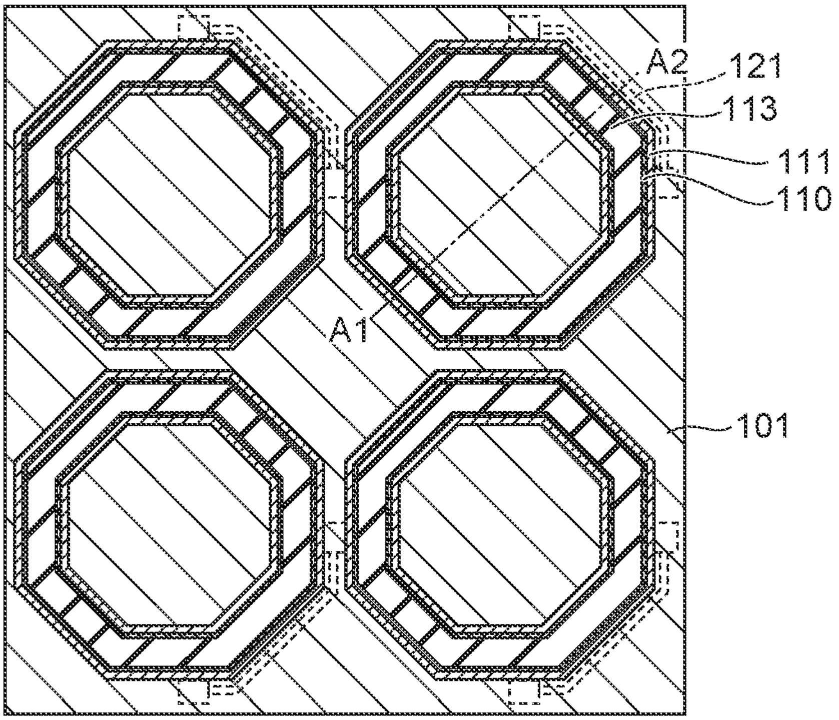

As shown in FIGS. 10A and 10B, a silicon oxide film 120 is formed to have a thickness of 50 nm by oxidizing the surface of the p-type silicon epitaxial layer 101. A polysilicon film is formed to have a thickness of 0.2 μm on the silicon oxide film 120 by low pressure thermal CVD. A quenching resistance 121 is formed by patterning the polysilicon film into a prescribed shape by a lithography process and an RIE process. For example, to provide the quenching resistance 121 with the prescribed resistance, ion implantation of boron with the conditions of an implantation acceleration voltage of 20 keV and an implantation dose of $1.0\times10^{15}/cm^2$ is performed, and activation anneal is performed.

Figure 11A:
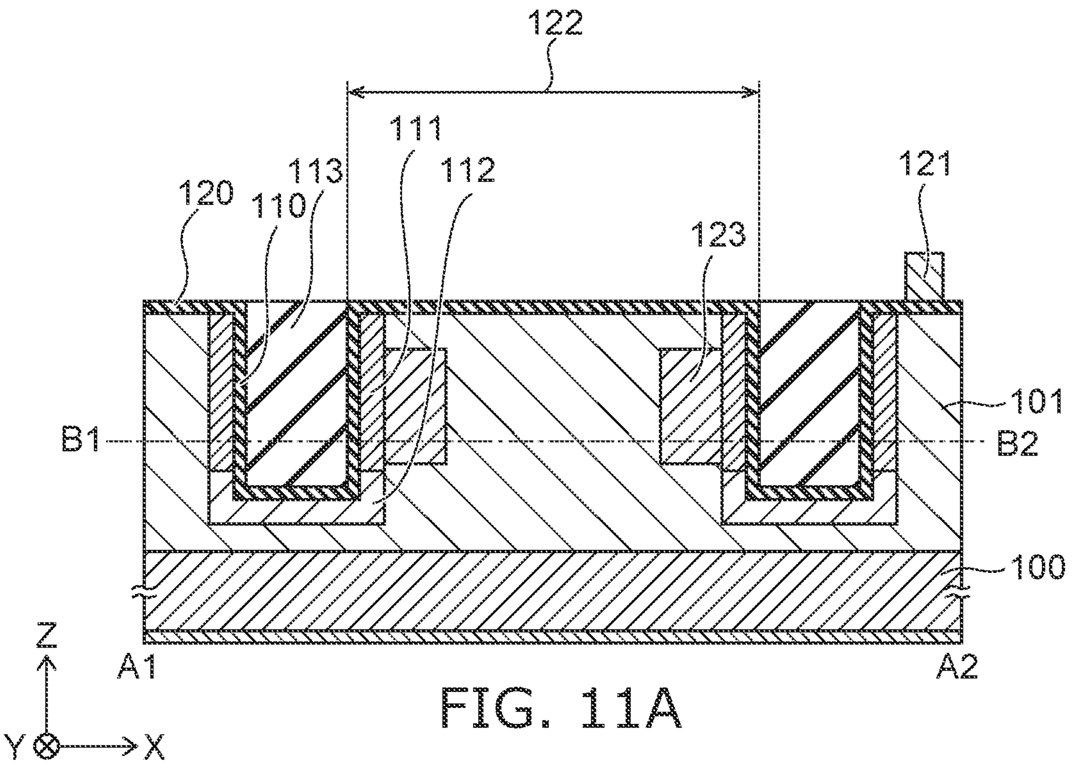
Figure 11B:
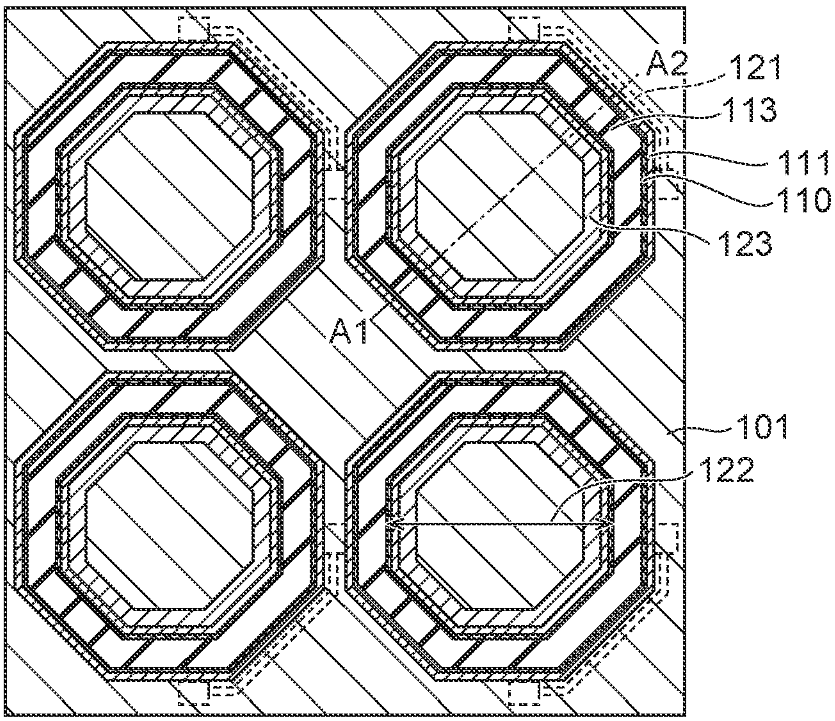

As shown in FIGS. 11A and 11B, a p-type avalanche layer 123 is formed by a lithography process and ion implantation in an element region 122 that is surrounded with the element separation structure 114. The p-type avalanche layer 123 is formed along the n-type avalanche layer 111 and the element separation structure 114. As an example, the p-type avalanche layer 123 is formed by ion-implanting boron with the conditions of an implantation acceleration voltage of 1 MeV and an implantation dose of $3.0\times10^{12}/cm^2$.

Figure 12A:
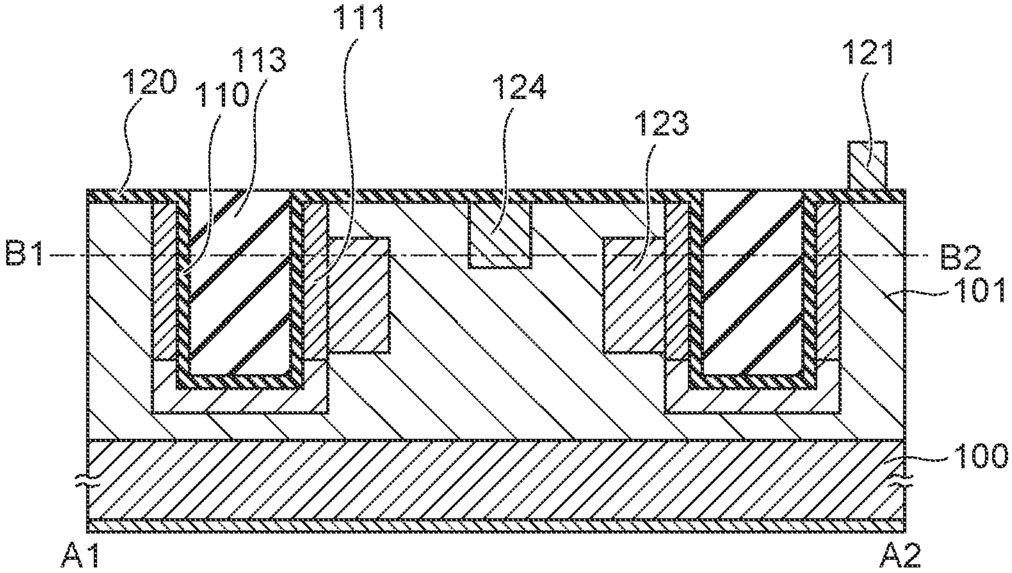
Figure 12B:
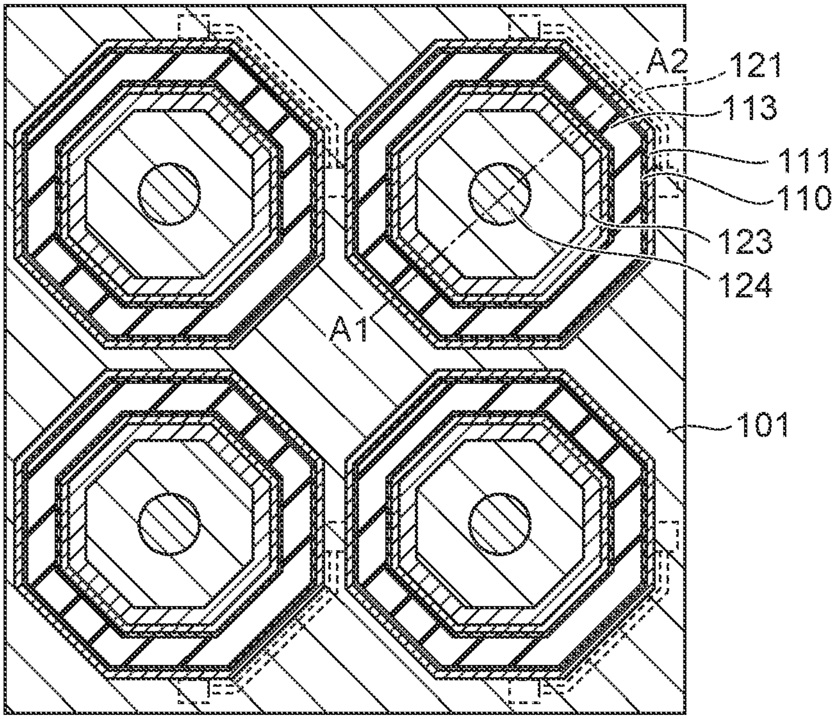

As shown in FIGS. 12A and 12B, a p-type anode electrode 124 is formed in the element region 122 surface by a lithography process and multiple ion implantations. As an example, the p-type anode electrode 124 is formed by ion-implanting boron with the conditions of an implantation acceleration voltage of 50 keV and an implantation dose of $5.0\times10^{14}/cm^2$.

Figure 13A:
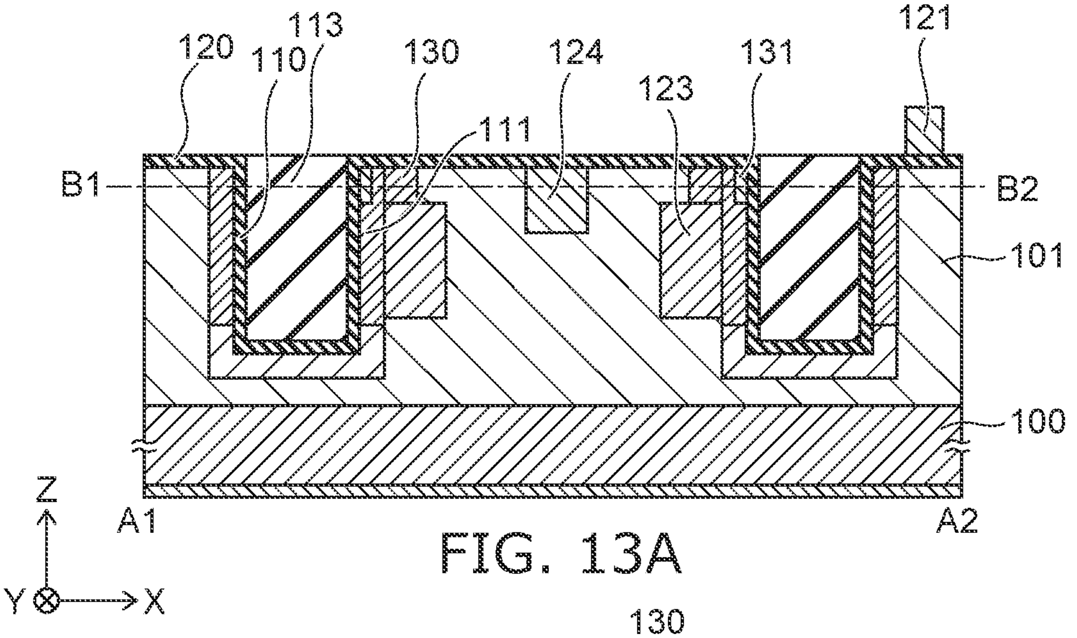
Figure 13B:
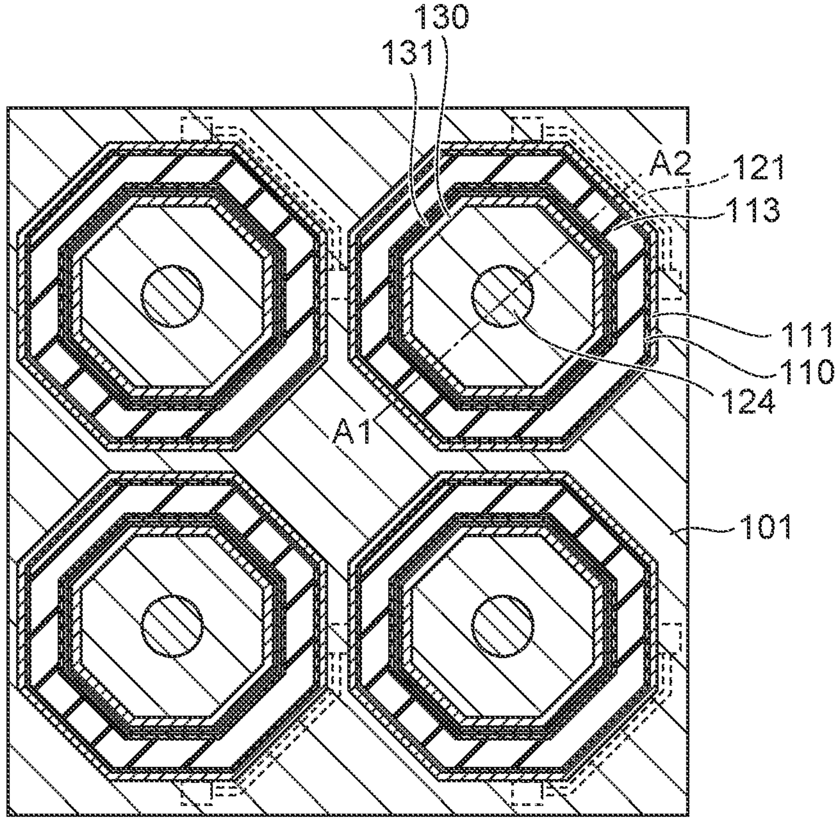

As shown in FIGS. 13A and 13B, an n-type guard ring layer 130 and a n-type cathode electrode 131 are formed in the outer perimeter surface of the element region 122 by a lithography process and ion implantation. As an example, the n-type guard ring layer 130 is formed by ion-implanting phosphorus with the conditions of an implantation acceleration voltage of 200 keV and an implantation dose of $3.0\times10^{12}/cm^2$. The n-type cathode electrode 131 is formed by ion-implanting phosphorus with the conditions of an implantation acceleration voltage of 50 keV and an implantation dose of $5.0\times10^{14}/cm^2$. Nitrogen annealing is performed to activate the implantation layers of the impurities.

Figure 14A:
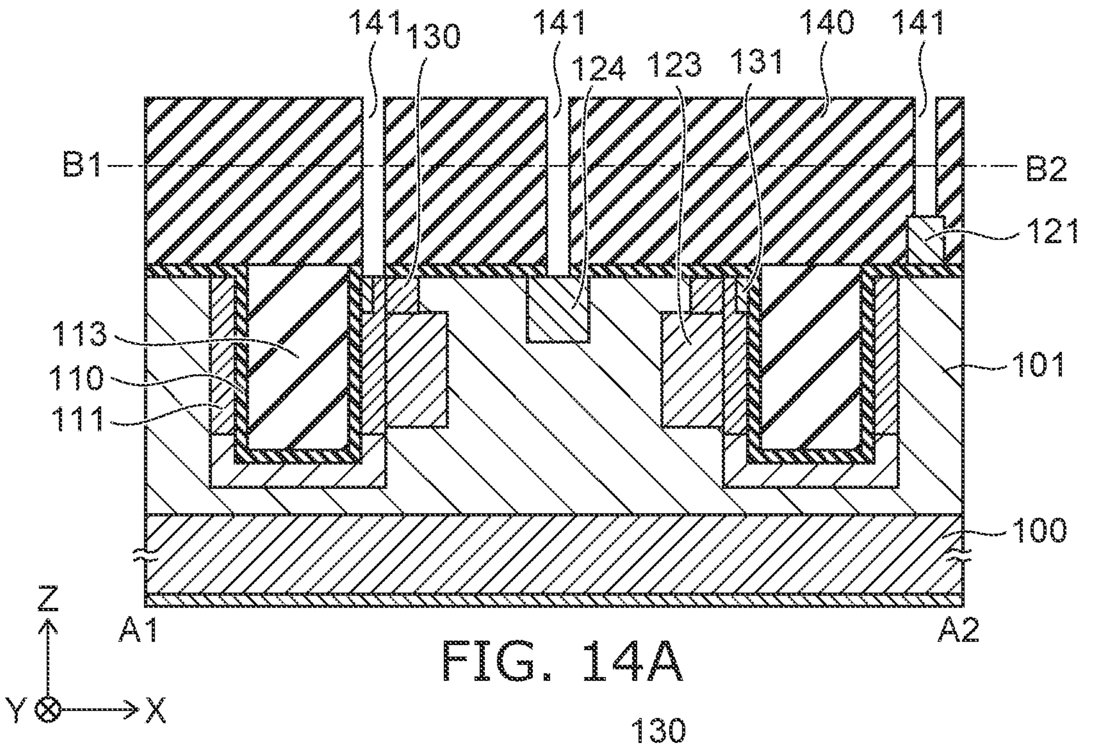
Figure 14B:
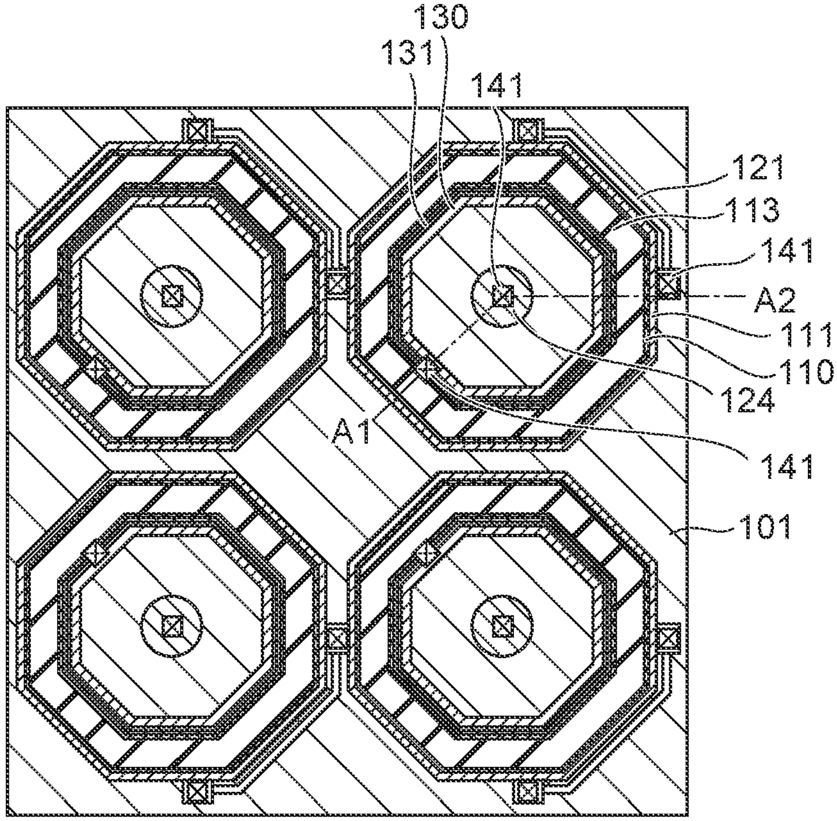

As shown in FIGS. 14A and 14B, a first inter-layer insulating film 140 is formed to have a thickness of 0.5 μm on the silicon oxide film 120 by CVD. The first inter-layer insulating film 140 is planarized by chemical mechanical polishing (CMP). Contact holes 141 that are positioned respectively on the quenching resistance 121, the p-type anode electrode 124, and the n-type cathode electrode 131 are formed in the first inter-layer insulating film 140 by a lithography process and an RIE process.

Figure 15A:
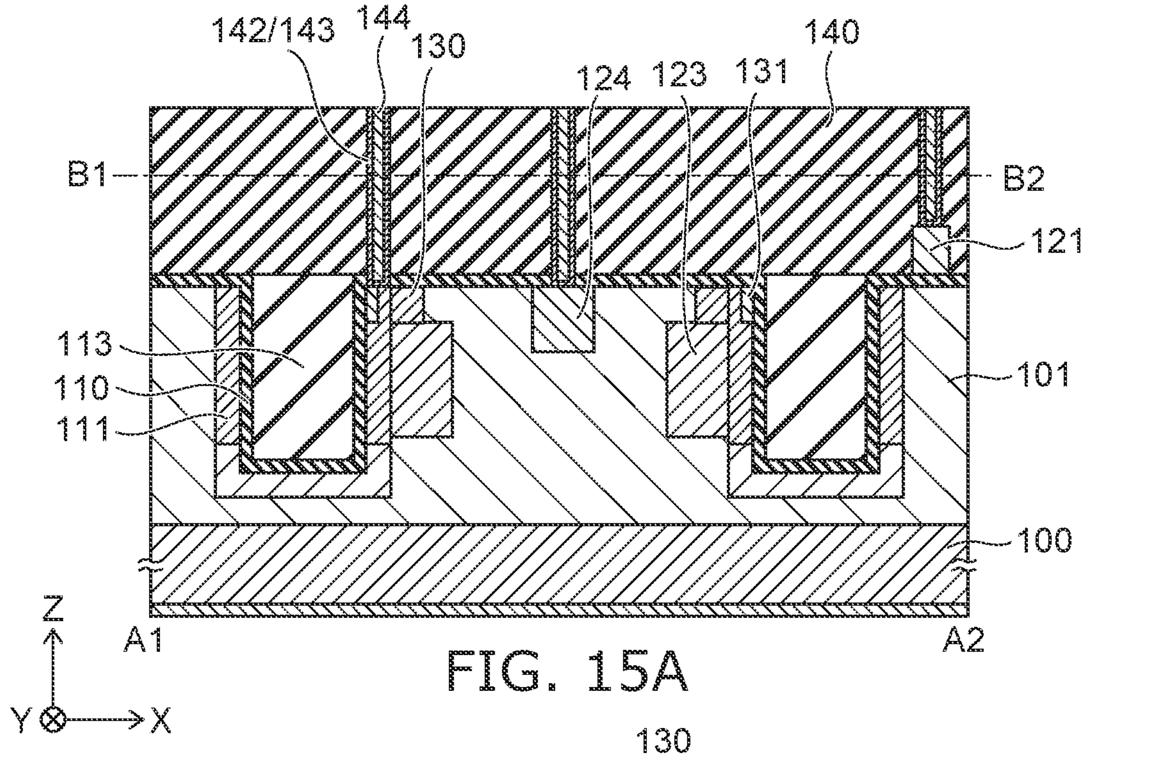
Figure 15B:
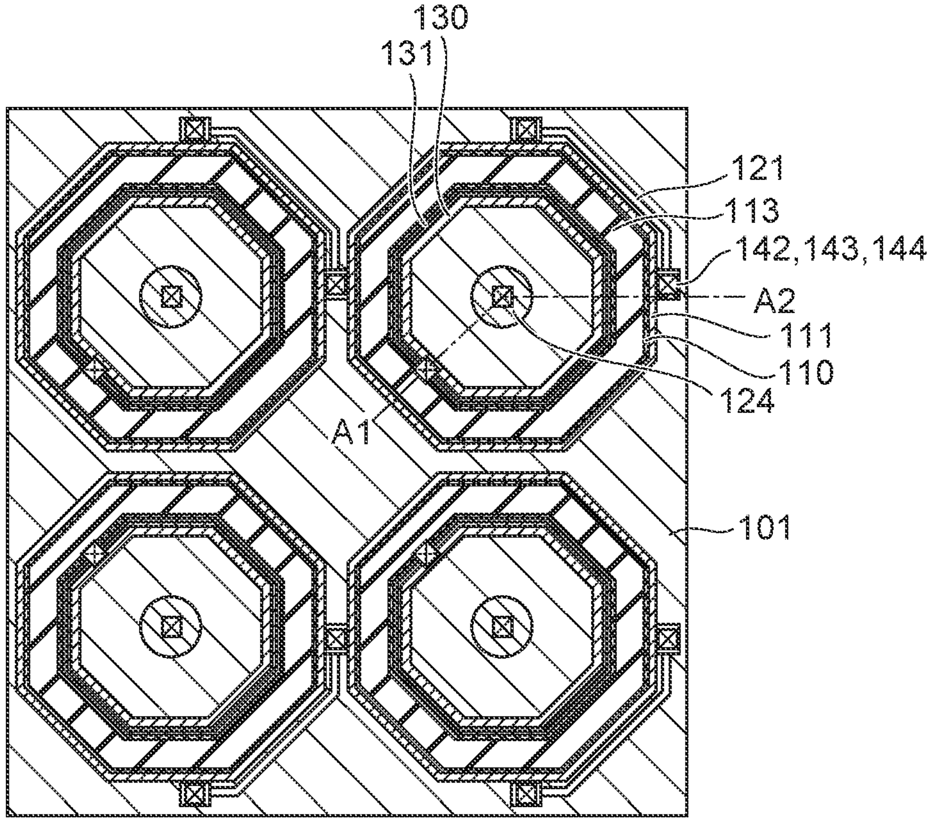

As shown in FIGS. 15A and 15B, titanium 142 and titanium nitride 143 are formed by sputtering along the inner walls of the contact holes 141 with thicknesses of 10 nm. The contact holes 141 are filled by forming tungsten 144 with a thickness of 300 nm by CVD. The tungsten 144, the titanium nitride 143, and the titanium 142 are planarized by CMP using the first inter-layer insulating film 140 as a stopper.

Figure 16A:
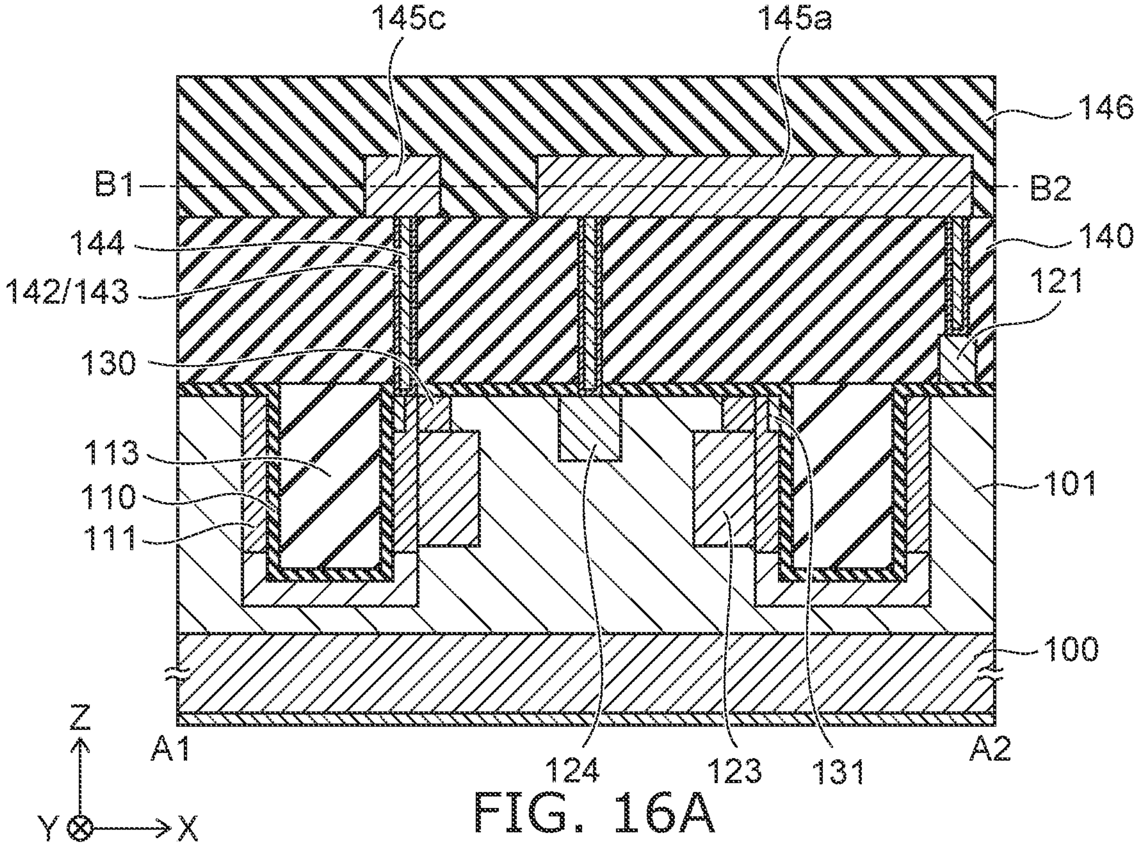
Figure 16B:
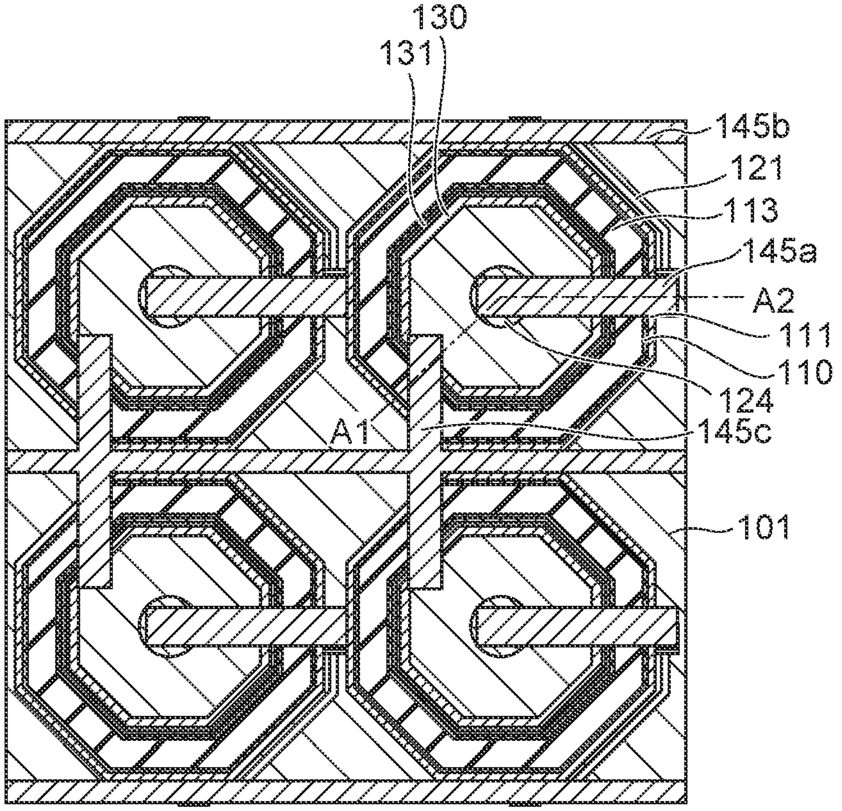

As shown in FIGS. 16A and 16B, a metal film is formed to have a thickness of 0.5 μm on the first inter-layer insulating film 140 by sputtering. Interconnects **145*a*, 145*b*, and 145*c* are formed by patterning the metal film into a prescribed shape by lithography and RIE. A silicon oxide film is formed to have a thickness of 0.8 μm on the interconnects 145*a* to 145*c* by CVD. A second inter-layer insulating film 146 is formed by planarizing the surface of the silicon oxide film. The first inter-layer insulating film 140 and the second inter-layer insulating film 146 are not illustrated in FIGS. 16B and 17**B.

Figure 17A:
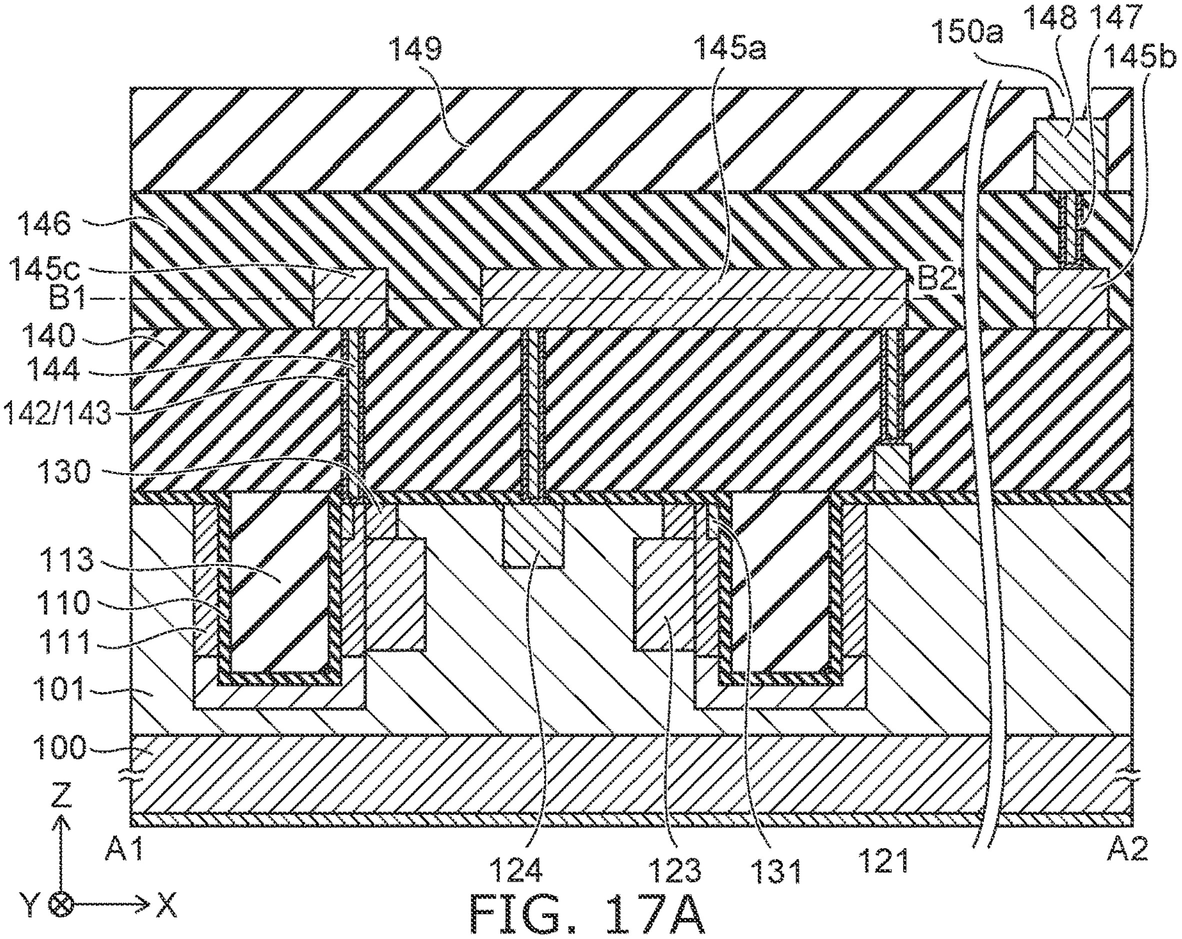
Figure 17B:
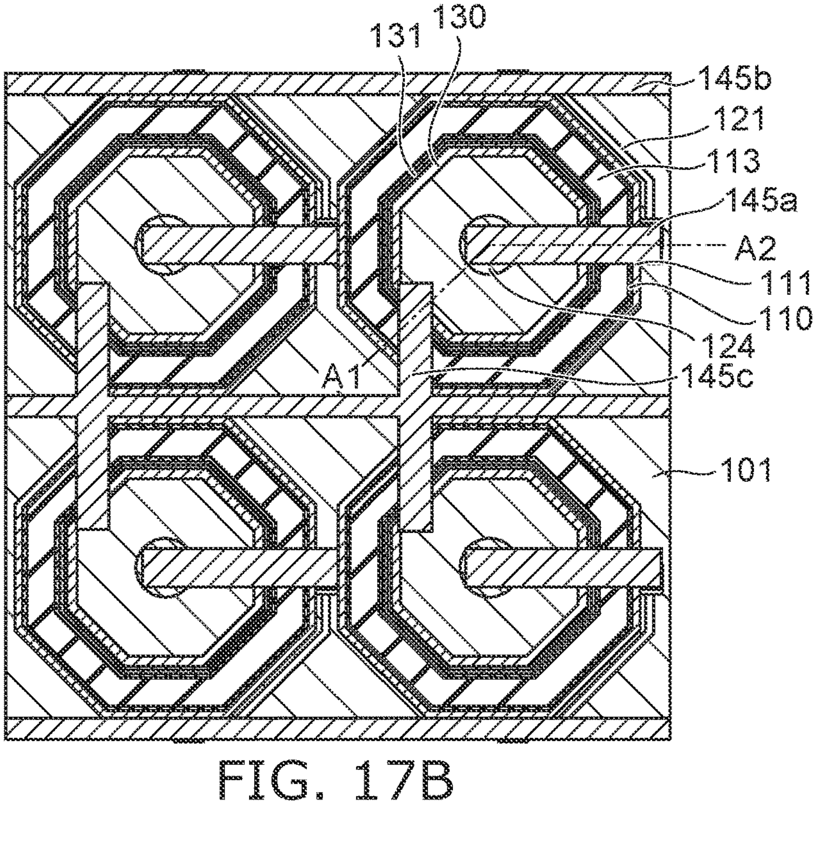
Figure 18:
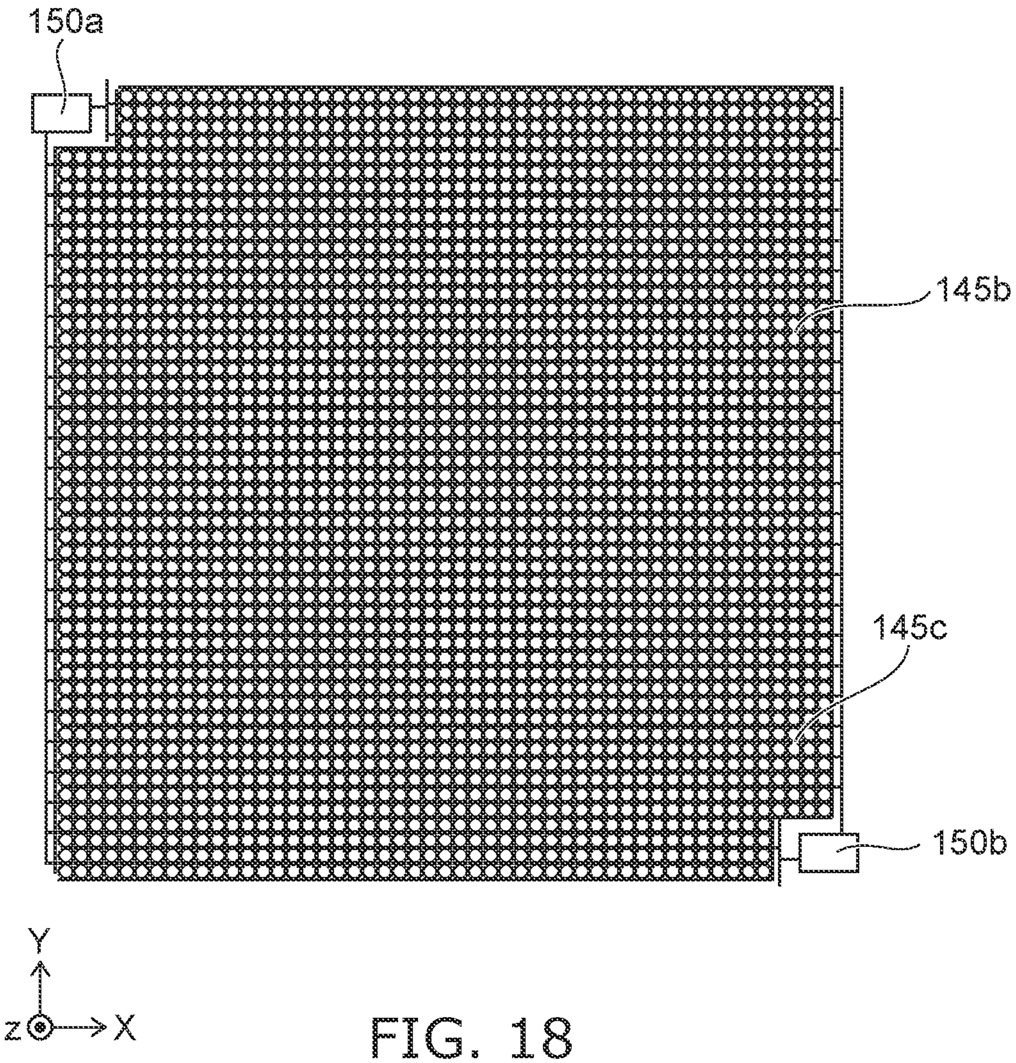

As shown in FIG. 17A, FIG. 17B, and FIG. 18, a via hole 147 that is positioned on the interconnect **145*c* is formed in the second inter-layer insulating film 146. The via hole 147 is filled with titanium, titanium nitride, and tungsten. The formation and filling of the via hole 147 is performed using a method similar to the method shown in FIG. 14A, FIG. 14B, FIG. 15A, FIG. 15B, FIG. 16A, and FIG. 16B. A pad metal interconnect 148, a read pad 150*a*, and a read pad 150*b* are formed. A silicon nitride film is formed by CVD with a thickness of 0.3 μm as a passivation film 149 on the second inter-layer insulating film 146 and the pad metal interconnect 148. The read pads 150*a* and 150*b* are exposed by removing a portion of the passivation film 149 by RIE. Thus, the light detector 1** according to the first embodiment is obtained.

For example, the p-type silicon substrate 100 of the manufacturing method described above corresponds to the p-type semiconductor layer 11 of the light detector 1 shown in FIGS. 1 to 3. A portion of the p-type silicon epitaxial layer 101 corresponds to the p-type semiconductor layer 12. The p-type avalanche layer 123 corresponds to the p-type semiconductor region 21. A portion of the n-type avalanche layer 111 corresponds to the n-type semiconductor region 22. Another portion of the p-type silicon epitaxial layer 101 corresponds to the p-type semiconductor region 23. The p-type anode electrode 124 corresponds to the p-type contact region 24. The n-type cathode electrode 131 corresponds to the n-type contact region 25. The n-type guard ring layer 130 corresponds to the n-type guard ring region 26. The n-type guard ring layer 112 corresponds to the guard ring region 27. Another portion of the n-type avalanche layer 111 positioned between the element separation regions 106 corresponds to the n-type semiconductor region 28. The element separation region 106 corresponds to the insulating part 30. The buried oxide film 113 corresponds to the insulating layer 31. The silicon oxide film 110 corresponds to the insulating layer 32. The silicon oxide film 120 corresponds to the insulating film 35*a*. The first inter-layer insulating film 140 corresponds to the insulating film 35*b*. The second inter-layer insulating film 146 corresponds to the insulating film 35*c*. The passivation film 149 corresponds to the insulating film 35*d*. The p-type silicon epitaxial layer 101 that is between the element separation regions 106 corresponds to the intermediate part 40. The quenching resistance 121 corresponds to the quenching part 50. The read pad 150*a* corresponds to the pad 61. The read pad 150*b* corresponds to the pad 62.

Advantages of the first embodiment will now be described.

Figure 19:
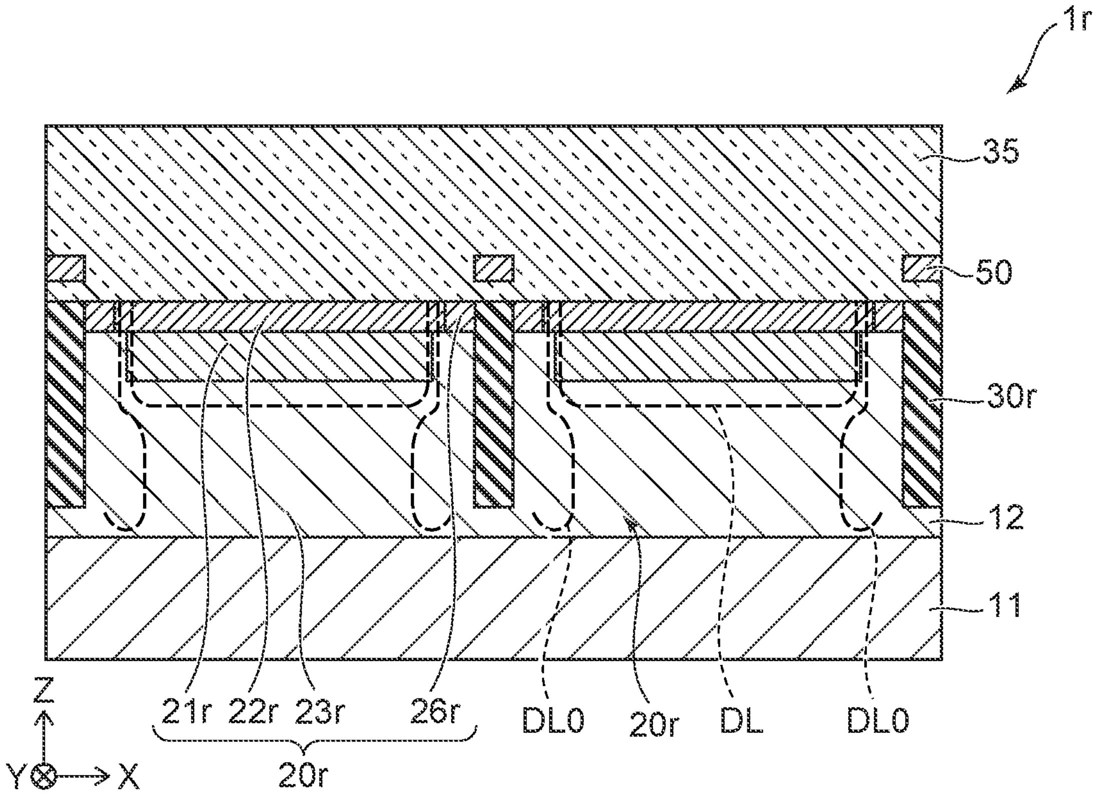
FIG. 19 is a cross-sectional view showing a portion of a light detector according to a reference example.

FIG. 19 is a cross-sectional view showing a portion of a light detector according to a reference example.

The light detector 1*r* shown in FIG. 19 includes the p-type semiconductor layer 11, the p-type semiconductor layer 12, an element 20*r*, an insulating part 30*r*, the insulating layer 35, and the quenching part 50. The element 20*r* and the insulating part 30*r* are located on the p-type semiconductor layer 12. The element 20*r* includes a p-type semiconductor region 21*r*, an n-type semiconductor region 22*r*, a p-type semiconductor region 23*r*, and an n-type guard ring region 26*r*. The p-type semiconductor region 21*r* is located on the p-type semiconductor region 23*r*. The n-type semiconductor region 22*r* is located on the p-type semiconductor region 21*r*. The n-type guard ring region 26*r* is located at the periphery of the n-type semiconductor region 22*r* and suppresses electric field concentration at the curved portions of the left and right ends of the n-type semiconductor region 22*r* in the X-Y plane. The insulating part 30*r* surrounds the elements 20*r* in the X-Y plane.

In the light detector 1*r*, a depletion layer DL spreads toward the p-type semiconductor layer 12 when a reverse voltage is applied between the p-type semiconductor region 21*r* and the n-type semiconductor region 22*r*. The sensitivity of the light detector 1*r* can be increased as the thickness of the depletion layer DL increases. However, simultaneously, a depletion layer DL0 spreads toward the p-type semiconductor layer 12 because an equivalent reverse voltage also is applied between the n-type guard ring region 26 and the p-type semiconductor layer 12. In the reference example, the depletion layer DL0 easily spreads drastically toward the bottom of the p-type semiconductor layer 12 compared to the depletion layer DL because the impurity concentration of the p-type semiconductor layer 12 is less than that of the p-type semiconductor region 21*r*. Also, because the electric field intensity at the depletion layer DL0 is low, the depletion layer DL0 is an insensitive region in which avalanche multiplication does not occur. A contribution of the extension of the depletion layer DL to the sensitivity is obstructed thereby, and in particular, the degradation of the sensitivity for a fine-pitch element 20 is problematic. Furthermore, it is necessary to increase the film thickness of the p-type semiconductor layer 12 to increase the sensitivity of incident light of long wavelengths. In such a case, the photoelectric conversion carriers that are generated in the non-depletion region of the p-type semiconductor layer 12 under the depletion layer DL when the non-depletion region exists become a delay component. The delayed carriers increase jitter and afterpulse noise. Therefore, it is desirable to fully deplete the p-type semiconductor layer 12 by extending the depletion layer DL completely to the p-type semiconductor layer 11. However, a large reverse bias would then be necessary, and the operating voltage and/or the power consumption may increase.

Figure 20:
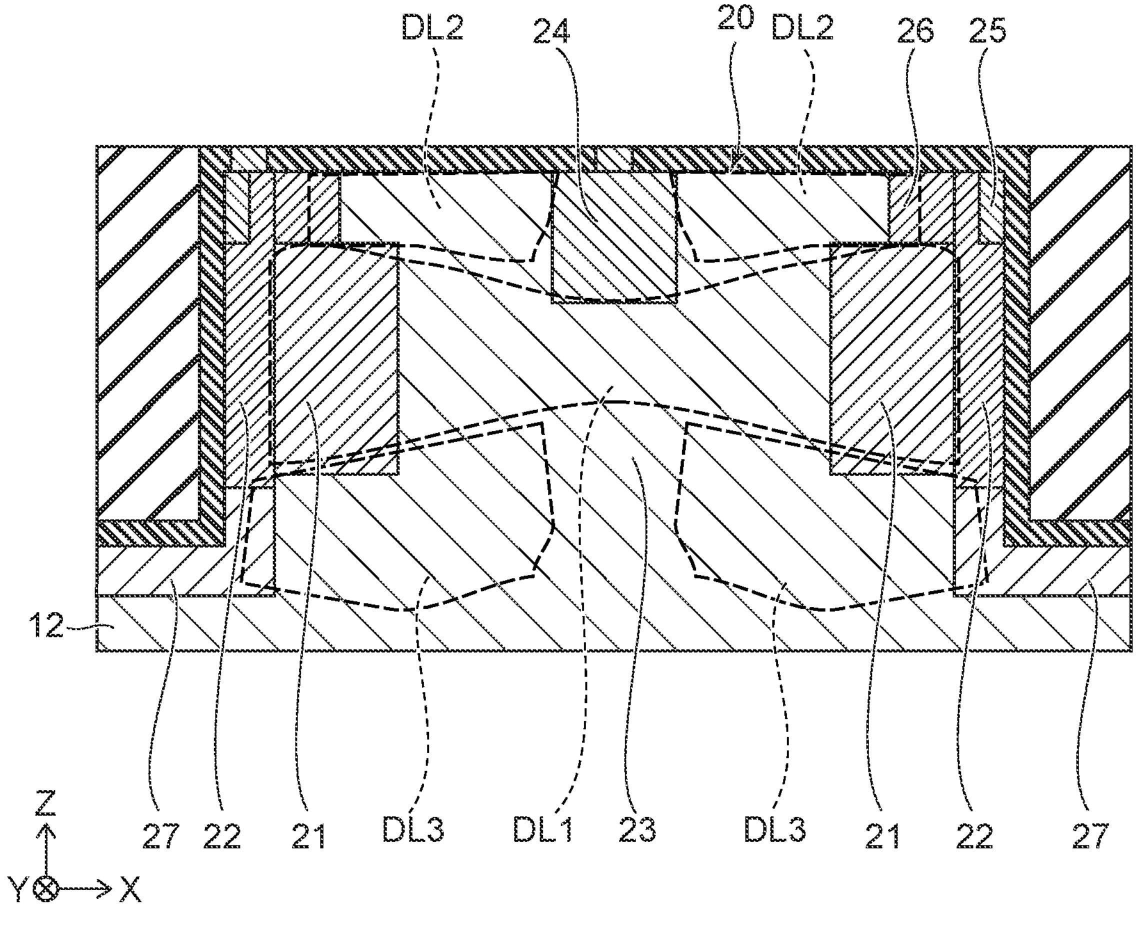
FIG. 20 is an enlarged cross-sectional view of a portion of FIG. 3.

FIG. 20 is an enlarged cross-sectional view of a portion of FIG. 3.

In the light detector 1, the p-n junction that is related to the avalanche multiplication is formed between the p-type semiconductor region 21 and the n-type semiconductor region 22 that surround the p-type semiconductor region 23 in the X-Y plane. When a reverse voltage is applied between the p-type semiconductor region 21 and the n-type semiconductor region 22, a depletion layer DL1 spreads from the p-n junction from the two sides in the X-Y plane directions. Thereby, particularly in a downscaled element 20, the p-type semiconductor layer 12 fully depletes more easily than the light detector 1*r*; and the increase of the jitter and the afterpulse noise can be suppressed. The extension of the depletion layer DL1 stops when the p-type semiconductor layer 12 is fully depleted. The reverse voltage that is subsequently applied to the element 20 is consumed only by the electric field intensity increase of the p-n junction related to the avalanche multiplication. Therefore, breakdown is possible at a lower voltage, which contributes to the reduction of the power consumption. Furthermore, the p-n junction that is related to the avalanche multiplication extends in the Z-direction. By increasing the depth of the insulating part 30, the p-n junction area can be increased without increasing the size of the element 20. Therefore, compared to the light detector 1*r*, the degradation of the sensitivity can be compensated when downscaling the element 20. In the light detector 1, the guard ring region that is formed at the two ends of the n-type semiconductor region 22 also can be vertically arranged in the Z-direction. The surface area occupied by the guard ring in the X-Y plane can be reduced thereby, and the degradation of the sensitivity can be avoided when downscaling the element 20.

When light is incident on the element 20, secondary photons may be generated at the p-n junction vicinity. When the secondary photons are incident on the adjacent element 20, a signal of carriers based on the secondary photons is detected. In other words, crosstalk noise is generated. In the light detector 1, the multiple insulating parts 30 and the intermediate part 40 are located between the elements 20 that are next to each other. The refractive index of the insulating part 30 is less than the refractive indexes of the semiconductor regions included in the element 20. Therefore, a portion of the secondary photons that are incident on the insulating part 30 is refracted downward or upward. A portion of the secondary photons that pass through the insulating part 30 and are incident on the intermediate part 40 are absorbed while passing through the intermediate part 40. The secondary photons that pass through the intermediate part 40 and are incident on another insulating part 30 are further refracted downward or upward. According to the light detector 1, the incidence of the secondary photons between the elements 20 that are next to each other can be suppressed, and the crosstalk noise can be reduced.

To more effectively reduce the crosstalk noise, it is favorable for the distance between the elements 20 that are next to each other in the X-direction or the Y-direction to be not less than 3 μm. For example, the width of the intermediate part 40 between the elements 20 that are next to each other is not less than 2 μm. Thereby, the secondary photons are easily absorbed by the intermediate part 40.

More favorably, the light detector 1 includes the n-type guard ring region 26 and the guard ring region 27. When the n-type guard ring region 26 is included as shown in FIG. 20, a depletion layer DL2 spreads from the p-n junction between the n-type guard ring region 26 and the p-type semiconductor region 23. When the guard ring region 27 is included, a depletion layer DL3 spreads from the p-n junction between the guard ring region 27 and the p-type semiconductor layer 12. The electric field intensities at the depletion layers DL2 and DL3 are less than the electric field intensity at the depletion layer DL1. For example, avalanche multiplication does not occur due to the carriers flowing along the electric fields of the depletion layers DL2 and DL3; and such carriers are negligible as a signal. Dark carriers that are generated at the interface between the insulating layer 35 and the semiconductor layers at the upper surface of the element 20 flow toward the n-type contact region 25 due to the electric field of the depletion layer DL2. The delayed carriers that are generated at the upper portion of the p-type semiconductor layer 11 flow toward the n-type contact region 25 due to the electric field of the depletion layer DL3. The noise of the light detector 1 can be suppressed thereby.

Figure 21:
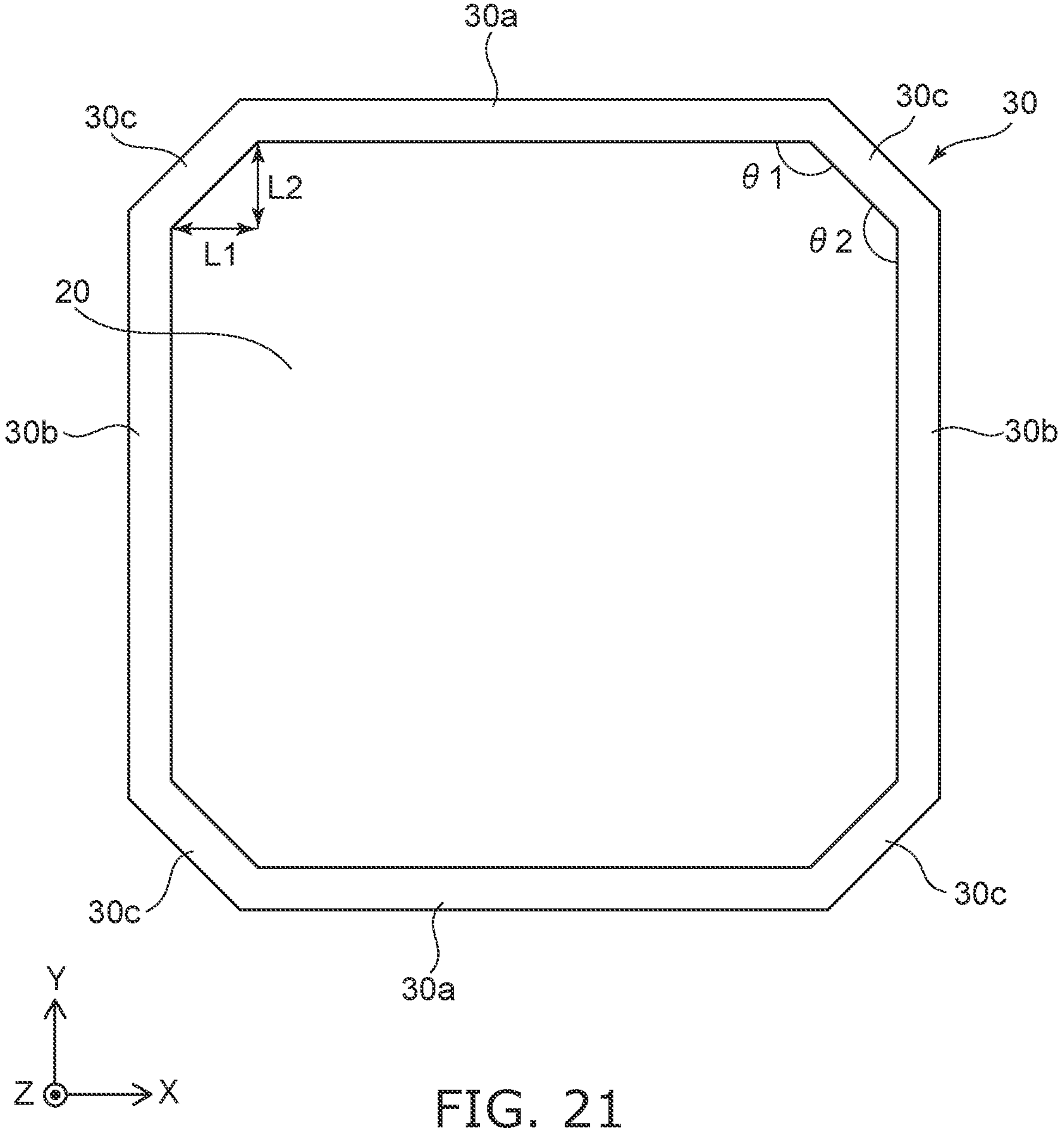
FIGS. 21 and 22 are schematic plan views illustrating a portion of the light detector according to the first embodiment.
Figure 22:
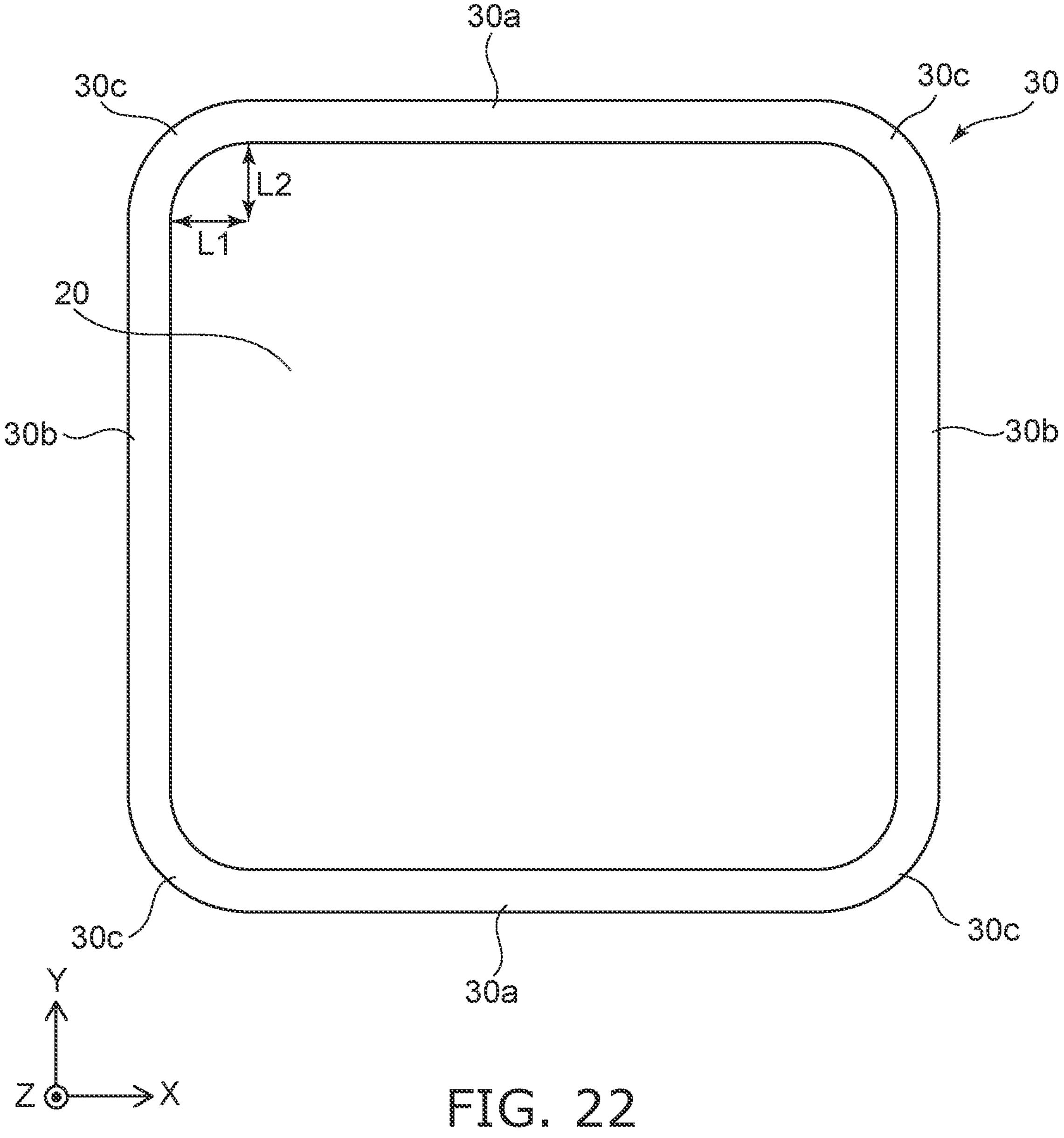

FIGS. 21 and 22 are schematic plan views illustrating a portion of the light detector according to the first embodiment.

For example, the insulating part 30 is a polygon with interior angles of not less than 135 degrees when viewed along the Z-direction. In the example shown in FIG. 21, the insulating part 30 is an octagon when viewed along the Z-direction. One interior angle is about 135 degrees. Specifically, the insulating part 30 includes a pair of first extension portions 30*a* extending along the X-direction, a pair of second extension portions 30*b* extending along the Y-direction, and multiple link portions 30*c*. The element 20 is located between the pair of first extension portions 30*a* in the Y-direction. The element 20 is located between the pair of second extension portions 30*b* in the X-direction. The link portions 30*c* each link one end of the first extension portion 30*a* and one end of the second extension portion 30*b*.

The length in the X-direction of the first extension portion 30*a* is greater than the length in the X-direction of the link portion 30*c*. The length in the Y-direction of the second extension portion 30*b* is greater than the length in the Y-direction of the link portion 30*c*. For example, the link portion 30*c* is a straight line when viewed along the Z-direction. It is favorable for an angle θ1 between the first extension portion 30*a* and the link portion 30*c* to be not less than 135 degrees. It is favorable for an angle θ2 between the second extension portion 30*b* and the link portion 30*c* to be not less than 135 degrees.

It is favorable for a length L1 in the X-direction of the link portion 30*c* and a length L2 in the Y-direction of the link portion 30*c* each to be not less than 1 μm.

Or, as shown in FIG. 22, the corners of the insulating part 30 may be curved when viewed along the Z-direction. In other words, the link portions 30*c* may be curved when viewed along the Z-direction. In the example shown in FIG. 22, the insulating part 30 is a rounded quadrilateral when viewed along the Z-direction. For example, one end of the link portion 30*c* linked to the first extension portion 30*a* is along the X-direction. The other end of the link portion 30*c* linked to the second extension portion 30*b* is along the Y-direction. Thereby, the link portion 30*c* smoothly links the first extension portion 30*a* and the second extension portion 30*b*. Or, the insulating part 30 may be a circular ring when viewed along the Z-direction.

Figure 23:
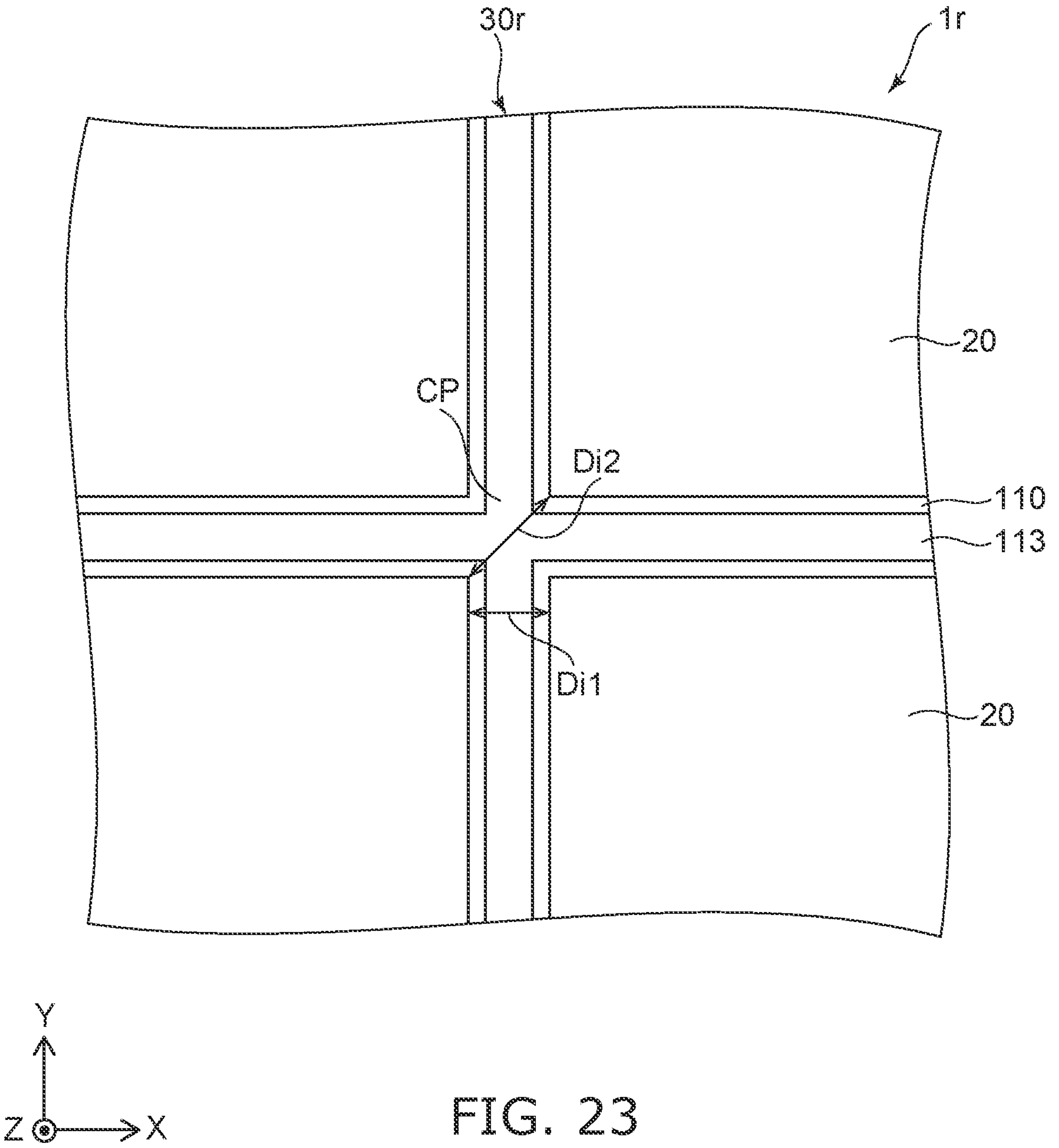
FIG. 23 is a schematic plan view illustrating a portion of the light detector according to the reference example.

FIG. 23 is a schematic plan view illustrating a portion of the light detector according to the reference example.

In the light detector 1*r* according to the reference example as shown in FIG. 23, the insulating part 30*r* is provided in a lattice shape. Specifically, a portion of the insulating part 30*r* extends along the X-direction. Another portion of the insulating part 30*r* extends along the Y-direction. The corners of the elements 20 are about 90 degrees at the vicinity of a crossing portion CP between the portion of the insulating part 30*r* extending along the X-direction and the portion of the insulating part 30*r* extending along the Y-direction. Compared to the other portions, a large stress is generated by the protrusion of the corners of the elements 20 between the insulating part 30*r* and the elements 20 at the vicinity of the crossing portion CP.

For example, according to the structure shown in FIG. 21, the interior angle between the first extension portion 30*a* and the link portion 30*c* and the interior angle between the second extension portion 30*b* and the link portion 30*c* can be 135 degrees or more. Or, as shown in FIG. 22, when the insulating part 30 is a rounded polygon when viewed along the Z-direction, the corners of the insulating part 30 can be curved. According to such a structure, the stress that is applied between the element 20 and the insulating part 30 at the corners of the insulating part 30 can be relaxed. For example, the occurrence of cracks in the element 20 and the insulating part 30 can be suppressed by the relaxation of the stress. Operation errors that are caused by the occurrence of cracks can be suppressed.

When cracks occur in the p-type silicon epitaxial layer 101, the silicon oxide film 110, or the buried oxide film 113 when forming the silicon oxide film 110 and the buried oxide film 113 that correspond to the insulating part 30, there is a possibility that a resist may enter the cracks in the subsequent photolithography processes. When the resist enters the cracks, resist residue occurs inside the cracks when stripping away the resist. The resist residue causes organic contamination of the oxidation furnace in subsequent heating processes such as oxidization, etc. By relaxing the stress on the p-type silicon epitaxial layer 101, the silicon oxide film 110, and the buried oxide film 113, the occurrence of cracks can be suppressed, and the yield of the light detector 1 can be increased.

In the structure of the insulating part 30*r* shown in FIG. 23, a dimension Di2 of the crossing portion CP in the diagonal direction is about 1.4 times a dimension Di1 of the crossing portion CP in the X-direction or the Y-direction. The diagonal direction is perpendicular to the Z-direction and is oblique to the X-direction and the Y-direction. In other words, in the process corresponding to FIGS. 7A and 7B when manufacturing the structure shown in FIG. 23, the dimension of the trench structure 108 in the diagonal direction at the portion at which the crossing portion CP is formed is about 1.4 times the dimension Di1 in the X-direction or the Y-direction. Due to this dimensional difference, the trench structure 108 is not completely filled at the crossing portion CP when forming the buried oxide film 113 inside the trench structure 108; and a void occurs inside the buried oxide film 113. Similarly to cracks, a resist enters the void and causes resist residue in the void. According to the structure shown in FIGS. 21 and 22, the local increase of the dimension of the trench structure 108 can be avoided; and the occurrence of voids can be suppressed.

In the example shown in FIGS. 21 and 22, it is favorable for the lengths of the link portion 30*c* in the X-direction and the Y-direction to be not less than 1 μm. The stress that is generated at the vicinity of the link portion 30*c* can be effectively relaxed thereby.

Herein, an example is described in which the insulating part 30 includes the pair of first extension portions 30*a*, the pair of second extension portions 30*b*, and the multiple link portions 30*c*. It is sufficient for the insulating part 30 to include at least one first extension portion 30*a*, one second extension portion 30*b*, and one link portion 30*c* that are connected to each other. The stress at the vicinity of the region in which the one first extension portion 30*a*, the one second extension portion 30*b*, and the one link portion 30*c* are located can be relaxed thereby.

Modification

Figure 24:
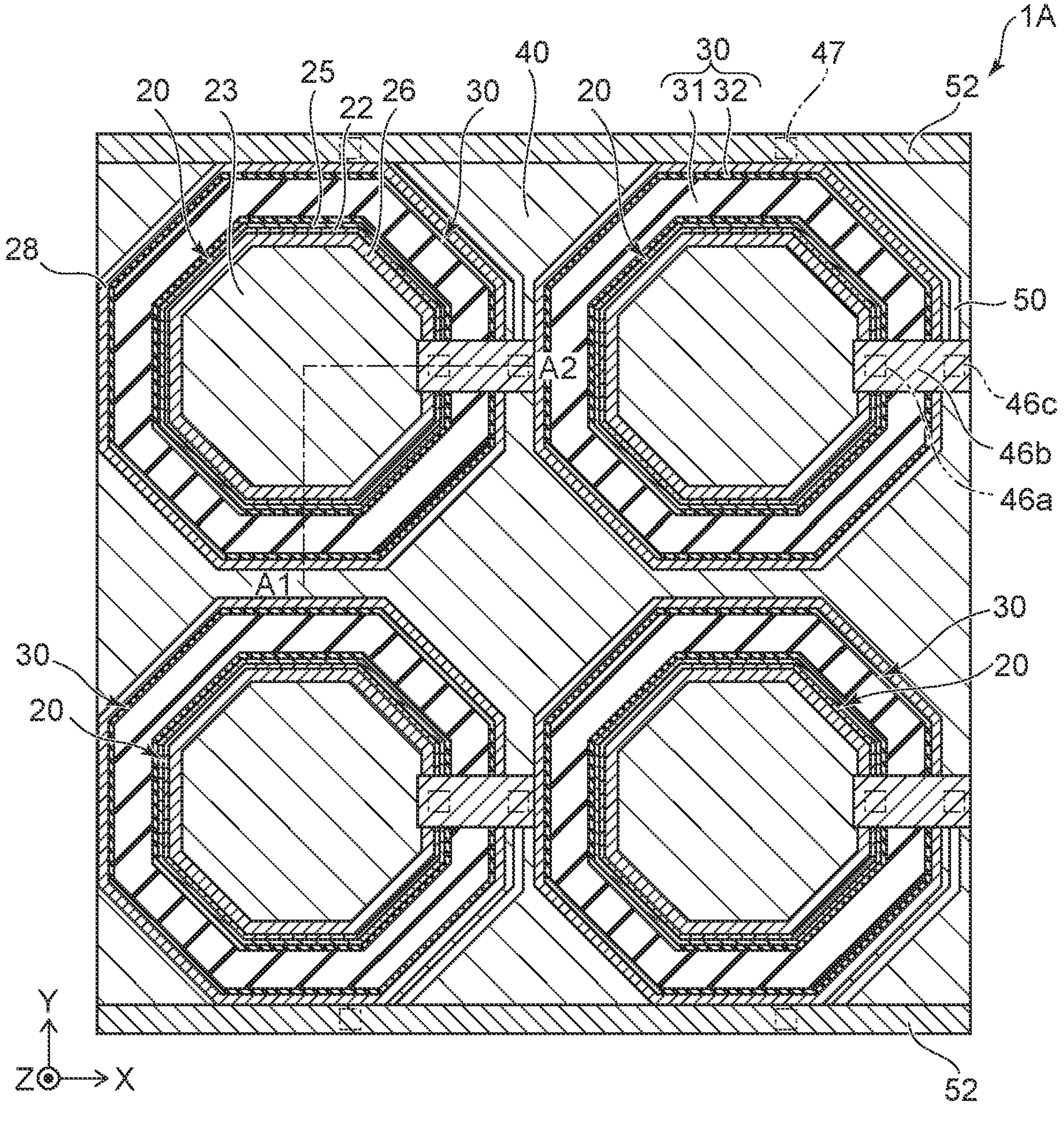
FIG. 24 is a schematic plan view showing a portion of a light detector according to a modification of the first embodiment.
Figure 25:
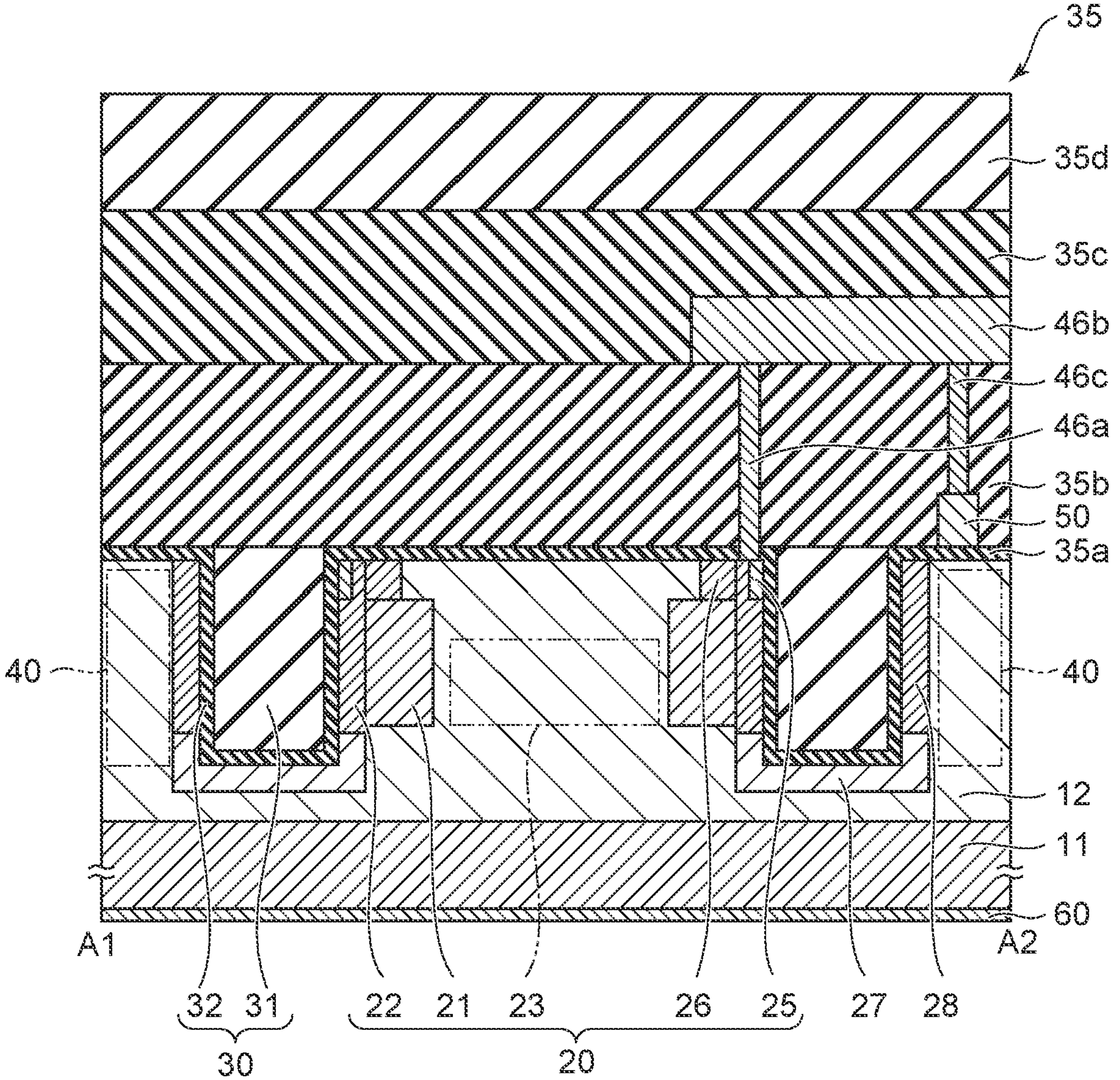
FIG. 25 is an A1-A2 cross-sectional view of FIG. 24.

FIG. 24 is a schematic plan view showing a portion of a light detector according to a modification of the first embodiment. FIG. 25 is an A1-A2 cross-sectional view of FIG. 24.

In the light detector 1A according to the modification of the first embodiment, compared to the light detector 1, the p-type contact region 24, the plug 45*a*, the interconnect 45*b*, the first interconnect 51, and the pad 61 are not included. Instead, the light detector 1A includes an electrode 60. The electrode 60 is located under the p-type semiconductor layer 11 and is positioned at the lower surface of the light detector 1A. The electrode 60 can be used as a p-type anode electrode. The p-type semiconductor region 21 and the p-type semiconductor region 23 are electrically connected with the electrode 60 via the p-type semiconductor layers 11 and 12.

In the light detector 1A as shown in FIG. 24, the n-type semiconductor region 22 is electrically connected with the quenching part 50 via the n-type contact region 25, the plug 46*a*, the interconnect 46*b*, and the plug 46*c*. The quenching part 50 is electrically connected with the second interconnect 52.

Similarly to the light detector 1 shown in FIG. 1, the second interconnect 52 is electrically connected with the pad 62. A potential is applied to the electrode 60 instead of the pad 61. In the light detector 1A, a negative operating voltage with respect to the pad 62 is applied to the electrode 60. For example, the operating voltage is set to −60 V to −70 V. The signal when the light is incident on the light detector 1A is read from the pad 62.

The p-type contact region 24, the plug 45*a*, and the interconnect 45*b* do not exist at the light incident surface side of the element 20 in the light detector 1A. Therefore, compared to the light detector 1, the opening ratio is improved, and the sensitivity is improved.

SECOND EMBODIMENT

Figure 26:
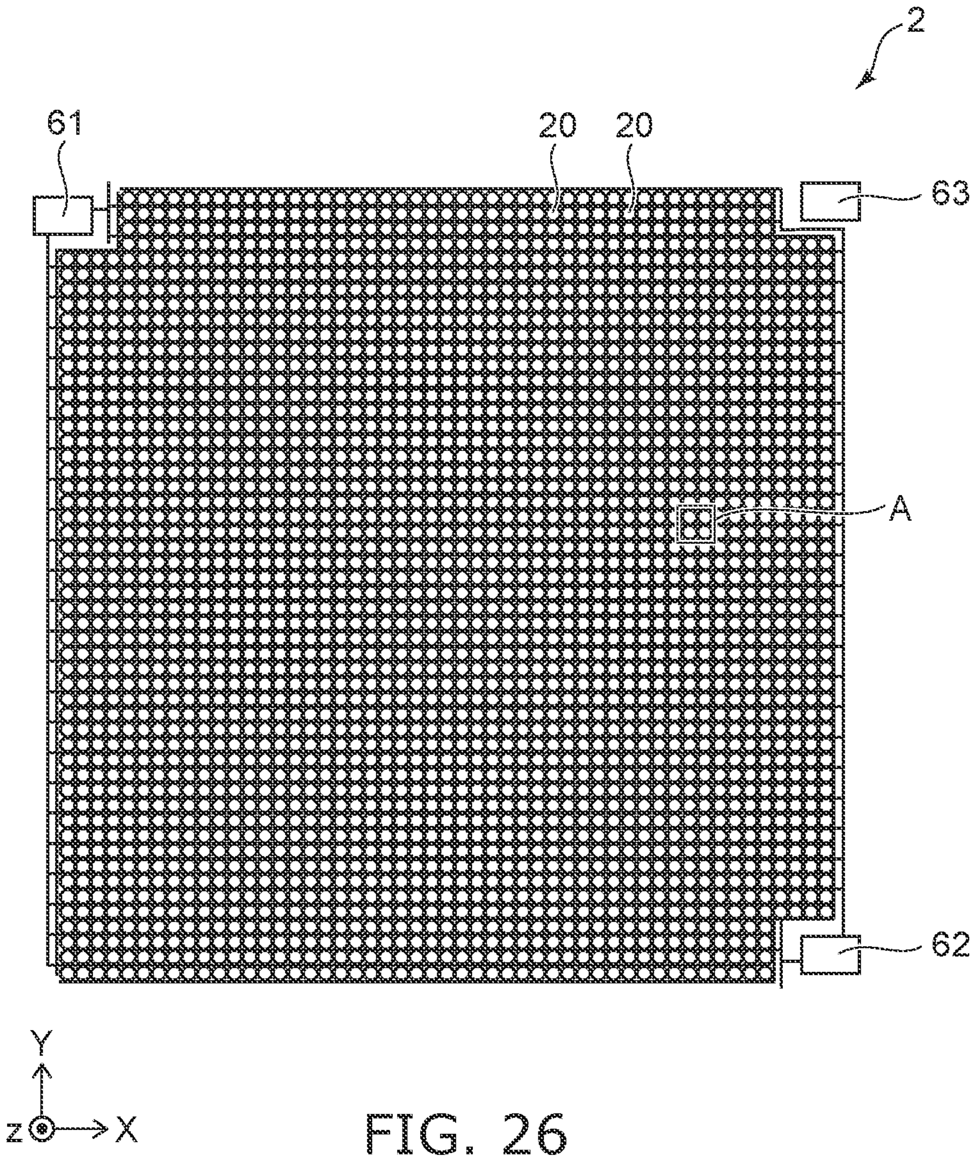
FIG. 26 is a schematic plan view showing a light detector according to a second embodiment.
Figure 27:
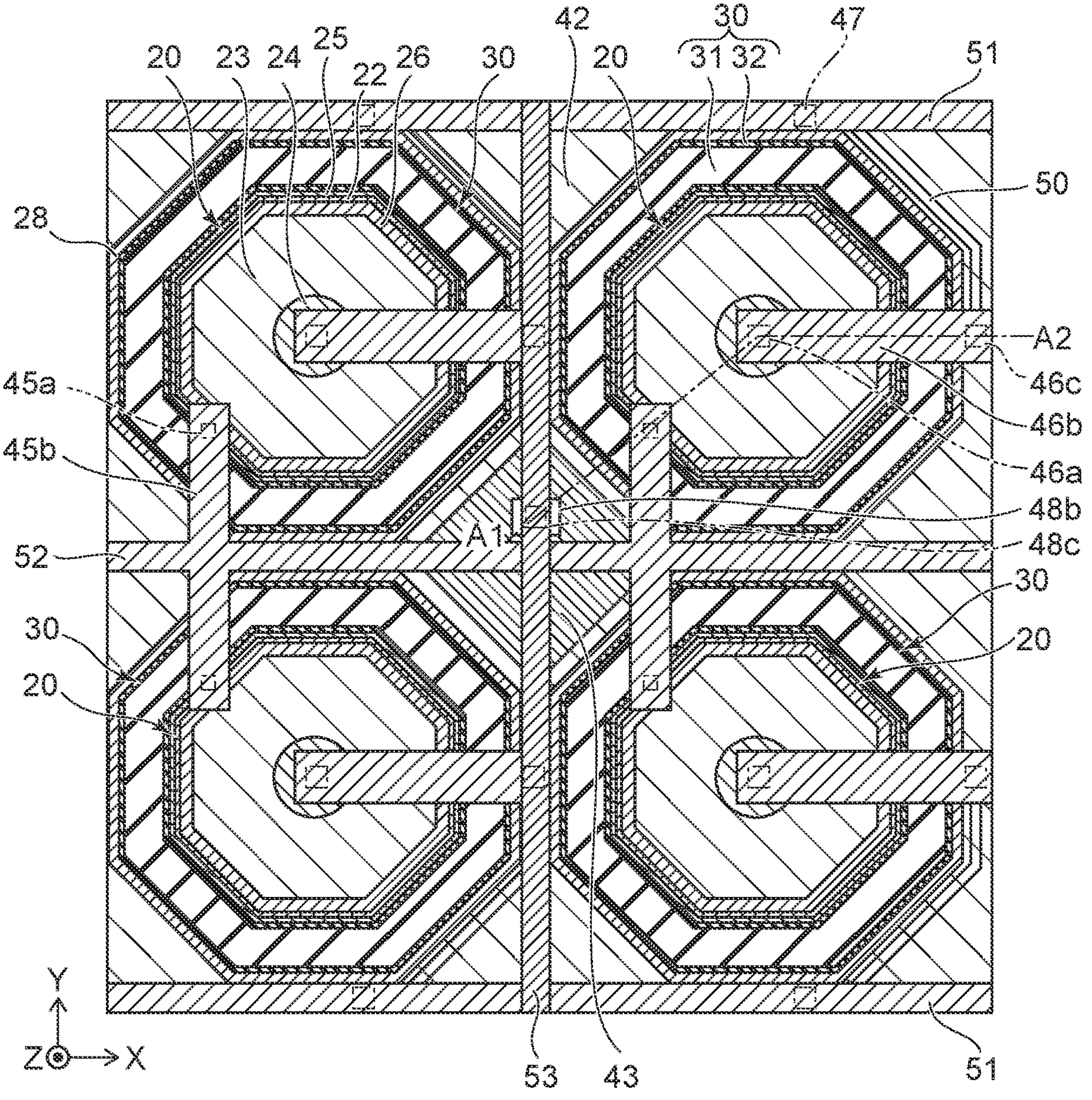
FIG. 27 is an enlarged view of portion A of FIG. 26.
Figure 28:
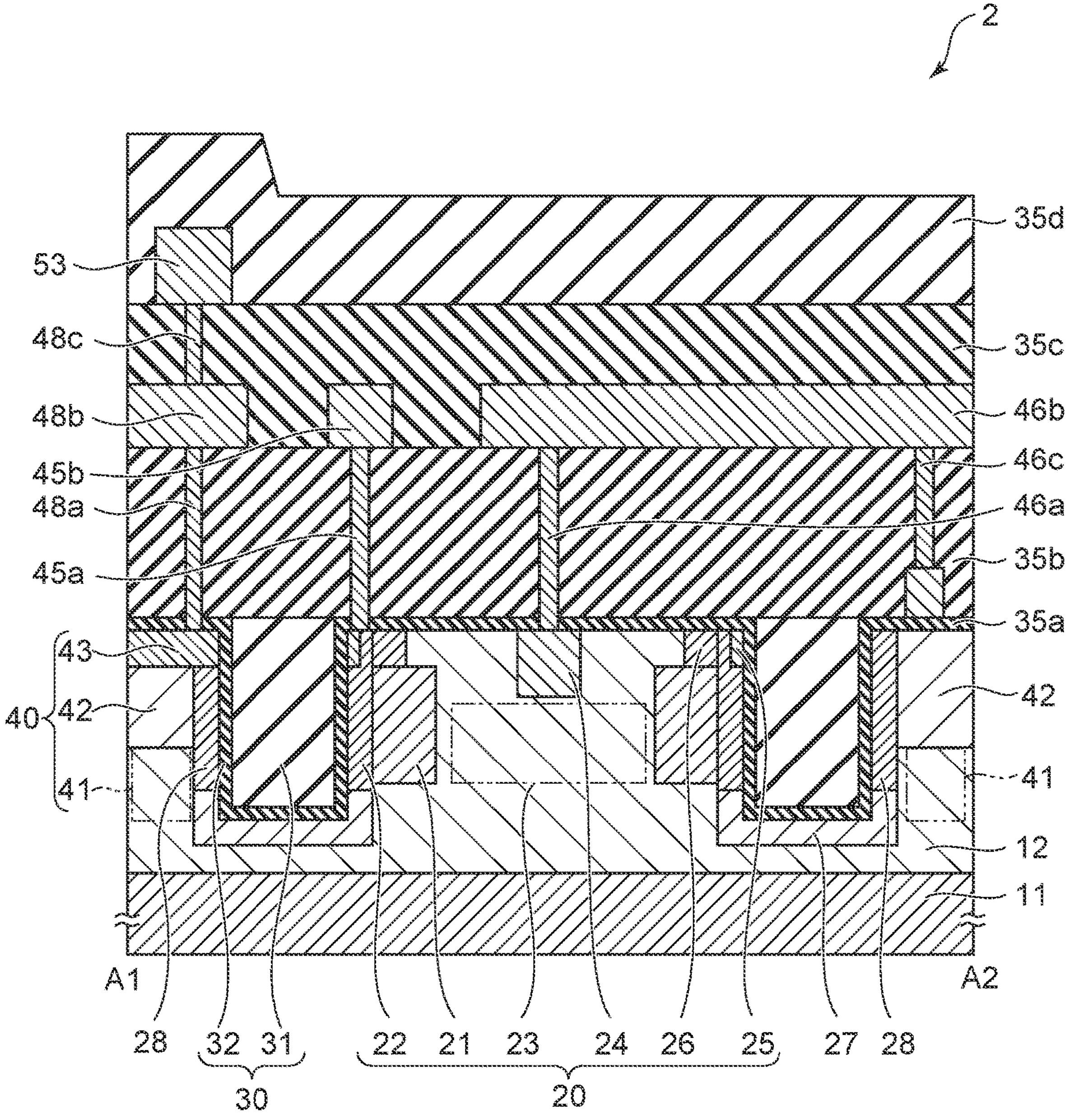
FIG. 28 is an A1-A2 cross-sectional view of FIG. 27.

FIG. 26 is a schematic plan view showing a light detector according to a second embodiment. FIG. 27 is an enlarged view of portion A of FIG. 26. FIG. 28 is an A1-A2 cross-sectional view of FIG. 27.

Compared to the light detector 1, the light detector 2 according to the second embodiment further includes a plug 48*a* (a contact plug), an interconnect 48*b*, a plug 48*c*, a third interconnect 53, and a pad 63. The intermediate part 40 includes a first intermediate region 41, a second intermediate region 42, and a third intermediate region 43.

As shown in FIG. 26, the pad 63 is located at the upper surface of the light detector 1. The pads 61 to 63 are separated from each other and are electrically isolated from each other.

As shown in FIG. 28, the second intermediate region 42 is located on the first intermediate region 41. The third intermediate region 43 is located on the second intermediate region 42. In the light detector 2, the first intermediate region 41 is of the p-type. The second intermediate region 42 and the third intermediate region 43 are of the n-type. The n-type impurity concentration in the third intermediate region 43 is greater than the n-type impurity concentration in the second intermediate region 42.

As shown in FIG. 27, the second intermediate region 42 is located around the insulating parts 30 in the X-Y plane. The third intermediate region 43 is located on a portion of the second intermediate region 42. In the illustrated example, the third intermediate region 43 is located between every other element 20 that are next to each other in an oblique direction. The oblique direction is perpendicular to the Z-direction and is oblique to the X-direction and the Y-direction.

As shown in FIG. 28, the plug 48*a* is located on the third intermediate region 43. The interconnect 48*b* is located on the plug 48*a*. The plug 48*c* is located on the interconnect 48*b*. The plug 48*c* is electrically connected with the third interconnect 53. The third interconnect 53 is electrically connected with the pad 63. In other words, the third intermediate region 43 is electrically connected with the pad 63 via the plug 48*a*, the interconnect 48*b*, the plug 48*c*, and the third interconnect 53. The potentials of the second and third intermediate regions 42 and 43 can be fixed by applying a voltage to the pad 63.

As shown in FIG. 27, the third interconnect 53 extends in the Y-direction; and multiple third interconnects 53 are arranged in the X-direction. One third interconnect 53 is electrically connected with multiple third intermediate regions 43.

Figure 29:
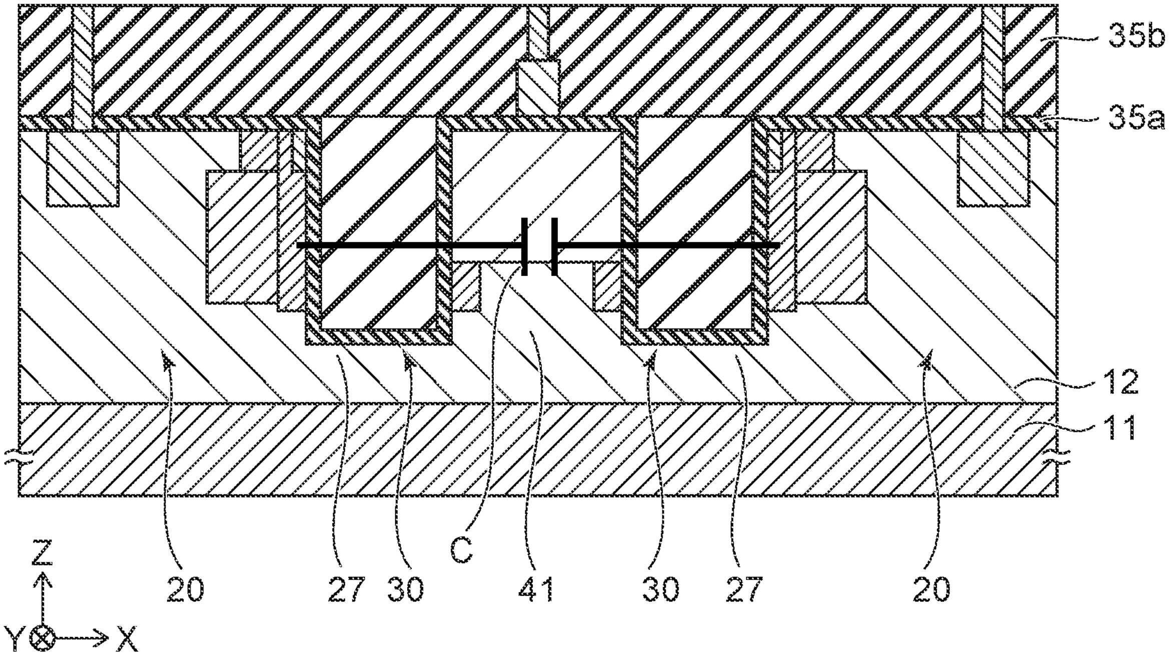
FIG. 29 is a schematic cross-sectional view showing a portion of the light detector according to the second embodiment.

FIG. 29 is a schematic cross-sectional view showing a portion of the light detector according to the second embodiment.

Advantages of the second embodiment will now be described.

In the element 20, the voltage fluctuates when the incidence of light on the element 20 is detected. Here, as shown in FIG. 29, capacitive coupling C via the insulating parts 30 and the intermediate part 40 exists between the elements 20 that are next to each other. In the light detector 1, the voltages of the elements 20 that are next to each other fluctuate via the capacitive coupling C when the voltage of one element 20 fluctuates.

For example, in the element 20 on which the light is incident, a potential drop occurs due to the carriers of the avalanche breakdown flowing in the quenching part 50. Thereby, the cathode potential is reduced to be not more than the breakdown voltage. When the potential fluctuation is transmitted to an adjacent element 20 via the capacitive coupling C, the cathode potential of the adjacent element 20 is reduced. If light is incident on the adjacent element 20 at this time, operation errors occur; namely, the avalanche gain may decrease or the avalanche itself may not occur.

In the light detector 2, the potentials of the second and third intermediate regions 42 and 43 are fixed. The fluctuation of the voltages of the elements 20 that are next to each other can be suppressed thereby, even when the voltage of one element 20 fluctuates. According to the second embodiment, the operation of the light detector 2 can be stabilized more.

By setting the potential of the intermediate part 40 to be about equal to the potential of the n-type contact region 25, the increase of the potential difference between the element 20 and the n-type semiconductor region 28 can be suppressed even when the voltage of the element 20 fluctuates; and the occurrence of local avalanche breakdown can be suppressed.

THIRD EMBODIMENT

Figure 30:
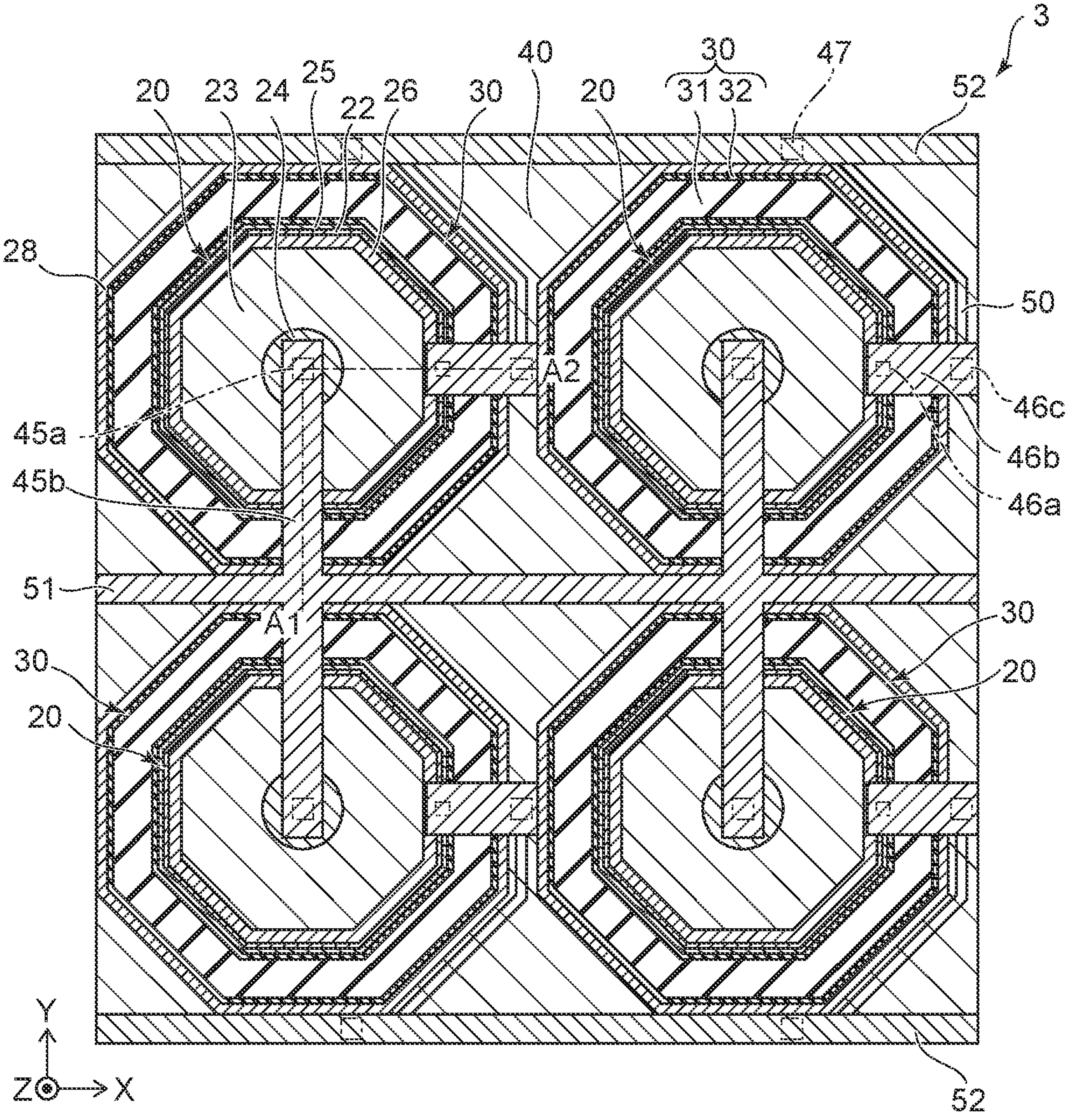
FIG. 30 is a schematic plan view showing a portion of a light detector according to a third embodiment.
Figure 31:
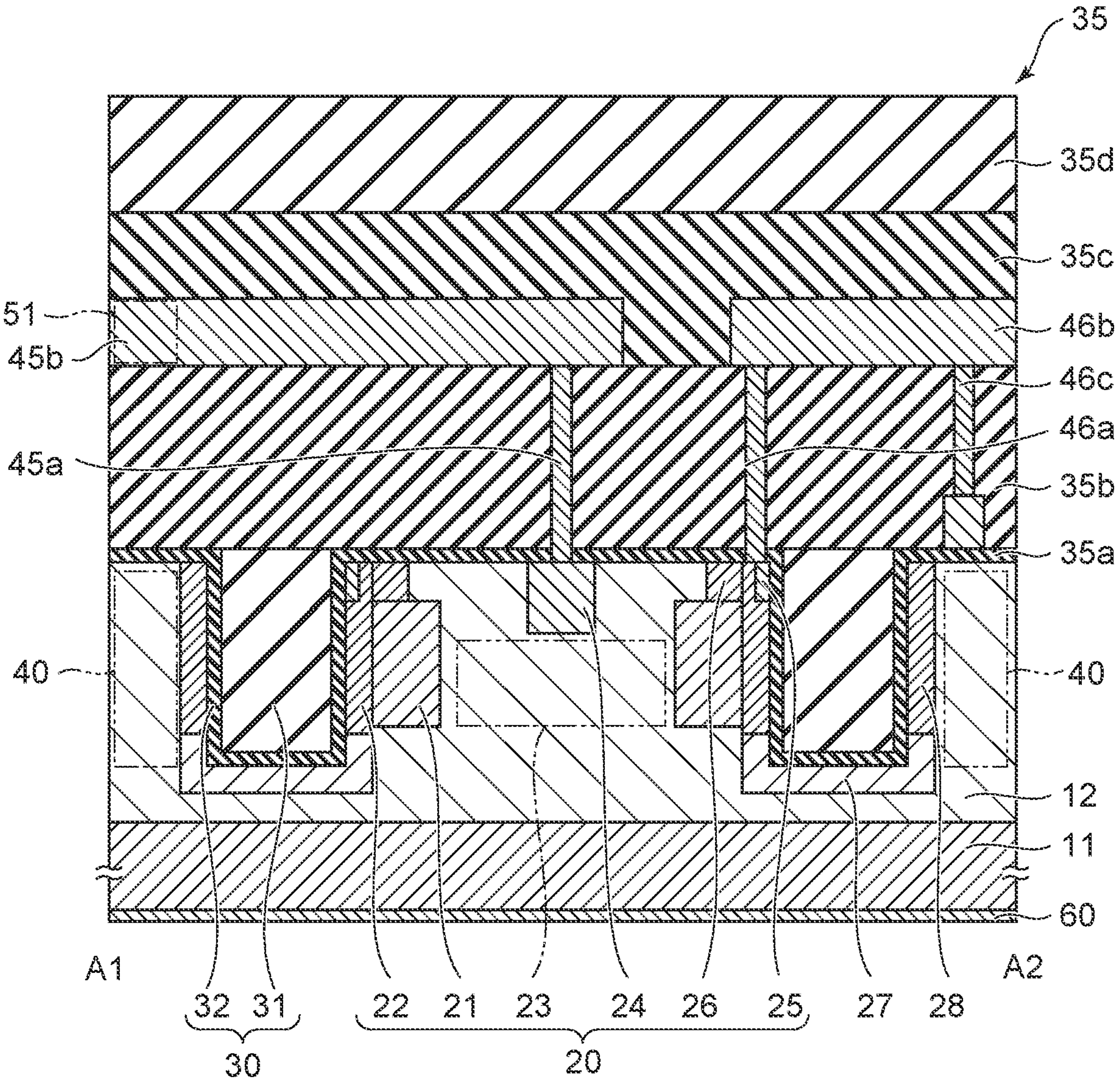
FIG. 31 is an A1-A2 cross-sectional view of FIG. 30.

FIG. 30 is a schematic plan view showing a portion of a light detector according to a third embodiment. FIG. 31 is an A1-A2 cross-sectional view of FIG. 30.

Compared to the light detector 1, the light detector 3 according to the third embodiment further includes the electrode 60. As shown in FIG. 31, the electrode 60 is located under the p-type semiconductor layer 11. The p-type semiconductor region 21 and the p-type semiconductor region 23 are electrically connected with the electrode 60 via the p-type semiconductor layers 11 and 12.

In the light detector 3 as shown in FIGS. 30 and 31, the n-type semiconductor region 22 is electrically connected with the quenching part 50 via the n-type contact region 25, the plug 46*a*, the interconnect 46*b*, and the plug 46*c*. The quenching part 50 is electrically connected with the second interconnect 52. The p-type semiconductor region 21 is electrically connected with the first interconnect 51 via the p-type semiconductor region 23, the p-type contact region 24, the plug 45*a*, and the interconnect 45*b*.

Similarly to the light detector 1 shown in FIG. 1, the first interconnect 51 is electrically connected with the pad 61. The second interconnect 52 is electrically connected with the pad 62. In the light detector 3, a negative operating voltage with respect to the pad 62 is applied to the electrode 60 and the pad 61. For example, the operating voltage is set to −60 V to −70 V. The signal when light is incident on the light detector 3 is read from the pad 62.

Figure 32:
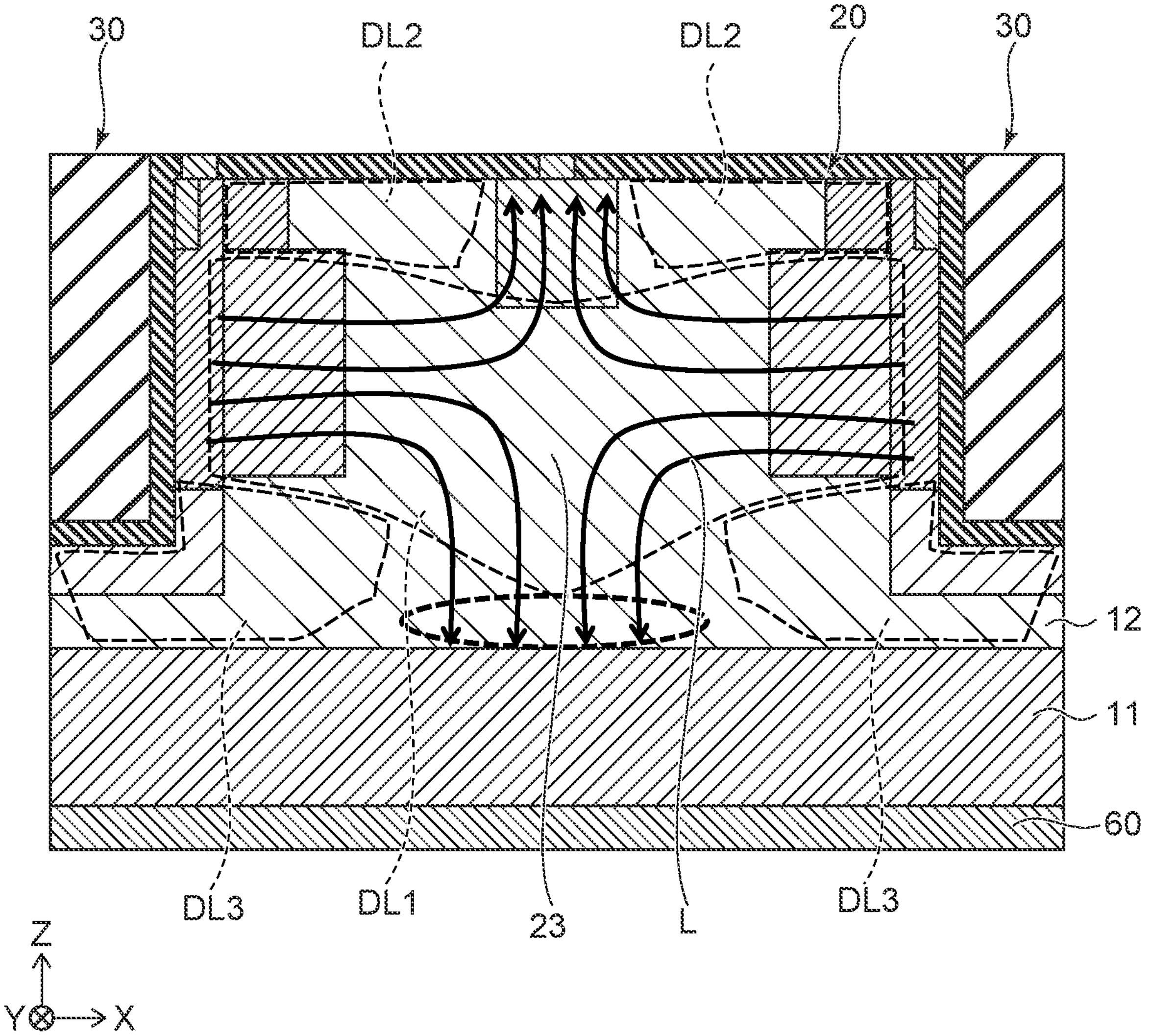
FIG. 32 is an enlarged cross-sectional view of a portion of FIG. 31.

FIG. 32 is an enlarged cross-sectional view of a portion of FIG. 31.

In the light detector 3 as shown in FIG. 32, compared to the light detector 1, the depletion layer DL1 spreads more toward the p-type semiconductor layer 11. This is because an electric field is generated between the electrode 60 and the n-type semiconductor region 22, and lines of electric force EL are generated toward the p-type semiconductor layer 11. According to the third embodiment, the light-receiving sensitivity of the light detector 3 can be increased because the spreading region of the depletion layer is increased.

The operating voltage that is applied to the electrode 60 may be equal to the operating voltage applied to the pad 61 or may be different from the operating voltage applied to the pad 61. For example, the fraction of the light amount that is absorbed by the p-type semiconductor layer 11 or the lower portion of the p-type semiconductor region 23 increases as the wavelength of the incident light increases. Therefore, it is favorable for the potential of the electrode 60 to be less than the potential of the pad 61 so that the depletion layer is distributed more toward the p-type semiconductor layer 11 side.

FOURTH EMBODIMENT

Figure 33:
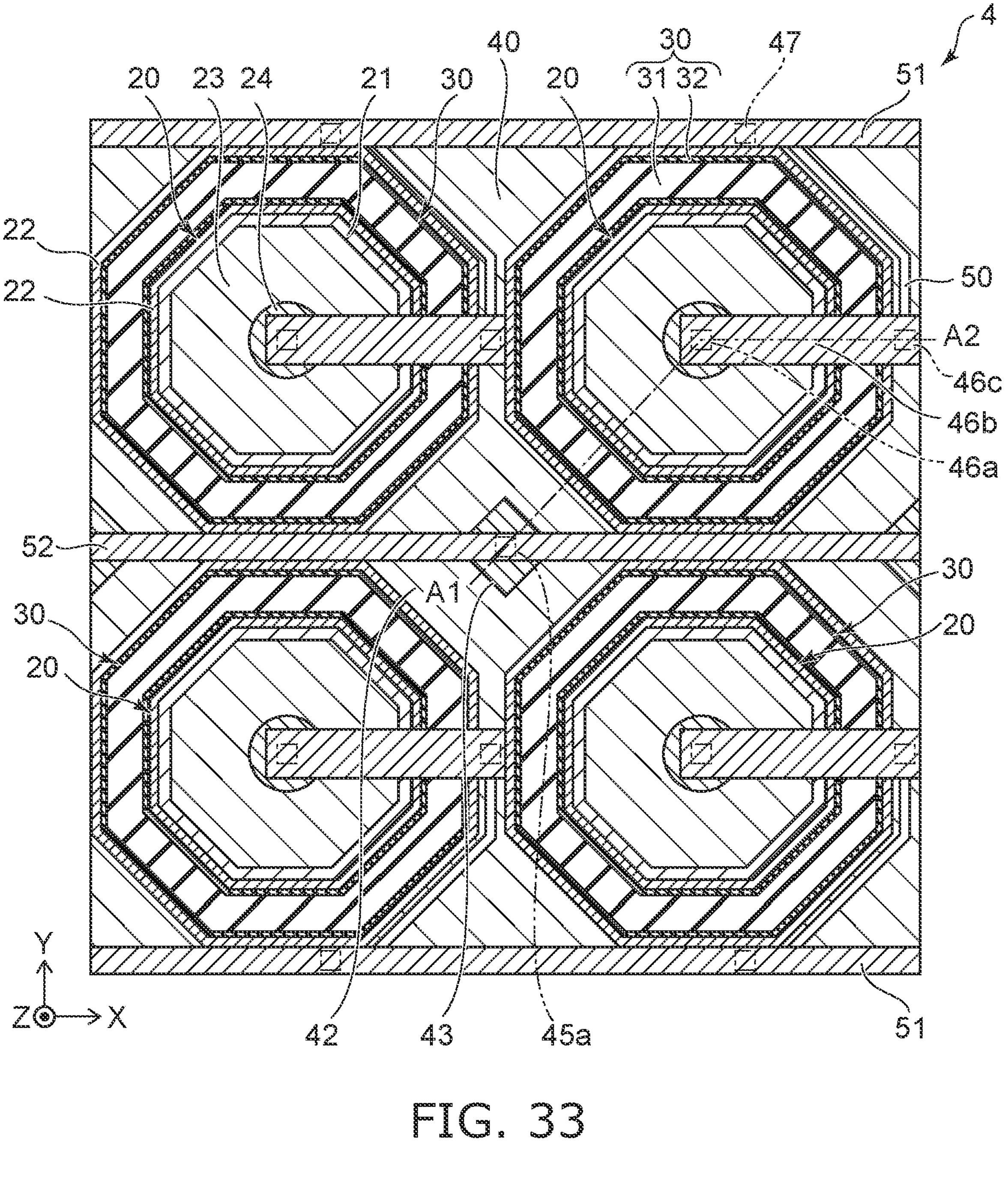
FIG. 33 is a schematic plan view showing a portion of a light detector according to a fourth embodiment.
Figure 34:
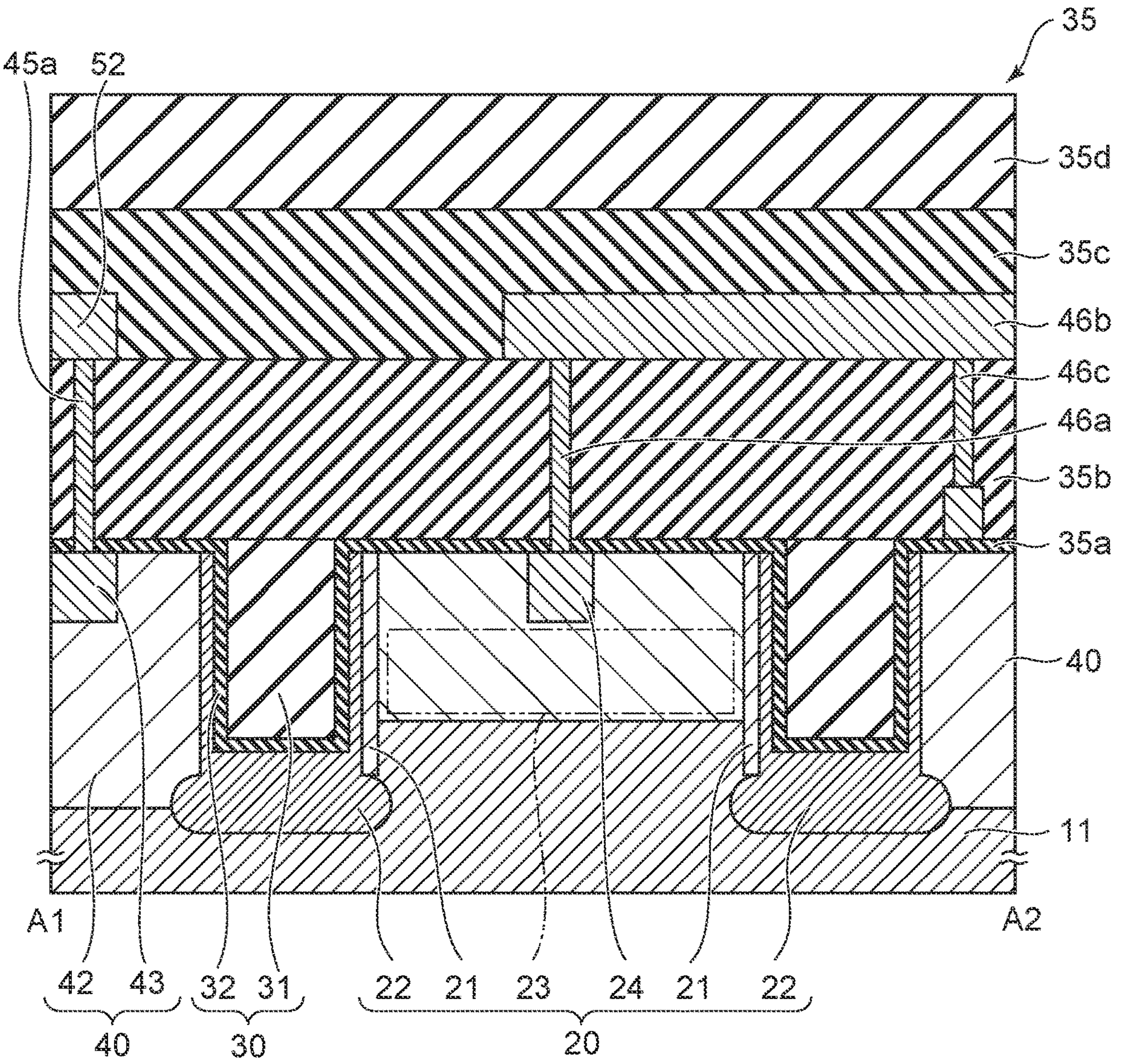
FIG. 34 is an A1-A2 cross-sectional view of FIG. 33.

FIG. 33 is a schematic plan view showing a portion of a light detector according to a fourth embodiment. FIG. 34 is an A1-A2 cross-sectional view of FIG. 33.

In the light detector 4 shown in FIGS. 33 and 34, a portion of the p-type semiconductor region 21, a portion of the n-type semiconductor region 22, the lower end of the insulating part 30, etc., are located inside the semiconductor layer 11.

Instead of the guard ring region 27, the n-type semiconductor region 22 is located around the bottom portion of the insulating part 30. In other words, a portion of the n-type semiconductor region 22 is positioned between the p-type semiconductor region 21 and the insulating part 30 in the X-Y plane. Another portion of the n-type semiconductor region 22 is positioned between the p-type semiconductor layer 11 and the insulating part 30 in the Z-direction.

The intermediate part 40 is a p-type semiconductor region. The intermediate part 40 includes the second intermediate region 42 and the third intermediate region 43. The lower end of the second intermediate region 42 is positioned inside the p-type semiconductor layer 11 and is positioned lower than the lower end of the insulating part 30. The third intermediate region 43 is located on the second intermediate region 42. The third intermediate region 43 is electrically connected with the second interconnect 52 via the plug 45*a*.

FIGS. 35A to 50 are schematic views showing manufacturing processes of the light detector according to the fourth embodiment. FIGS. 35B to 49B are respectively B1-B2 cross-sectional views of FIGS. 35A to 49A. FIGS. 35A to 49A are respectively A1-A2 cross-sectional views of FIGS. 35B to 49B.

An example of a favorable method for manufacturing the light detector 1 according to the fourth embodiment will now be described with reference to FIGS. 35A to 50.

Figure 35A:
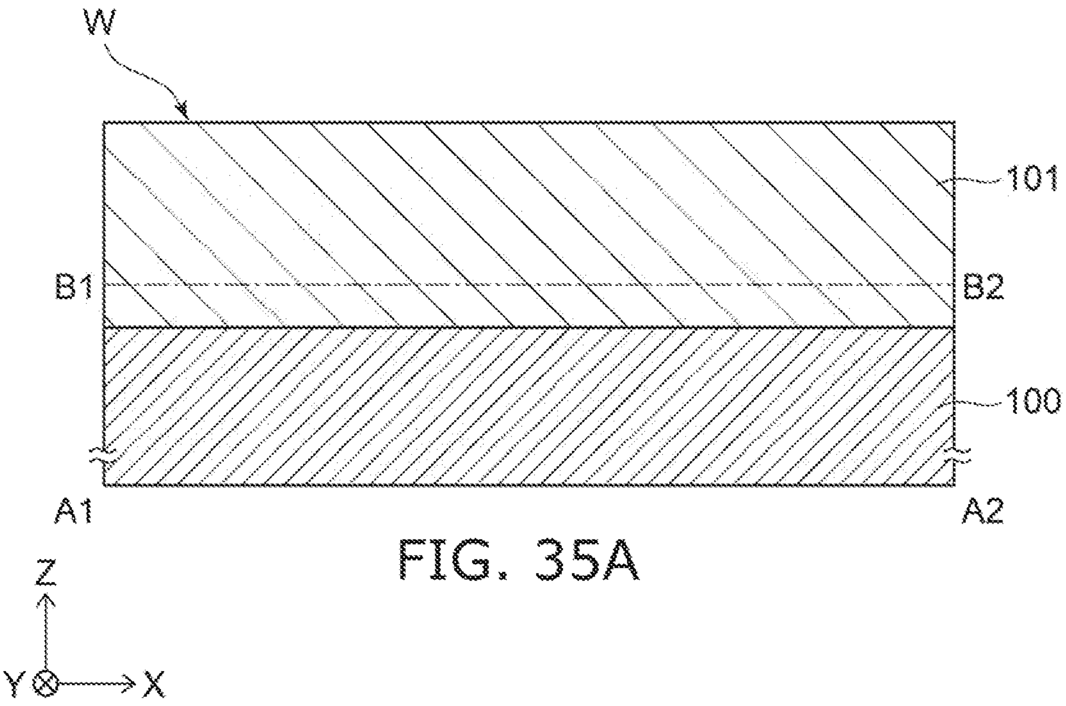
FIGS. 35A, 35B, 36A, 36B, 37A, 37B, 38A, 38B, 39A, 39B, 40A, 40B, 41A, 41B, 42A, 42B, 43A, 43B, 44A, 44B, 45A, 45B, 46A, 46B, 47A, 47B, 48A, 48B, 49A, 49B, and 50 are schematic views showing manufacturing processes of the light detector according to the first embodiment.
Figure 35B:
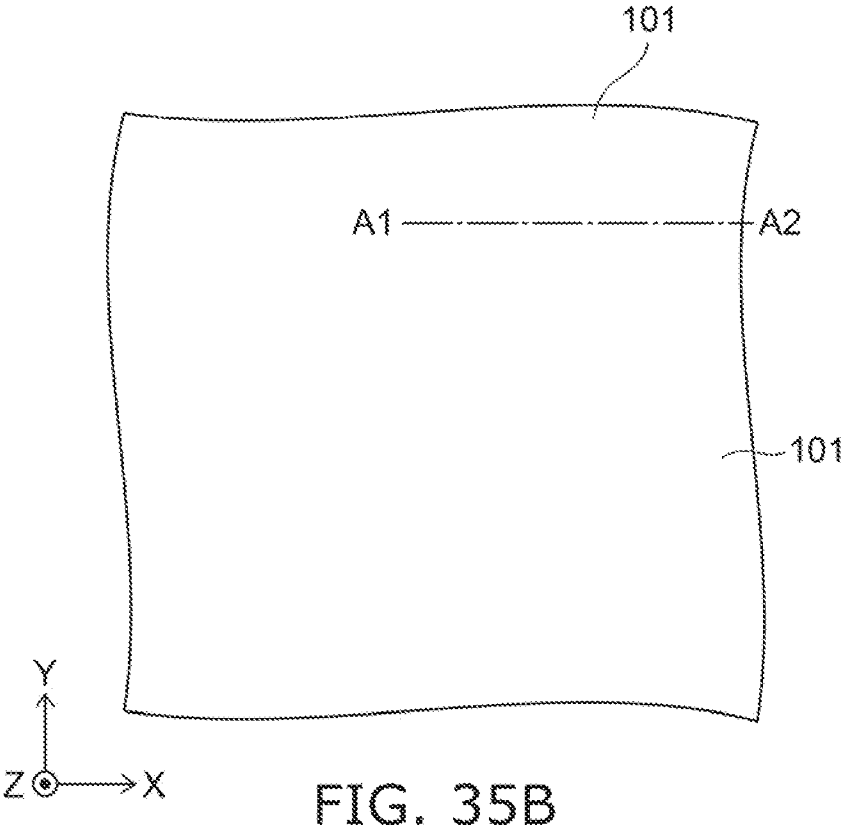

First, the wafer W is prepared as shown in FIGS. 35A and 35B. The wafer W includes the single-crystal p-type silicon substrate 100, and the p-type silicon epitaxial layer 101 that is formed on the p-type silicon substrate 100. The p-type silicon substrate 100 is doped with boron with a concentration of $1.0\times10^{13}/cm^3$. The p-type silicon epitaxial layer 101 is doped with boron with a concentration of $1.0\times10^{14}/cm^3$. The p-type silicon epitaxial layer 101 is formed by epitaxial growth and has a thickness of 8.5 μm. A layer that is doped with a high concentration of boron may be provided at the lower surface of the p-type silicon substrate 100 to suppress contamination.

Figure 36A:
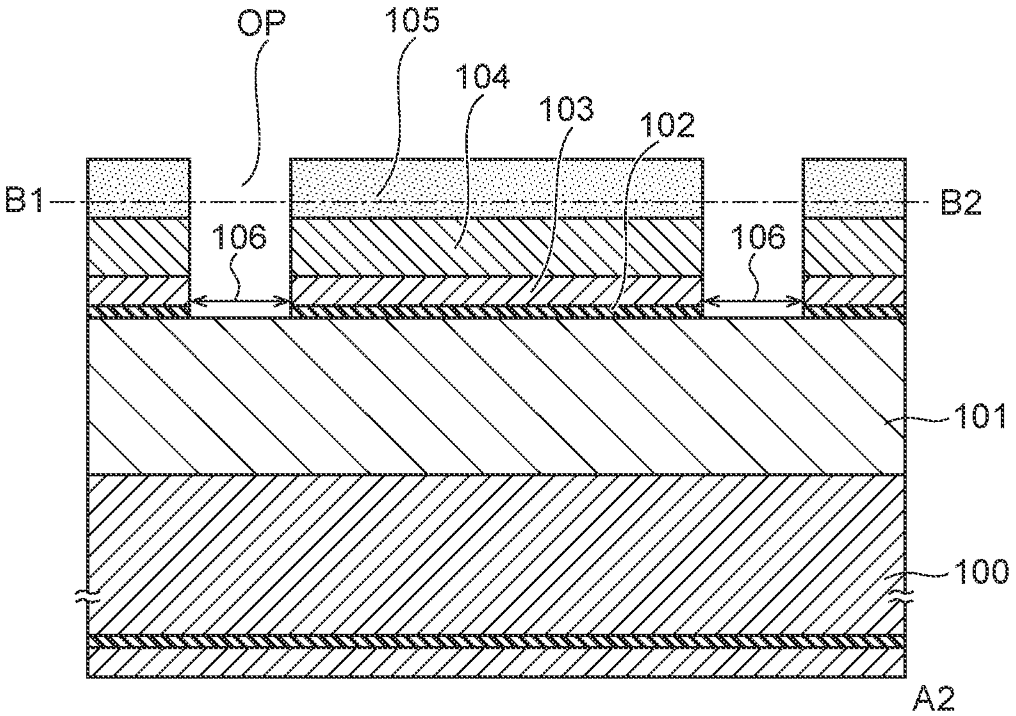
Figure 36B:
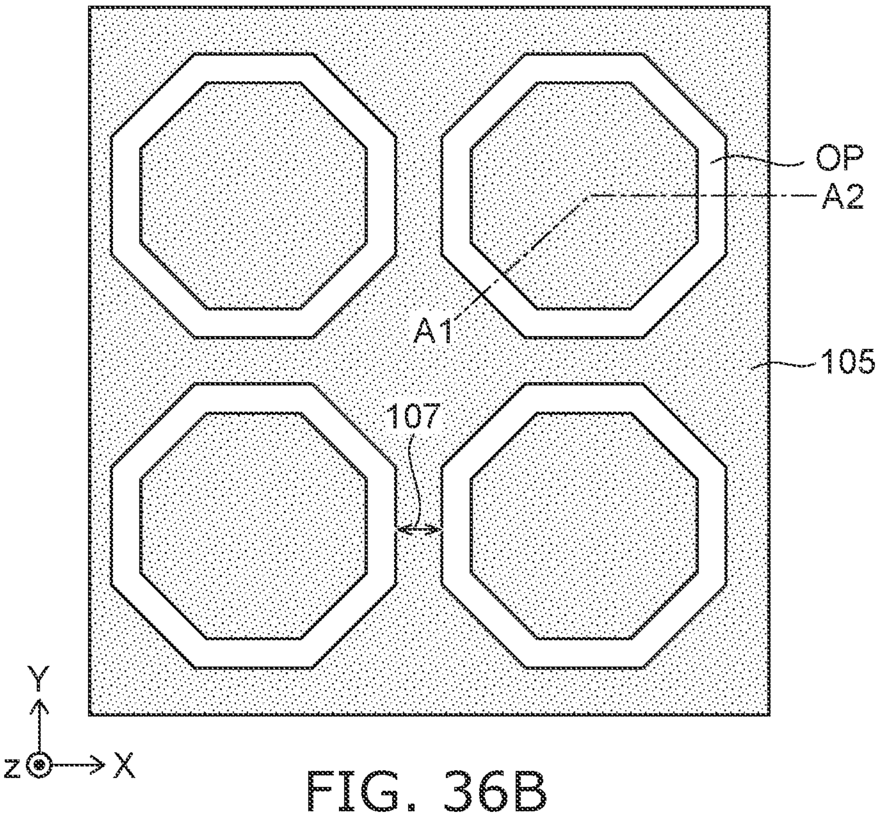

As shown in FIGS. 36A and 36B, the silicon thermal oxide film 102 is formed to have a thickness of 100 nm by oxidizing the surface of the p-type silicon epitaxial layer 101. 300 nm of the silicon nitride film 103 is deposited by low pressure thermal CVD. 1000 nm of the silicon oxide film 104 is deposited by low pressure thermal CVD. Subsequently, the opening OP (a pattern) for defining the element separation region 106 is formed in the resist 105 by a lithography process. The silicon oxide film 104, the silicon nitride film 103, and the silicon thermal oxide film 102 are etched via the opening OP of the resist 105 by RIE. For example, the width of the element separation region 106 is set to 0.5 μm. The width of the inter-separation region 107 is set to 2 μm. The width of the element separation region 106 corresponds to the width of the opening OP. It is favorable for the sum of the width of the inter-separation region 107 and 2 times the width of the element separation region 106 to be not less than 3 μm. Thereby, secondary photons in the visible region that travel in the lateral direction between cells that are next to each other are sufficiently absorbed by the silicon of the inter-separation region 107.

Figure 37A:
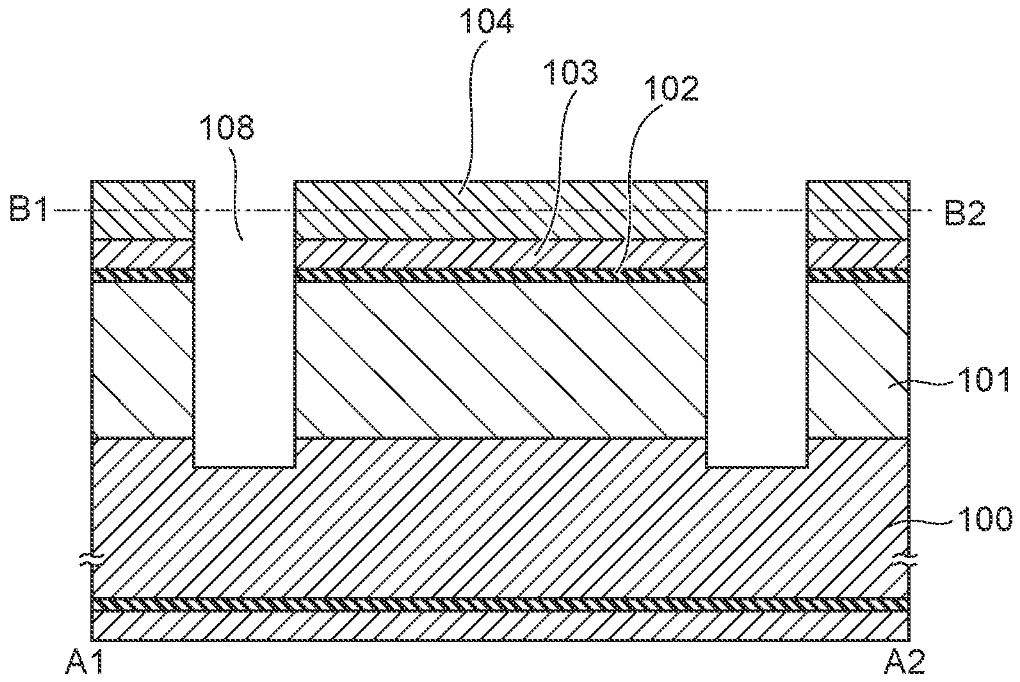
Figure 37B:
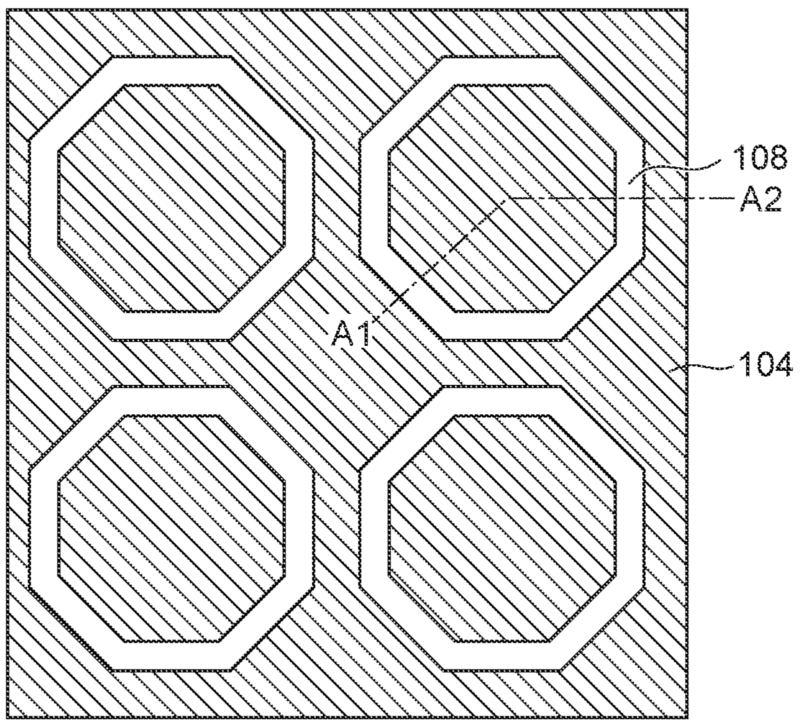

The resist 105 is stripped away as shown in FIGS. 37A and 37B. The p-type silicon epitaxial layer 101 of the element separation region 106 is etched using a thick silicon oxide film 104 as a mask. The trench structure 108 is formed thereby. The etching depth (the depth of the trench structure 108) is determined by the thickness of the p-type silicon epitaxial layer 101 and the diffusion amount of the boron from the p-type silicon substrate 100 into the p-type silicon epitaxial layer 101 in the heating processes among all of the processes. For example, the etching depth is set to 10 μm. At this time, the occurrence of cracks can be suppressed by forming the trench structure 108 so that the shape of the trench structure 108 is a rounded quadrilateral, a polygon with interior angles of not less than 135 degrees, or a circular ring when viewed along the Z-direction. As a result, operation errors that are caused by the occurrence of cracks can be suppressed, and the yield of the light detector 4 can be increased.

Figure 38A:
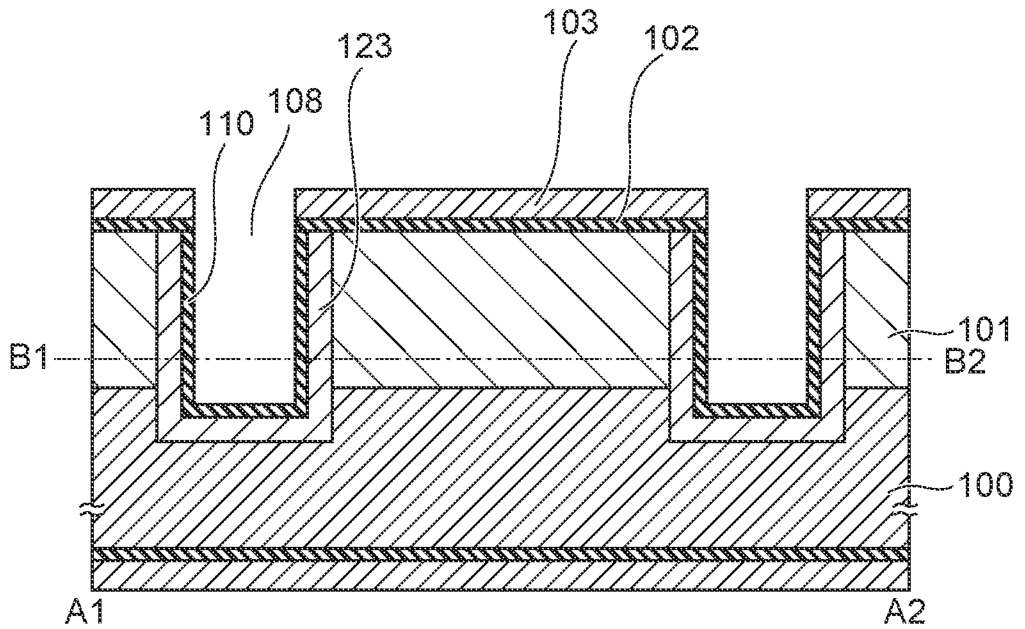
Figure 38B:
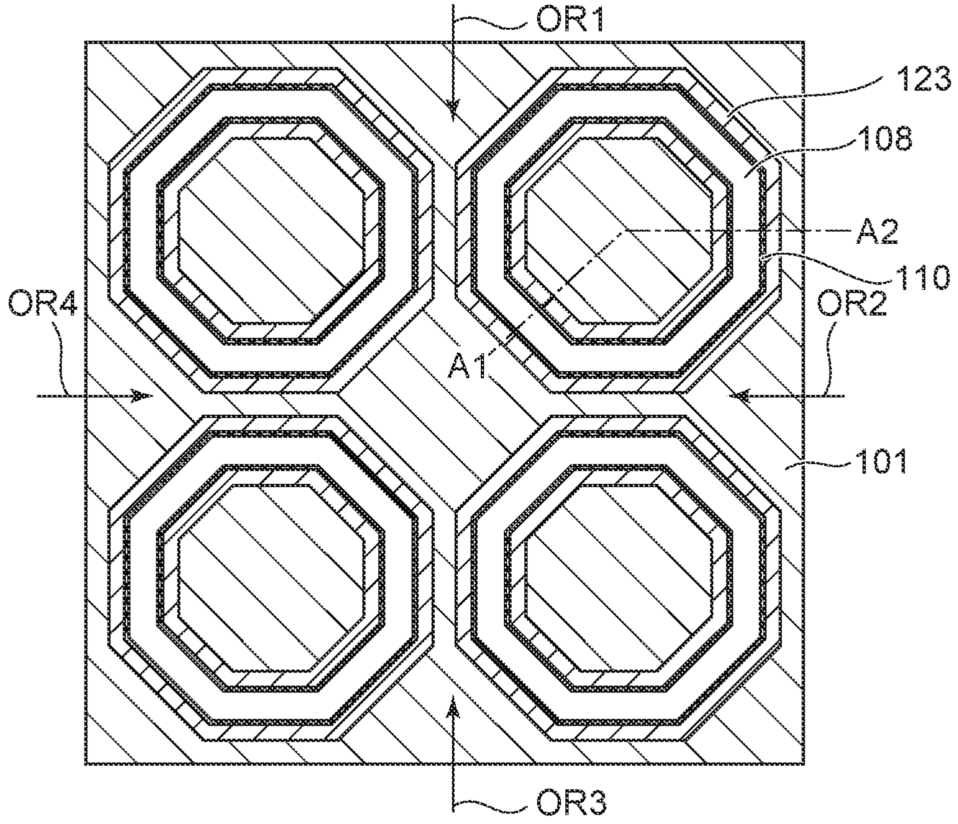

As shown in FIGS. 38A and 38B, the silicon oxide film 110 is formed to have a thickness of 50 nm by oxidizing the surface of the trench structure 108. The p-type avalanche layer 123 is formed in the side surface and the bottom surface of the trench structure 108 by ion implantation. The ions are sequentially implanted along the four orientations OR1 to OR4 that are tilted 3 degrees with respect to the Z-direction. The implantation angle of the ion implantation is appropriately set according to the width and the depth of the trench structure 108 and the depths of the n-type avalanche layer 111 and the p-type avalanche layer 123 that are subsequently formed. For example, the p-type avalanche layer 123 is formed by ion-implanting boron with the conditions of an implantation acceleration voltage of 50 keV and an implantation dose of $1.25\times10^{14}/cm^2$ for each orientation. Subsequently, annealing at 1100° C. for 100 minutes in a nitrogen atmosphere is performed to cause solid-state diffusion into the silicon layer at the periphery of the trench structure 108 of the boron that is implanted into the silicon oxide film 110, and to activate the boron. The silicon oxide film 104 and the silicon oxide film 110 into which boron is implanted are removed by hydrofluoric acid treatment.

Figure 39A:
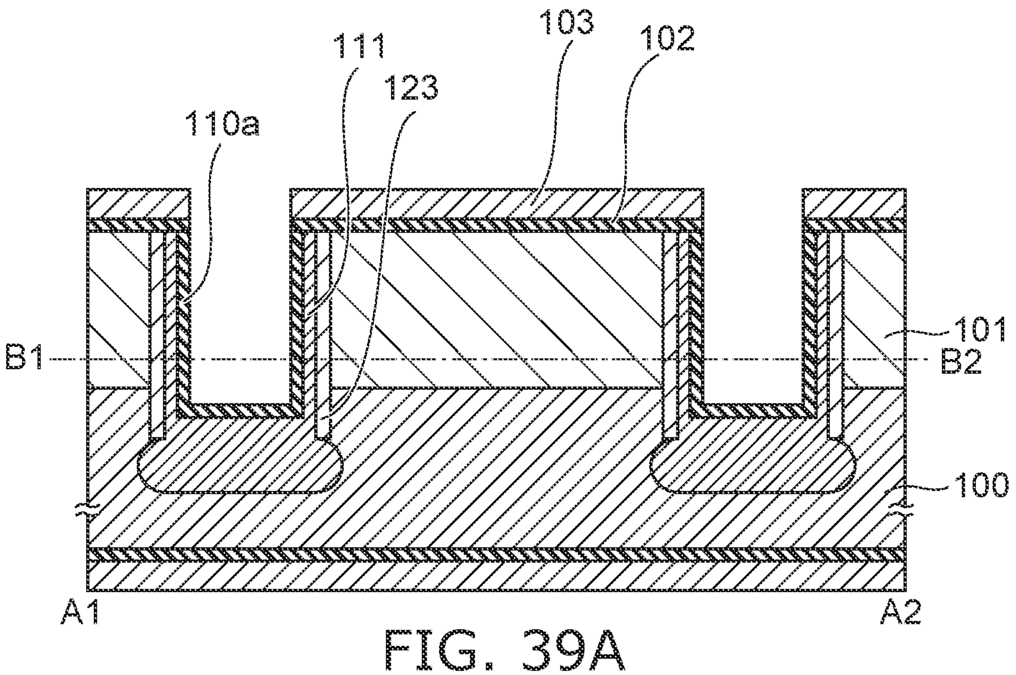
Figure 39B:
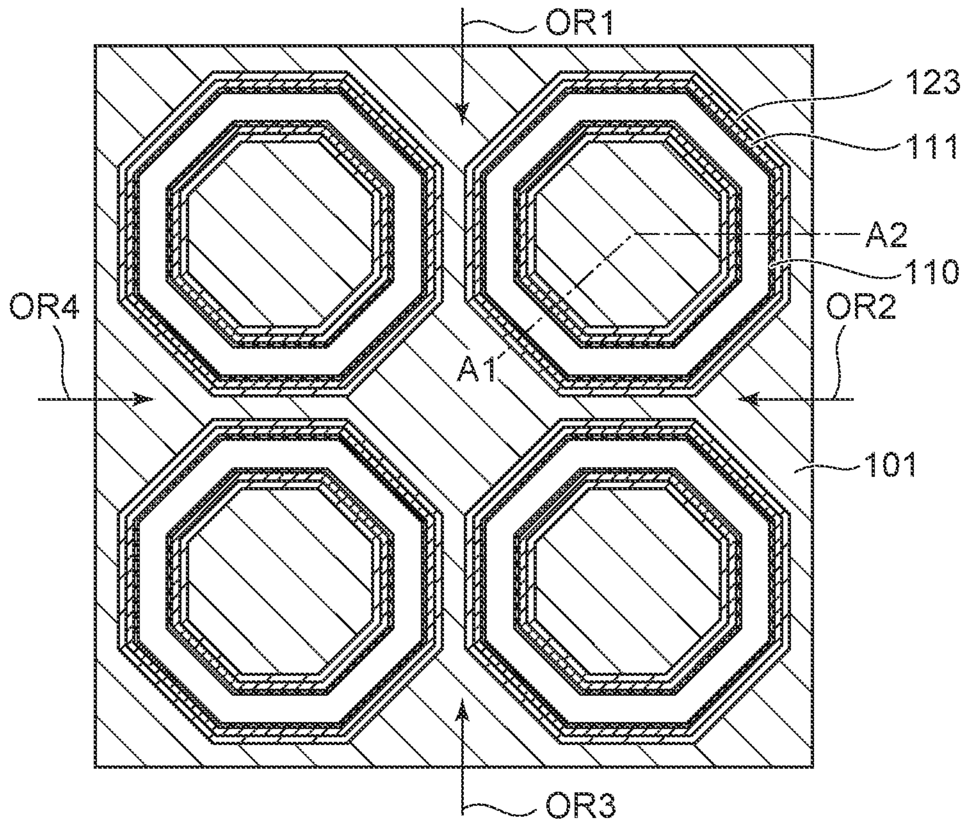

As shown in FIGS. 39A and 39B, a silicon oxide film 110*a* is formed to have a thickness of 50 nm by oxidizing the surface of the trench structure 108. The n-type avalanche layer 111 is formed in the side surface and the bottom surface of the trench structure 108 by ion implantation. The ions are sequentially implanted along the four orientations OR1 to OR4 that are tilted 3 degrees with respect to the Z-direction. The implantation angle of the ion implantation is appropriately set according to the width and the depth of the trench structure 108 and the depths of the n-type avalanche layer 111 and the p-type avalanche layer 123 that are subsequently formed. For example, the n-type avalanche layer 111 is formed by ion-implanting phosphorus with the conditions of an implantation acceleration voltage of 50 keV and an implantation dose of $5.0\times10^{14}/cm^2$ for each orientation. Annealing at 1100° C. for 50 minutes in a nitrogen atmosphere is performed to cause solid-state diffusion into the silicon layer at the periphery of the trench structure 108 of the phosphorus that is implanted into the silicon oxide film 110*a*, and to activate the phosphorus. The dose of the phosphorus for forming the n-type avalanche layer 111 is high compared to the dose of the boron for forming the p-type avalanche layer 123. Therefore, the p-type impurity of a portion of the p-type avalanche layer 123 is canceled by the n-type impurity.

Figure 40A:
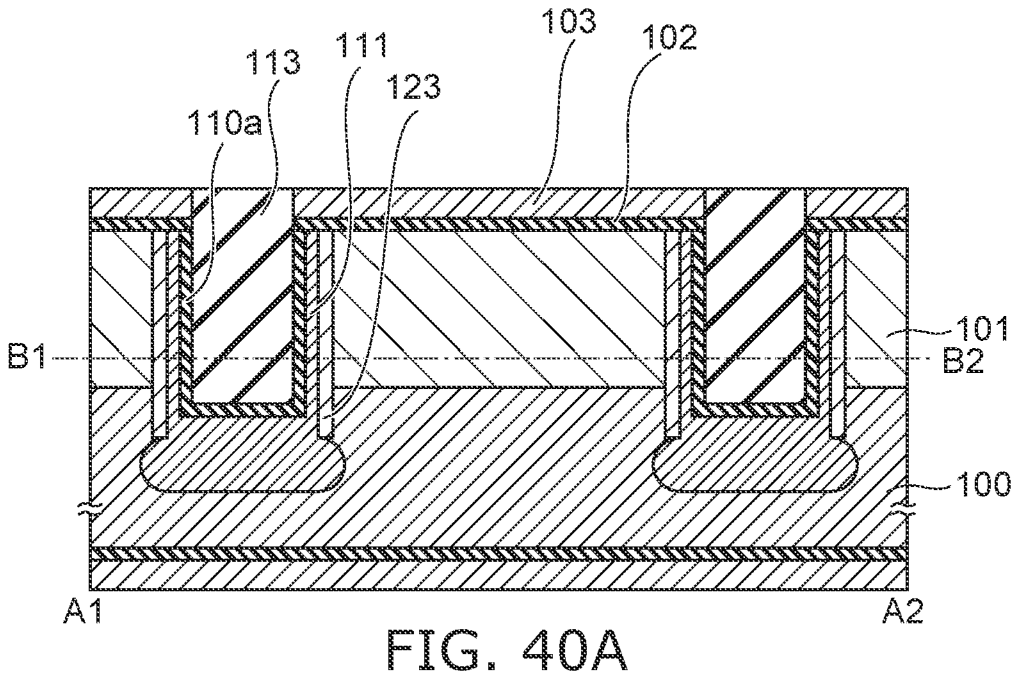
Figure 40B:
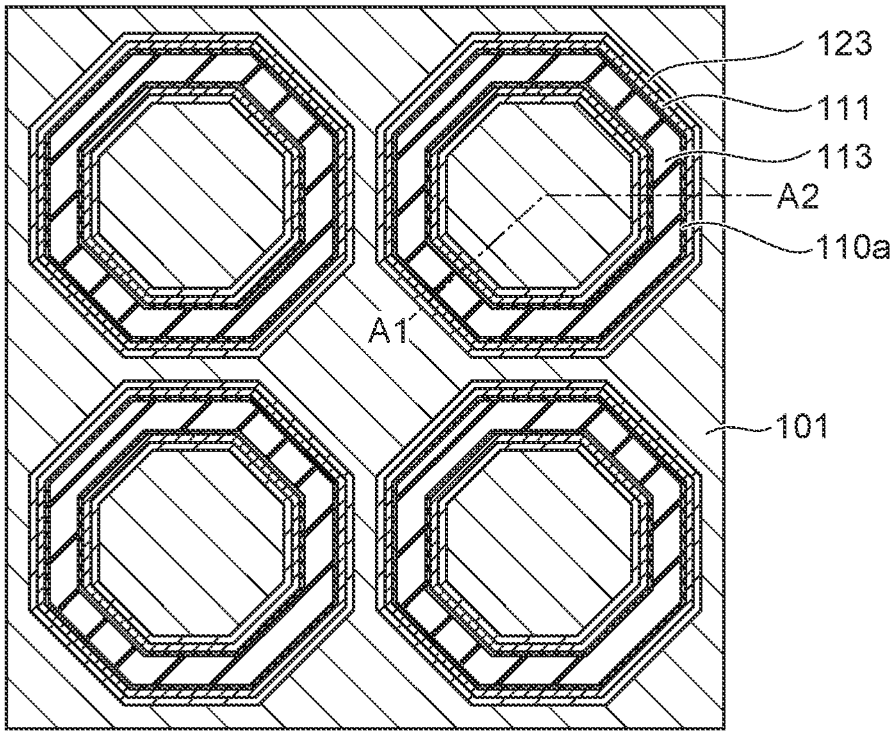

As shown in FIGS. 40A and 40B, the buried oxide film 113 is deposited with a thickness of 1.2 μm by plasma CVD. The film is densified by nitrogen annealing at 1000° C. The buried oxide film 113 is planarized by CMP using the silicon nitride film 103 as a stopper.

Figure 41A:
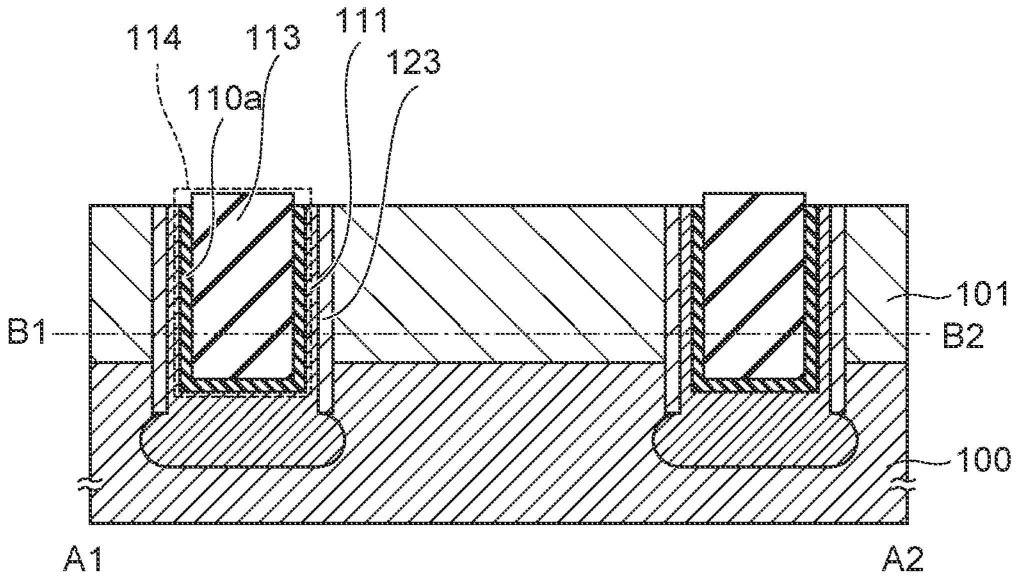
Figure 41B:
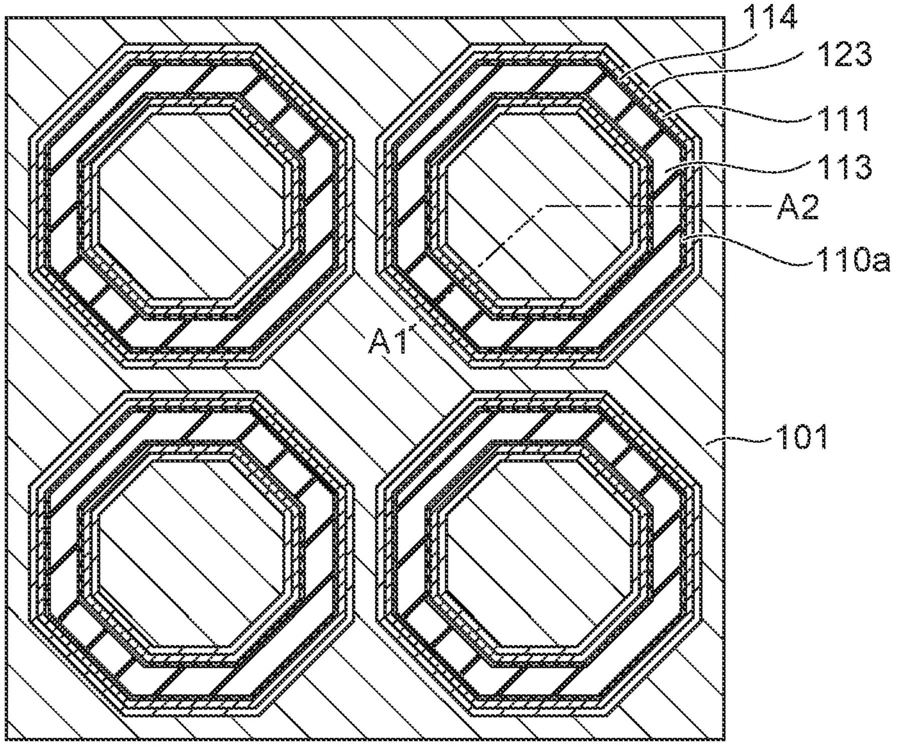

As shown in FIGS. 41A and 41B, the silicon nitride film 103 is stripped away by hot phosphoric acid treatment. The silicon thermal oxide film 102 is stripped away by hydrofluoric acid treatment. The element separation structure 114 that includes the silicon oxide film 110*a* and the buried oxide film 113 remains.

Figure 42A:
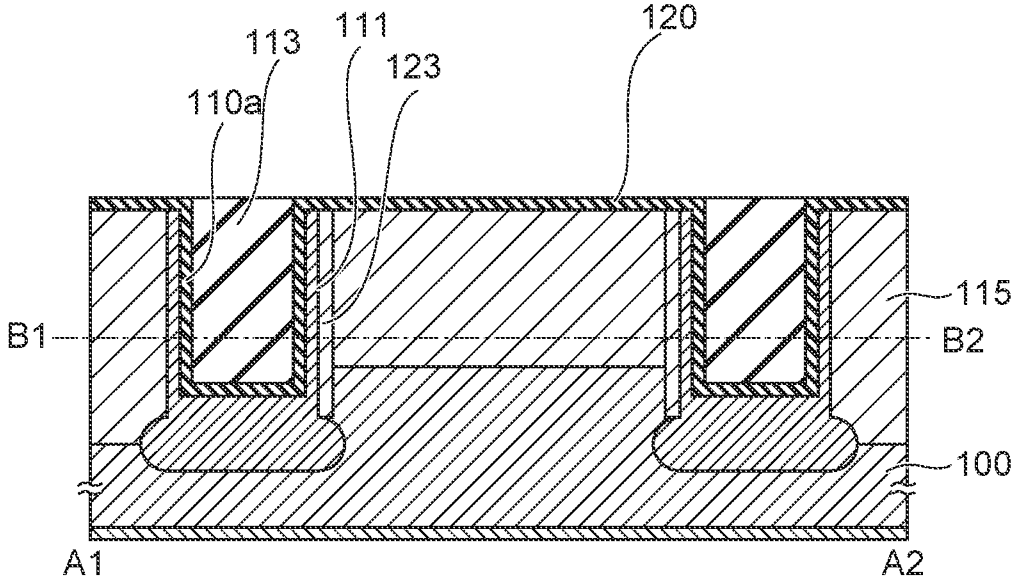
Figure 42B:
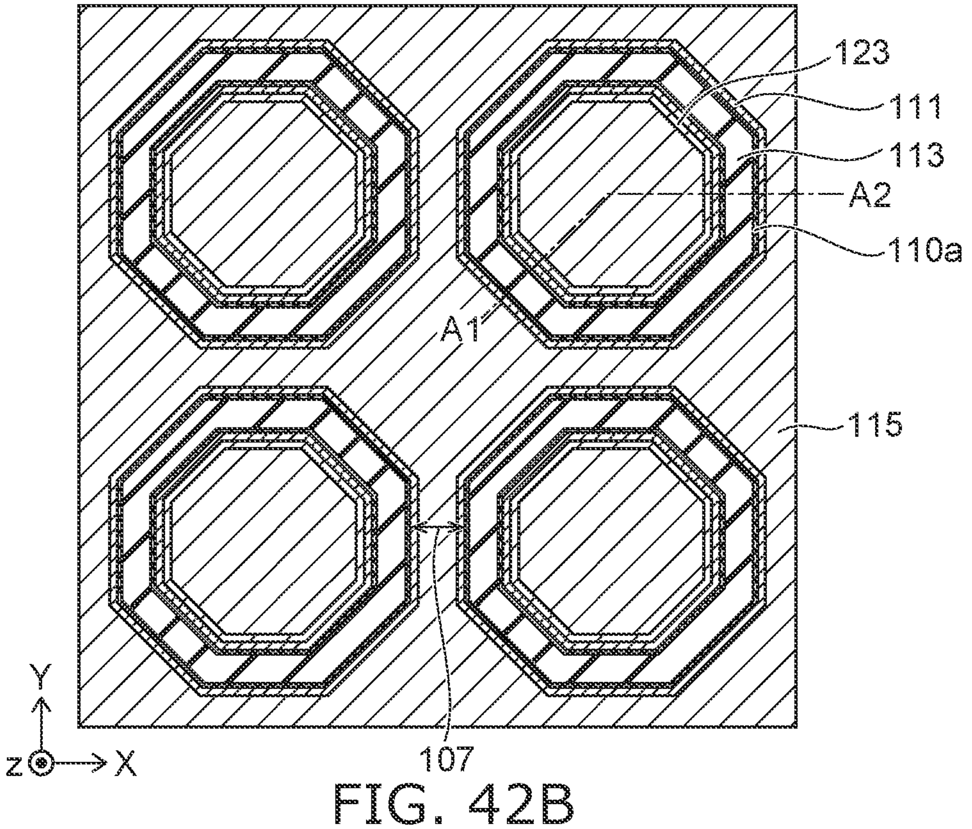

As shown in FIGS. 42A and 42B, the silicon oxide film 120 is formed to have a thickness of 50 nm by oxidizing the surface of the p-type silicon epitaxial layer 101. An n-type cathode diffusion layer 115 is formed in a pattern inside the inter-separation region 107 by a lithography process and an ion implantation process. For example, the n-type cathode diffusion layer 115 is formed by performing ion implantation 2 times. In the ion implantation of the first time, phosphorus is implanted with the conditions of an implantation acceleration voltage of 700 keV and an implantation dose of $3.0\times10^{12}/cm^2$. In the ion implantation of the second time, phosphorus is implanted with the conditions of an implantation acceleration voltage of 3 MeV and an implantation dose of $4.0\times10^{12}/cm^2$. Annealing is performed to activate the n-type cathode diffusion layer 115 and to diffuse the phosphorus in the substrate depth direction. For example, the annealing is performed at 1100° C. for 50 minutes in a nitrogen atmosphere. By forming the n-type cathode diffusion layer 115, the p-type avalanche layer 123 that is formed in the inter-separation region 107 is canceled.

Figure 43A:
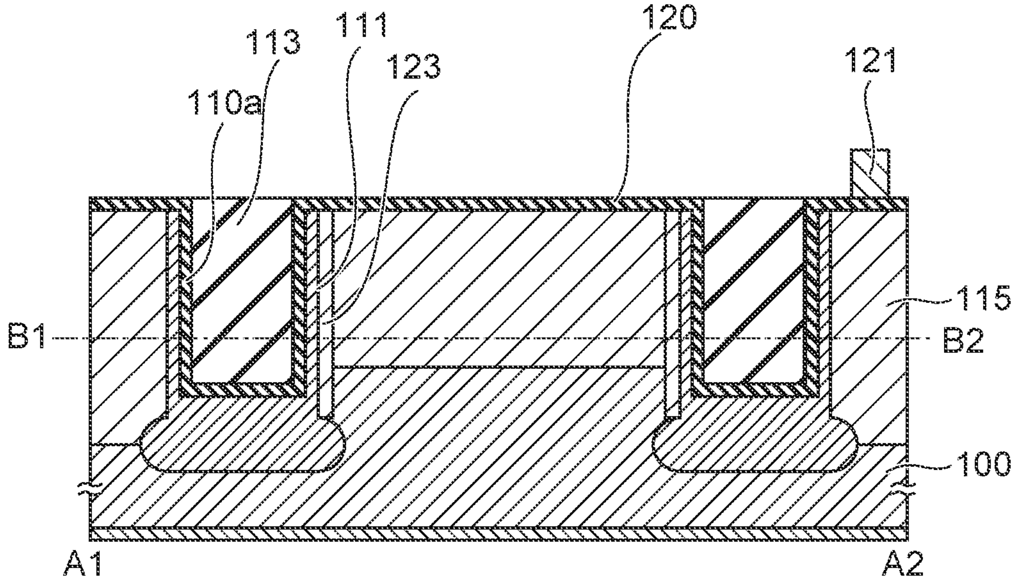
Figure 43B:
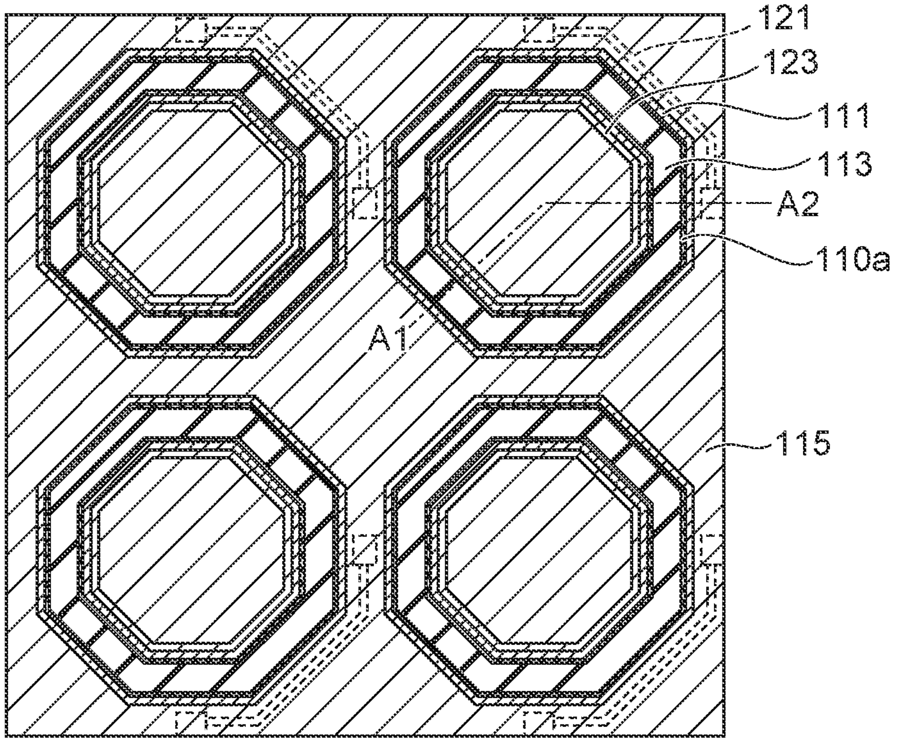

As shown in FIGS. 43A and 43B, a polysilicon film is formed to have a thickness of 0.2 μm by low pressure thermal CVD. The quenching resistance 121 is formed by patterning the polysilicon film into a prescribed shape by a lithography process and an RIE process. For example, to provide the quenching resistance 121 with a prescribed resistance, $1.0\times10^{15}/cm^3$ of the impurity of boron is implanted at 20 keV, and activation anneal is performed.

Figure 44A:
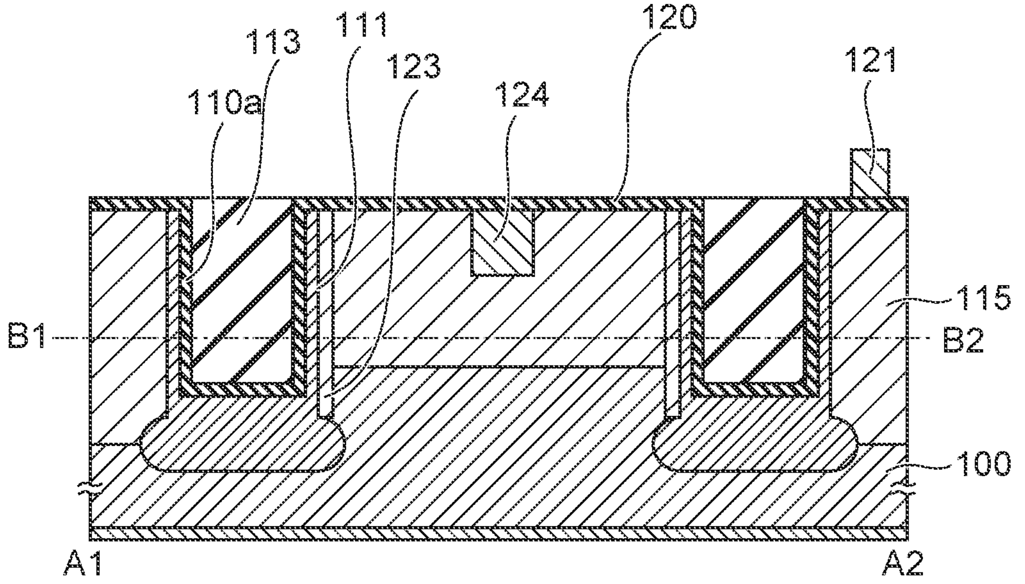
Figure 44B:
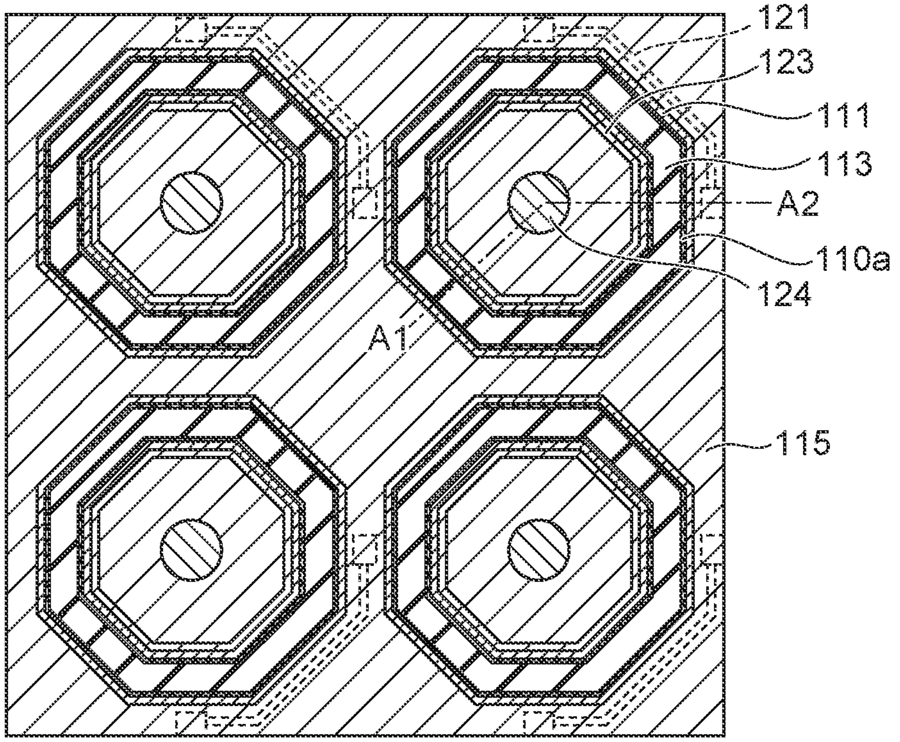

As shown in FIGS. 44A and 44B, the p-type anode electrode 124 is formed in a pattern inside the element region 122 by a lithography process and multiple ion implantation processes. For example, the p-type anode electrode 124 is formed by performing ion implantation 2 times. In the ion implantation of the first time, boron is implanted with the conditions of an implantation acceleration voltage of 50 keV and an implantation dose of $5.0\times10^{14}/cm^2$. In the ion implantation of the second time, boron is implanted with the conditions of an implantation acceleration voltage of 400 keV and an implantation dose of $3.0\times10^{12}/cm^2$.

Figure 45A:
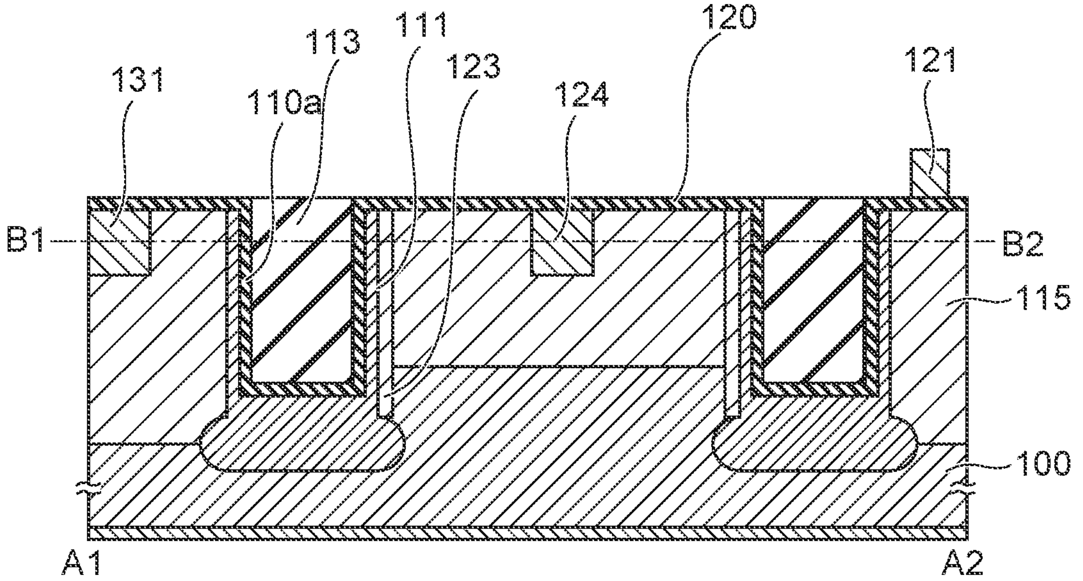
Figure 45B:
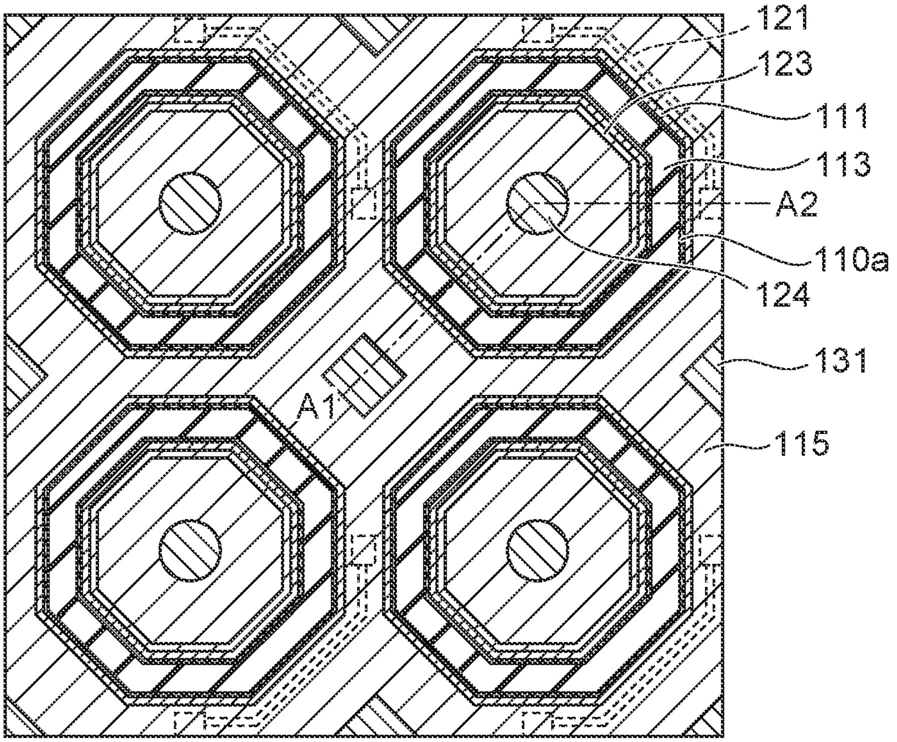

As shown in FIGS. 45A and 45B, the n-type cathode electrode 131 is formed in a pattern inside the n-type cathode diffusion layer 115 by a lithography process and an ion implantation process. For example, the n-type cathode electrode 131 is formed by ion-implanting phosphorus with the conditions of an implantation acceleration voltage of 20 keV and an implantation dose of $1.0\times10^{15}/cm^2$. After the ion implantation, activation anneal of the p-type anode electrode 124 and the n-type cathode electrode 131 is performed.

Figure 46A:
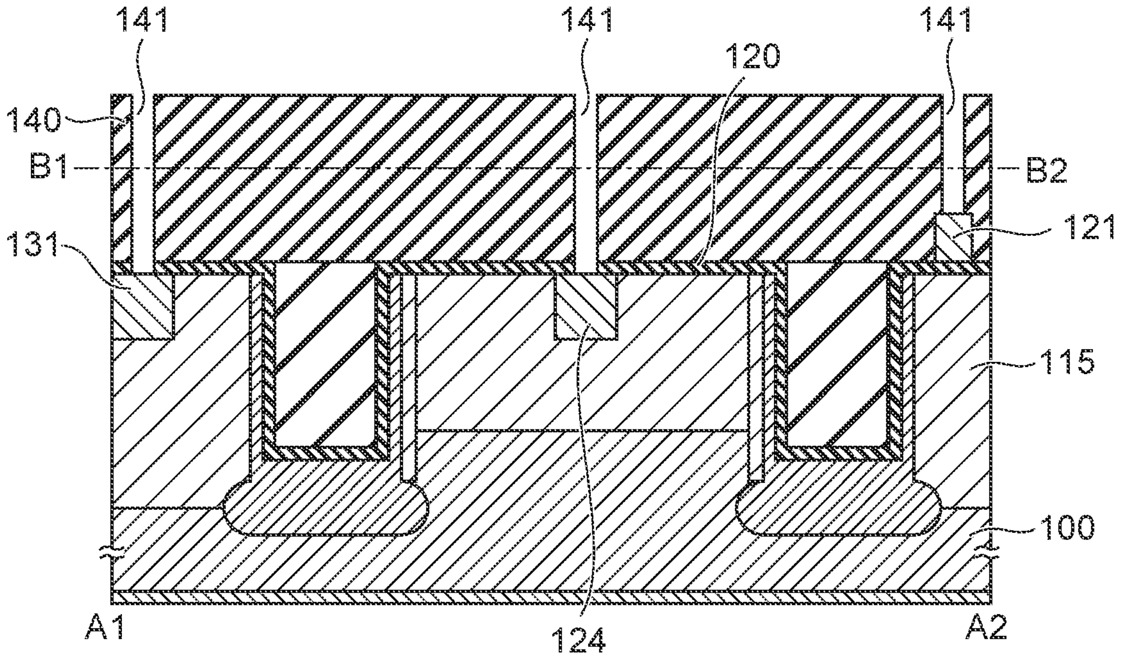
Figure 46B:
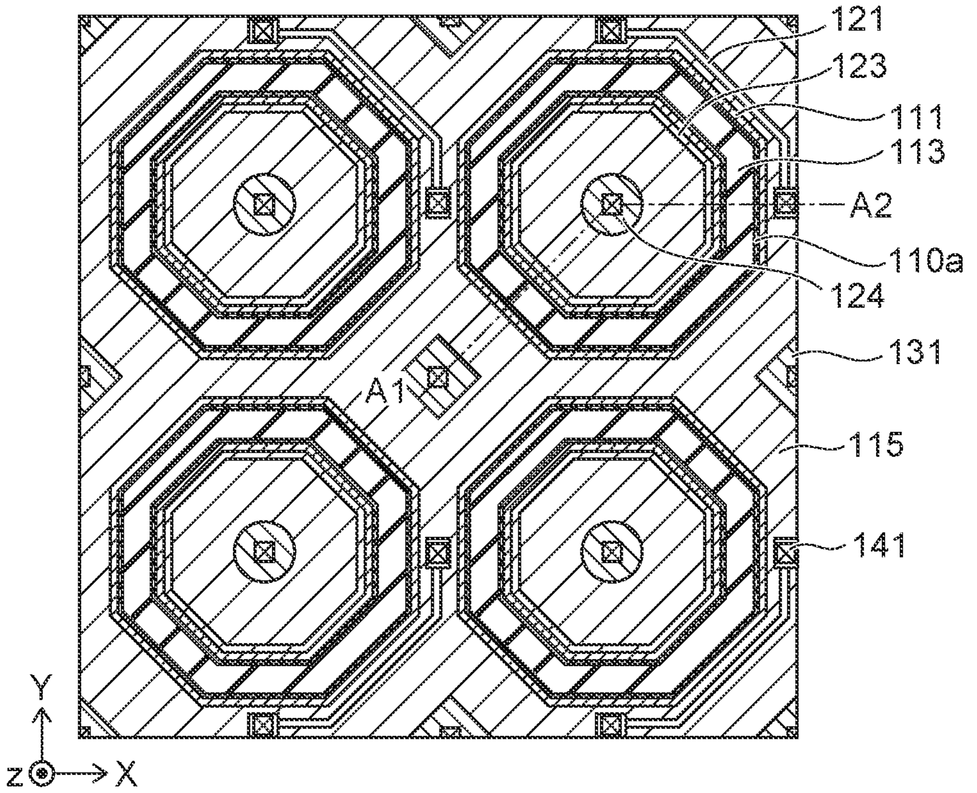

As shown in FIGS. 46A and 46B, the first inter-layer insulating film 140 is formed to have a thickness of 0.5 μm by CVD. The first inter-layer insulating film 140 is planarized by CMP. The contact holes 141 are formed respectively on the quenching resistance 121, the p-type anode electrode 124, and the n-type cathode electrode 131 by a lithography process and an RIE process. The silicon oxide film 120 and the first inter-layer insulating film 140 are not illustrated in the plan view shown in FIG. 46B. This is also similar for the following FIG. 47B as well.

Figure 47A:
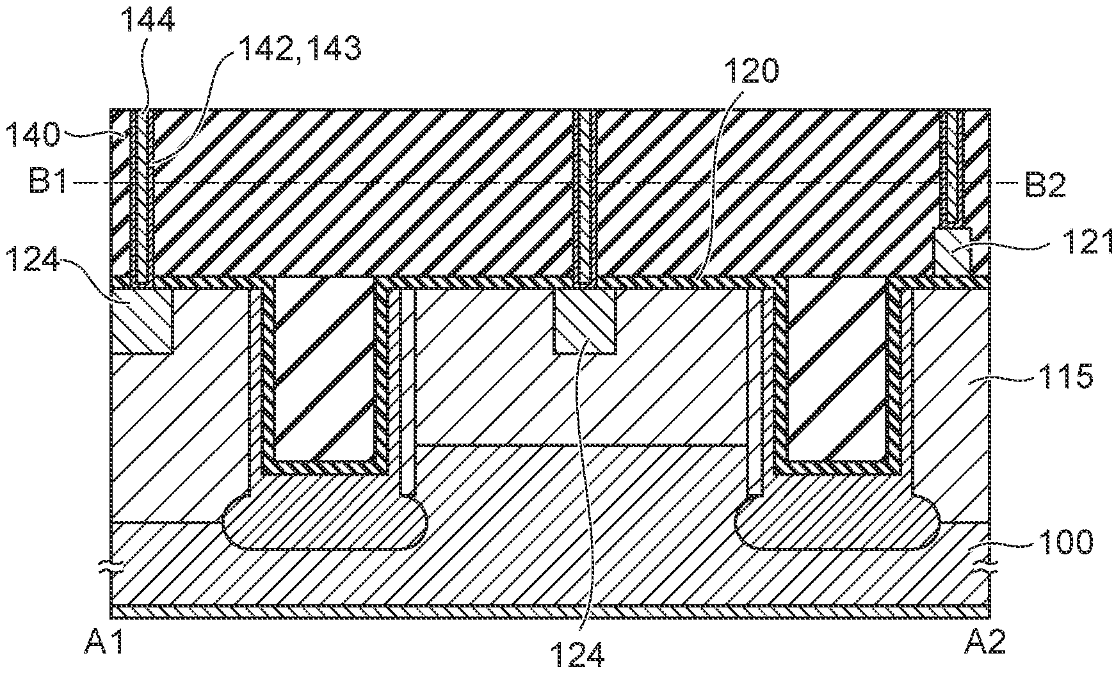
Figure 47B:
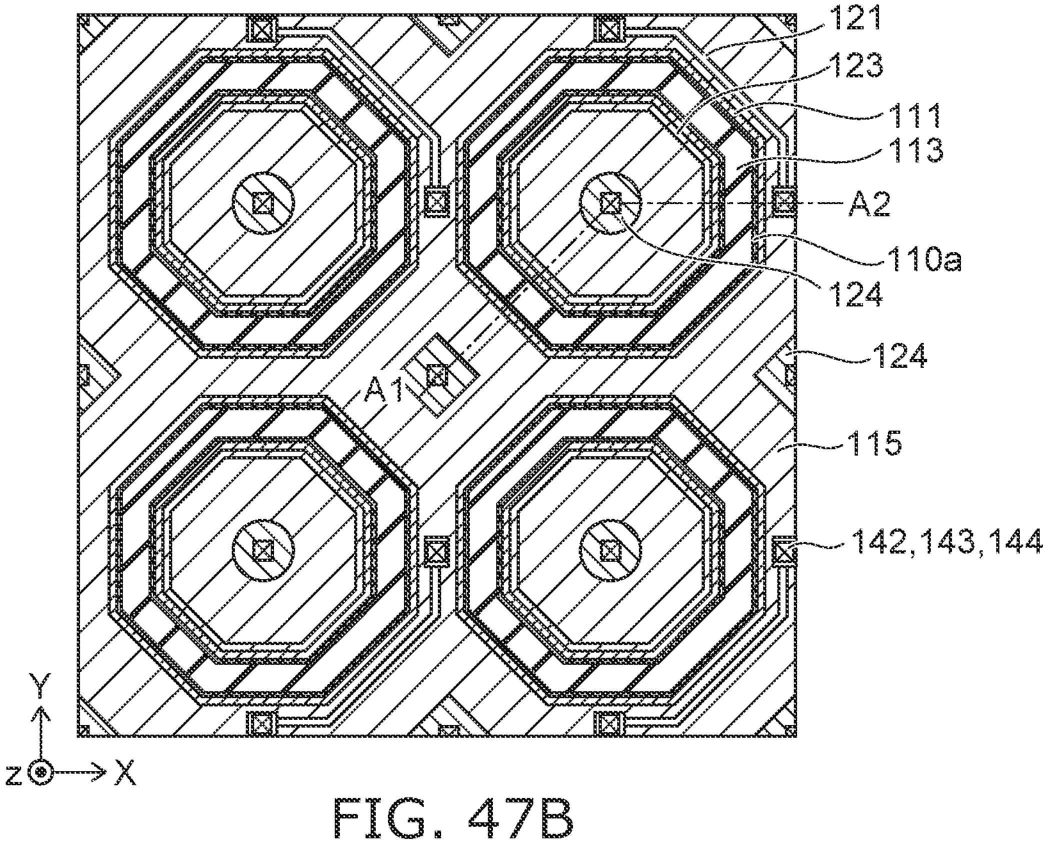

As shown in FIGS. 47A and 47B, 10 nm of the titanium 142 and 10 nm of the titanium nitride 143 are formed by sputtering. 300 nm of the tungsten 144 is formed by CVD. The tungsten 144, the titanium nitride 143, and the titanium 142 are planarized by CMP using the first inter-layer insulating film 140 as a stopper. The contact holes 141 are filled thereby.

Figure 48A:
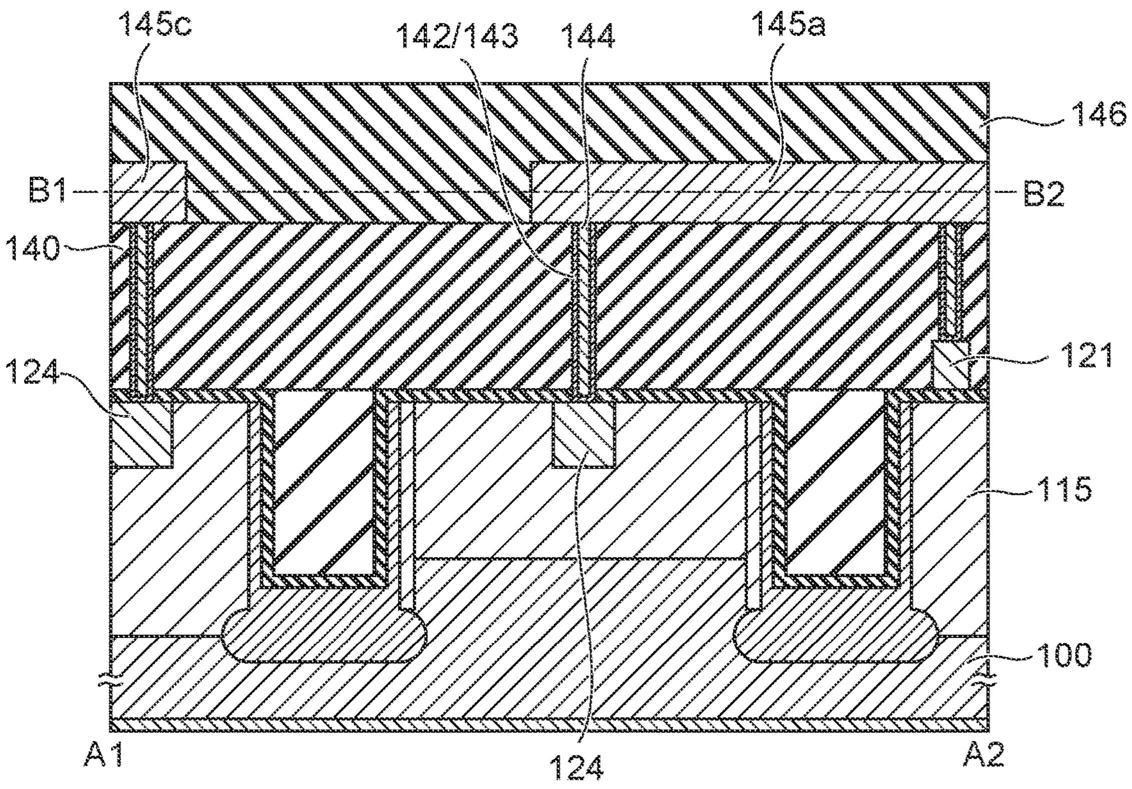
Figure 48B:
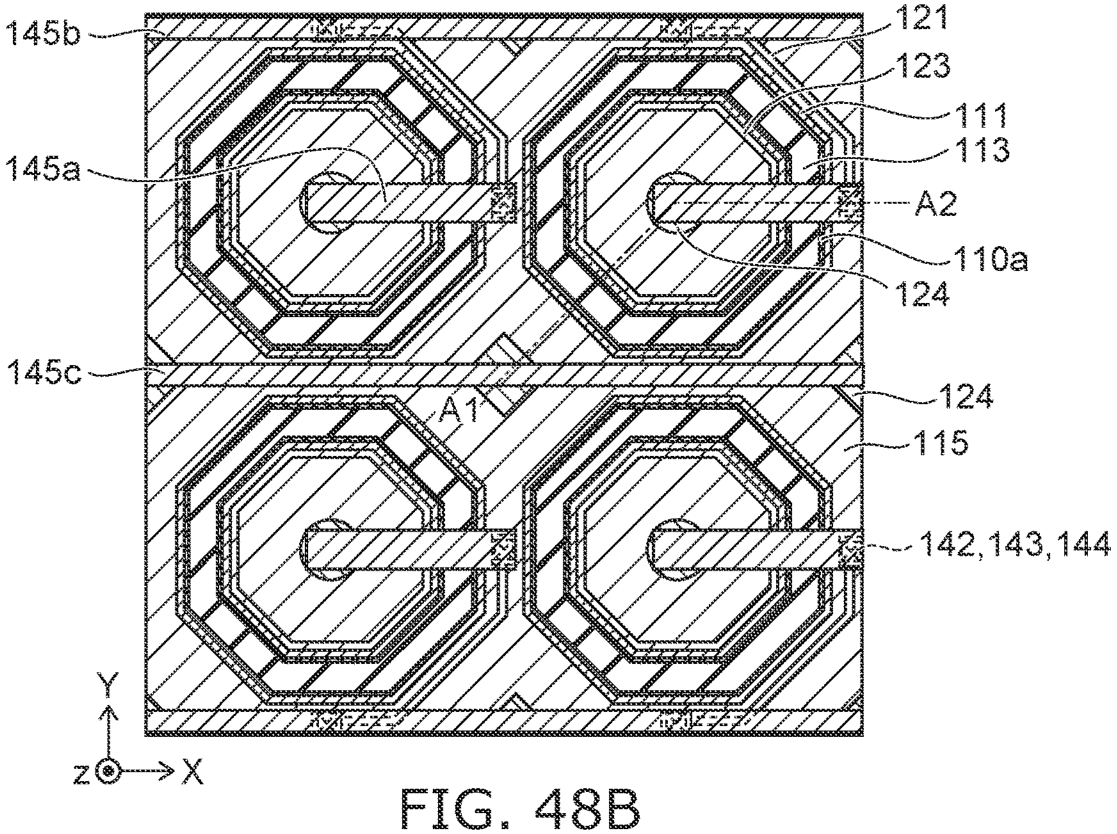

As shown in FIGS. 48A and 48B, a metal film is formed to have a thickness of 0.5 μm by sputtering. The interconnects 145*a*, 145*b*, and 145*c* are formed by patterning the metal film into a prescribed shape by lithography and RIE. The silicon oxide film is formed to have a thickness of 0.8 μm as the second inter-layer insulating film 146 by CVD. The second inter-layer insulating film 146 is planarized by CMP. The silicon oxide film 120, the first inter-layer insulating film 140, and the second inter-layer insulating film 146 are not illustrated in the plan view shown in FIG. 48B. This is similar for the following FIG. 49B as well.

Figure 49A:
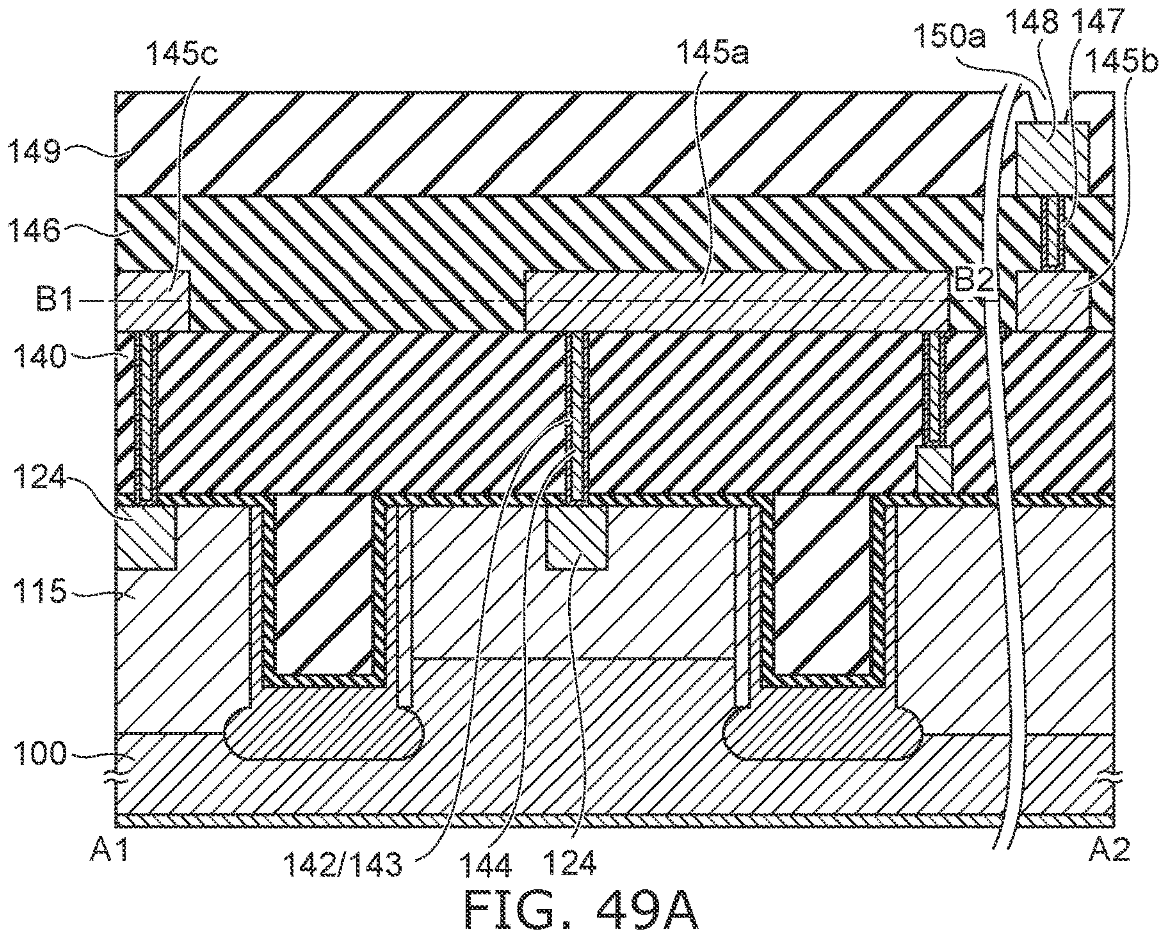
Figure 49B:
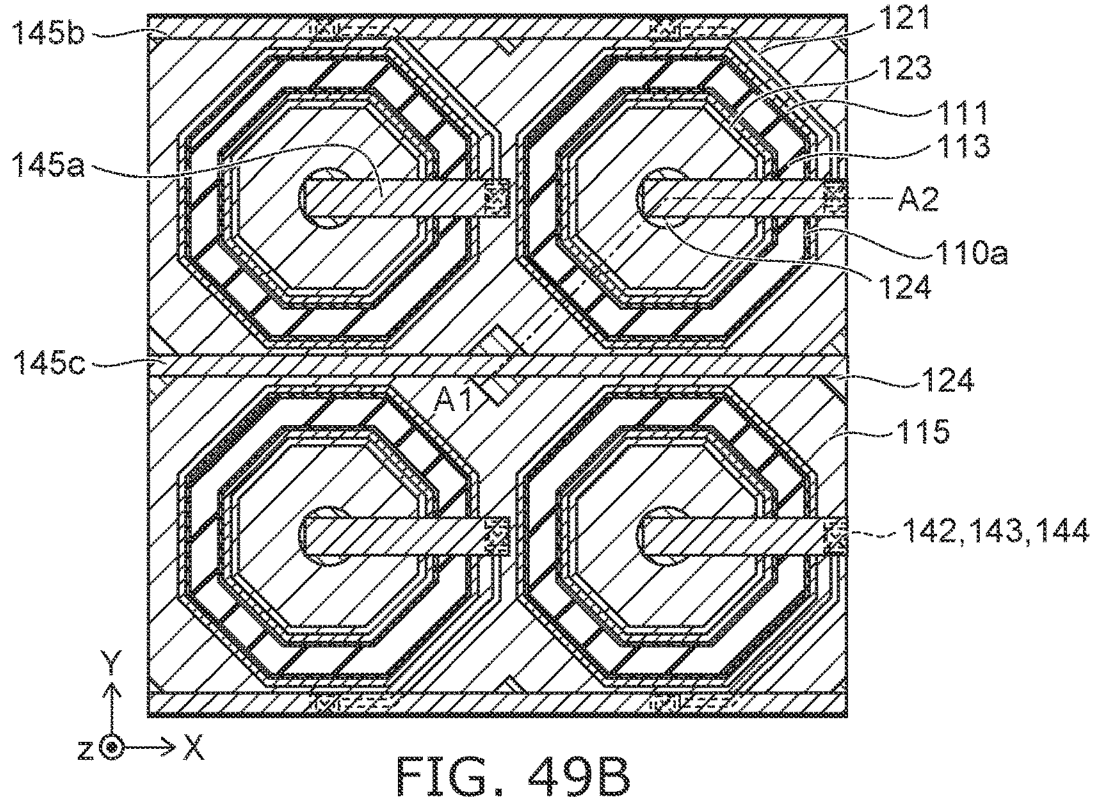
Figure 50:
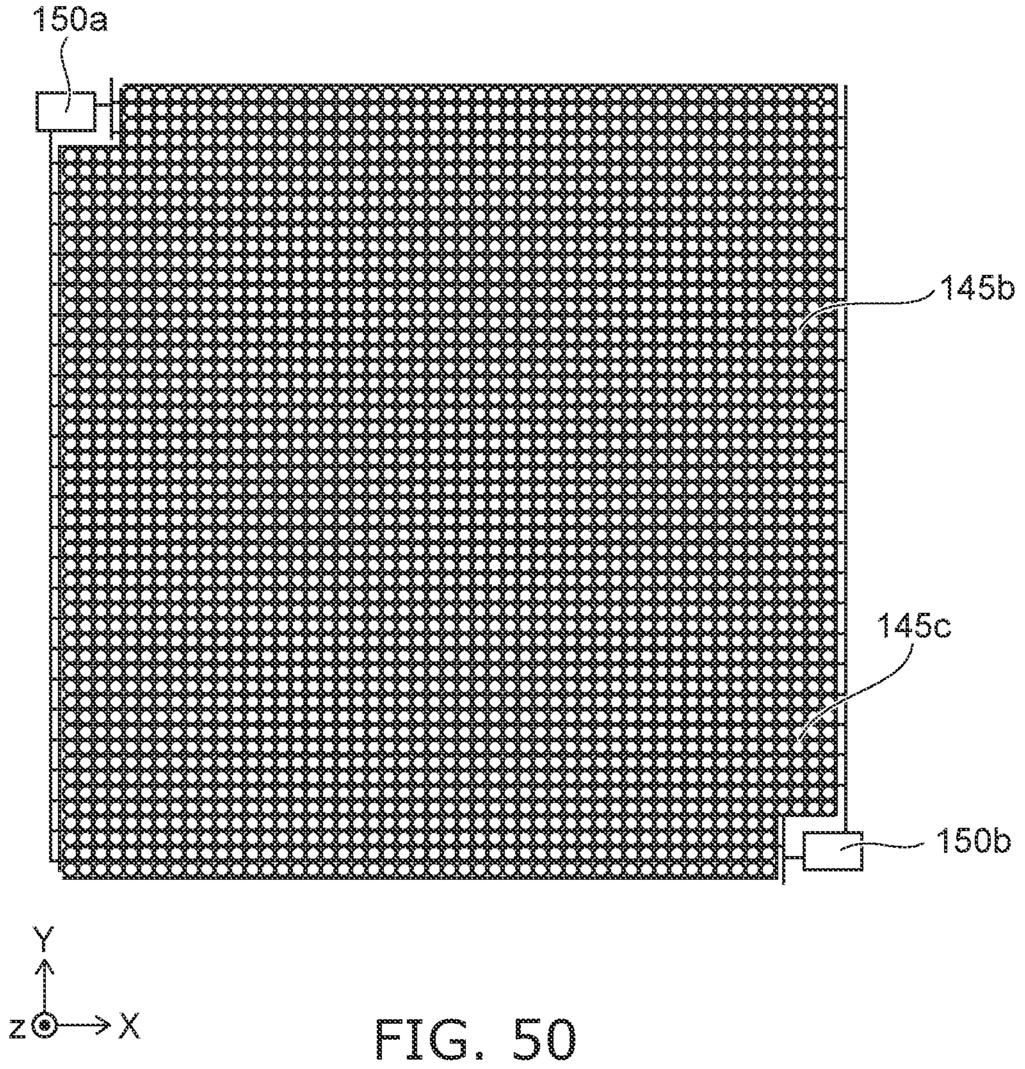

As shown in FIG. 49A, FIG. 49B, and FIG. 50, the via hole 147 is formed on the interconnect 145*b*. The via hole 147 is filled by depositing the titanium, the titanium nitride, and the tungsten. The pad metal interconnect 148 that is used to form the read pad electrode is formed. A silicon nitride film is formed to have a thickness of 0.3 μm as the passivation film 149 by CVD. Openings are formed above the read pad 150*a* (shown in FIG. 50) and the read pad 150*b* by removing portions of the passivation film 149 by RIE. The light detector 4 according to the fourth embodiment is manufactured by the processes described above.

Operations of the light detector 4 will now be described. A positive operating voltage with respect to the pad 61 is applied to the pad 62. The operating voltage is, for example, +60 V to +70 V. When light is incident on the light detector 4, a pulse signal can be read from the pad 61.

Figure 51:
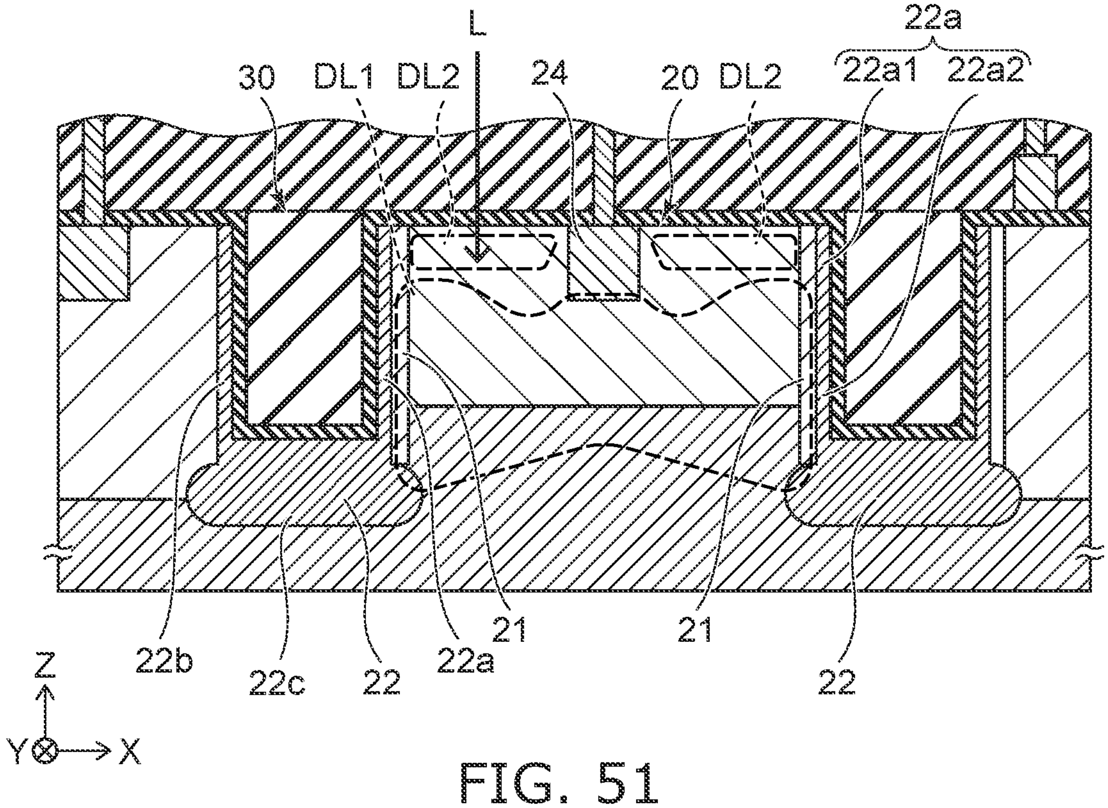
FIGS. 51 and 52 are schematic cross-sectional views showing a portion of the light detector according to the fourth embodiment.
Figure 52:
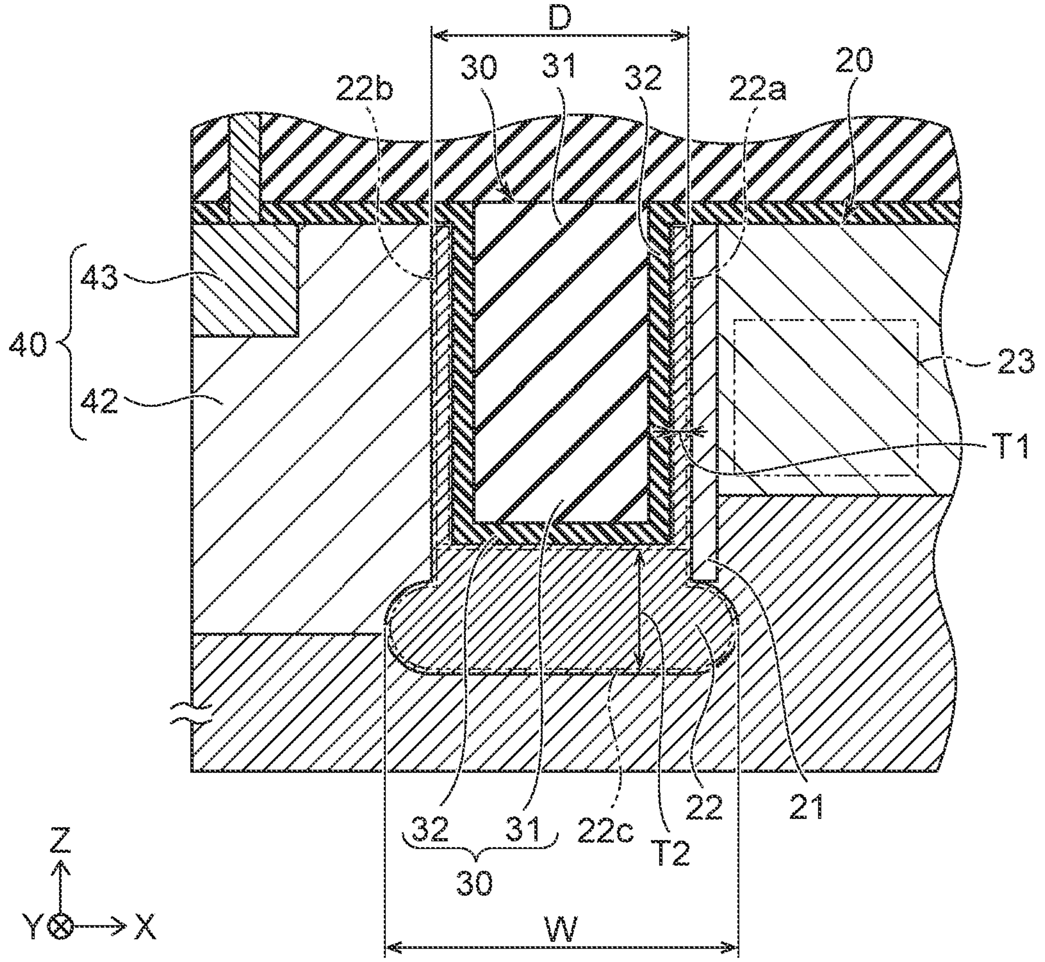

FIGS. 51 and 52 are schematic cross-sectional views showing a portion of the light detector according to the fourth embodiment.

As shown in FIG. 51, photoelectric conversion occurs in the element 20 when light L is incident on the element 20. When operating the light detector 4, the depletion layer DL1 extends from the p-n junction between the p-type semiconductor region 21 and the n-type semiconductor region 22 toward the p-type semiconductor region 23. Due to the depletion layer DL1, holes drift toward the p-type contact region 24, and electrons drift toward the p-n junction.

In the light detector 4, the n-type semiconductor region 22 is located at the periphery of the insulating part 30. Specifically, as shown in FIG. 51, the n-type semiconductor region 22 includes a first portion 22*a*, a second portion 22*b*, and a third portion 22*c*. The first portion 22*a* is positioned between the p-type semiconductor region 21 and the insulating part 30 in the X-Y plane. The second portion 22*b* is positioned between the insulating part 30 and the intermediate part 40 in the X-Y plane. The third portion 22*c* is positioned lower than the insulating part 30.

The first portion 22*a* faces the second portion 22*b* via the insulating part 30 in the X-Y plane. Thereby, compared to the light detector 1, the electric field direction at each point of the element 20 can be closer to being parallel to the X-Y plane. In other words, the depletion layer can spread to be more parallel to the X-Y plane. As a result, the insensitive region in which the light is not detected can be reduced, and the light-receiving sensitivity of the light detector 4 can be increased.

It is favorable for the first portion 22*a* to include a first subregion 22*a*1 and a second subregion 22*a*2. The first subregion 22*a*1 is located on the second subregion 22*a*2 and is positioned at the vicinity of the upper surface of the element 20. The n-type impurity concentration in the first subregion 22*a*1 is less than the n-type impurity concentration in the second subregion 22*a*2. The electric field at the vicinity of the upper surface of the element 20 is relaxed thereby. At the vicinity of the upper surface of the element 20, the carriers do not cause avalanche breakdown to occur, and flow through the n-type semiconductor region 22 as insensitive carriers. Many interface states exist at the upper surface of the element 20. The carriers that are emitted from the interface state become dark noise. The dark noise can be reduced by suppressing the avalanche breakdown at the vicinity of the upper surface of the element 20.

The concentration difference between the first subregion 22*a*1 and the second subregion 22*a*2 is formed by ion-implanting into the wafer W from an oblique direction in the process of forming the n-type avalanche layer 111 shown in FIGS. 39A and 39B. This is because the silicon nitride film 103 and the silicon thermal oxide film 102 act as a mask in the ion implantation and suppress the implantation of the phosphorus into the upper surface portion of the n-type avalanche layer 111.

In the light detector 4, the lower end of the p-type semiconductor region 21 and the lower end of the n-type semiconductor region 22 are positioned lower than the lower end of the insulating part 30. Therefore, compared to the light detector 1, the depletion layer can spread to a deeper region. Thereby, compared to the light detector 1, the light-receiving sensitivity can be increased for light of longer wavelengths (e.g., light in the near-infrared wavelength band having a wavelength of about 1 μm).

In the light detector 4, the p-n junction between the p-type semiconductor region 21 and the n-type semiconductor region 22 is substantially parallel to the Z-direction. The p-n junction extends below the insulating part 30. The depletion layer can spread along the X-Y plane in a wider range in the Z-direction. The light-receiving sensitivity of the light detector 4 can be further increased thereby.

Such a p-n junction surface is realized in the manufacturing processes described above by forming the n-type avalanche layer 111 and the p-type avalanche layer 123 by performing solid-state diffusion from the insulating film at the sidewall of the trench structure 108. By using solid-state diffusion, a semiconductor region that has a more uniform impurity concentration distribution can be formed to a deeper position than by ion implantation.

As shown in FIG. 52, a thickness T2 in the Z-direction of the third portion 22*c* is greater than a thickness T1 in the X-Y plane of the first portion 22*a*. The thickness T1 corresponds to the distance in the X-Y plane between the p-type semiconductor region 21 and the insulating part 30. The thickness T2 corresponds to the distance in the Z-direction between the p-type semiconductor layer 11 and the insulating part 30.

When the thickness T2 is greater than the thickness T1, the electrical resistance of the third portion 22*c* can be reduced. Thereby, the potential of the first portion 22*a* that is separated from the intermediate part 40 can be more stable. The fluctuation of the potential of the first portion 22*a* can be small even when a current flows in the n-type semiconductor region 22. Thereby, the operation of the light detector 4 can be more stable.

A width W of at least a portion of the third portion 22*c* is greater than a distance D in the X-Y plane between the p-type semiconductor region 21 and the intermediate part 40. When the width W is greater than the distance D, the electrical resistance of the third portion 22*c* can be reduced. As a result, the operation of the light detector 4 can be more stable.

The p-type impurity concentration in the third portion 22*c* may be greater than the p-type impurity concentration in the first portion 22*a* and may be greater than the p-type impurity concentration in the second portion 22*b*. The electrical resistance of the third portion 22*c* can be reduced thereby, and the operation of the light detector 4 can be more stable.

In the light detector 4, the p-type impurity concentration in the p-type semiconductor layer 11 is less than the p-type impurity concentration in the p-type semiconductor region 21 and less than the p-type impurity concentration in the p-type semiconductor region 23. Therefore, the occurrence of avalanche breakdown can be suppressed between the p-type semiconductor layer 11 and the n-type semiconductor region 22 below the insulating part 30, at the outer perimeter of the insulating part 30, etc.

In particular, when the n-type impurity concentration in the third portion 22*c* is greater than the n-type impurity concentrations in the first and second portions 22*a* and 22*b*, the electric field intensity between the p-type semiconductor layer 11 and the third portion 22*c* increases. In such a case as well, the occurrence of avalanche breakdown between the p-type semiconductor layer 11 and the n-type semiconductor region 22 can be suppressed by reducing the p-type impurity concentration in the p-type semiconductor layer 11.

When avalanche breakdown occurs between the p-type semiconductor layer 11 and the n-type semiconductor region 22, the secondary photons generated at that time travel toward the adjacent element 20 without passing through the insulating part 30. This causes crosstalk noise. Therefore, it is preferable that the occurrence of avalanche breakdown between the p-type semiconductor layer 11 and the n-type semiconductor region 22 is suppressed.

FIFTH EMBODIMENT

Figure 53:
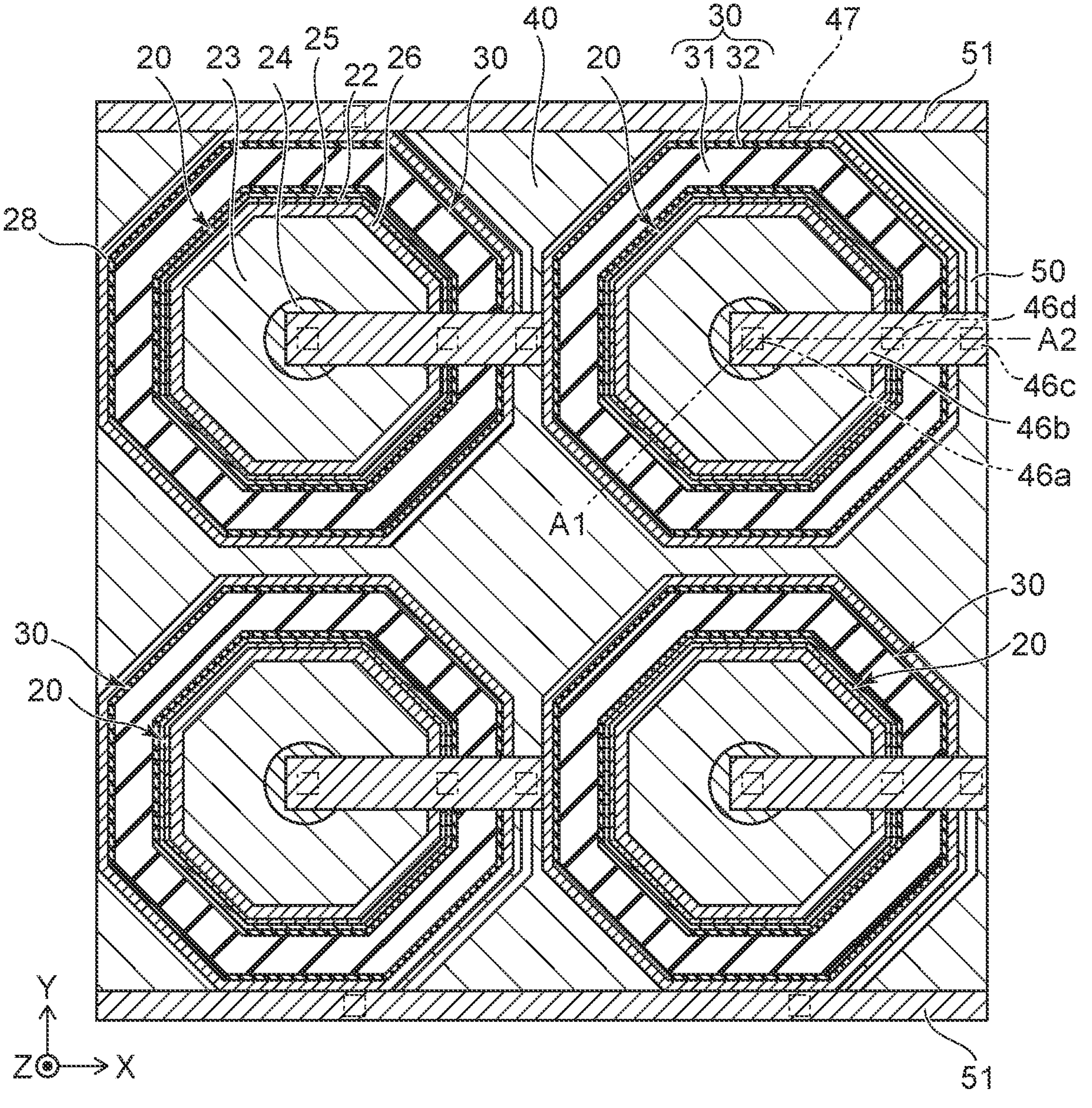
FIG. 53 is a schematic plan view showing a portion of a light detector according to a fifth embodiment.
Figure 54:
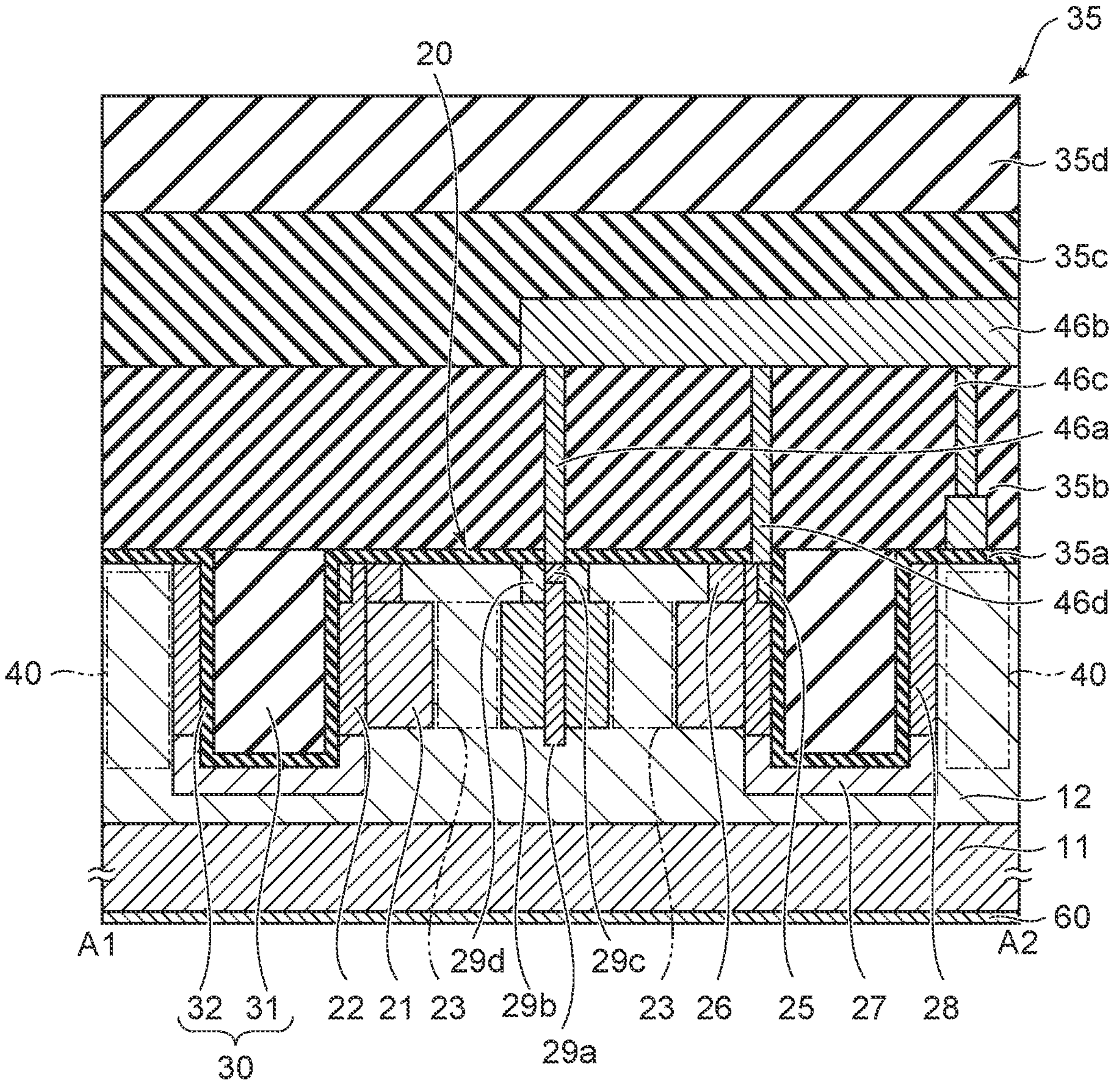
FIG. 54 is an A1-A2 cross-sectional view of FIG. 53.

FIG. 53 is a schematic plan view showing a portion of a light detector according to a fifth embodiment. FIG. 54 is an A1-A2 cross-sectional view of FIG. 53.

Compared to the light detector 1, the structure of the element 20 of the light detector 5 according to the fifth embodiment is different. Instead of the p-type contact region 24, the element 20 includes an n-type semiconductor region 29*a*, a p-type semiconductor region 29*b*, an n-type semiconductor region 29*c*, and an n-type semiconductor region 29*d*.

The p-type semiconductor region 29*b* is located around the n-type semiconductor region 29*a* in the X-Y plane. The n-type semiconductor region 29*c* is located on the n-type semiconductor region 29*a*. The n-type impurity concentration in the n-type semiconductor region 29*c* is greater than the n-type impurity concentration in the n-type semiconductor region 29*a*. The n-type semiconductor region 29*d* is located around the n-type semiconductor region 29*c* in the X-Y plane. The n-type impurity concentration in the n-type semiconductor region 29*d* is less than the n-type impurity concentration in the n-type semiconductor region 29*c*. For example, the n-type semiconductor region 29*c* contacts the n-type semiconductor regions 29*a* and 29*d*. The p-type semiconductor region 29*b* and the n-type semiconductor region 29*d* are separated from the p-type semiconductor region 21 and the n-type guard ring region 26.

The n-type semiconductor region 29*c* is electrically connected with the interconnect 46*b* via the plug 46*a*. The n-type contact region 25 is electrically connected with the interconnect 46*b* via a plug 46*d*. The interconnect 46*b* is electrically connected with the first interconnect 51 via the quenching part 50. In other words, both the n-type semiconductor regions 22 and 29*a* are electrically connected with the first interconnect 51 and are set to substantially the same potential.

The light detector 5 further includes the electrode 60 that is located under the p-type semiconductor layer 11. The p-type semiconductor region 21 and the p-type semiconductor region 29*b* are electrically connected with the electrode 60 via the p-type semiconductor region 23, the n-type semiconductor layer 12, and the p-type semiconductor layer 11.

FIGS. 55A to 57B are schematic views showing manufacturing processes of the light detector according to the fifth embodiment. FIGS. 55B to 57B are respectively B1-B2 cross-sectional views of FIGS. 55A to 57A. FIGS. 55A to 57A are respectively A1-A2 cross-sectional views of FIGS. 55B to 57B.

An example of a favorable method for manufacturing the light detector 5 according to the fifth embodiment will now be described with reference to FIGS. 55A to 57B.

First, the trench structure 108, the n-type avalanche layer 111, the buried oxide film 113, etc., are formed by performing processes similar to the processes shown in FIGS. 4A to 10B.

Figure 55A:
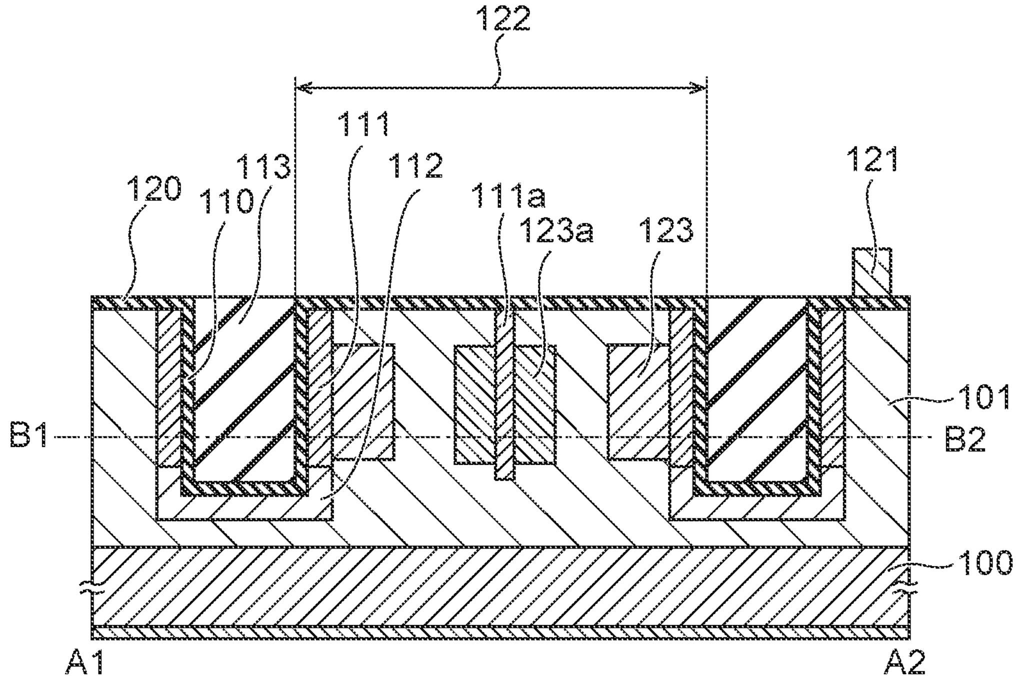
FIGS. 55A to 57B are schematic views showing manufacturing processes of the light detector according to the fifth embodiment.
Figure 55B:
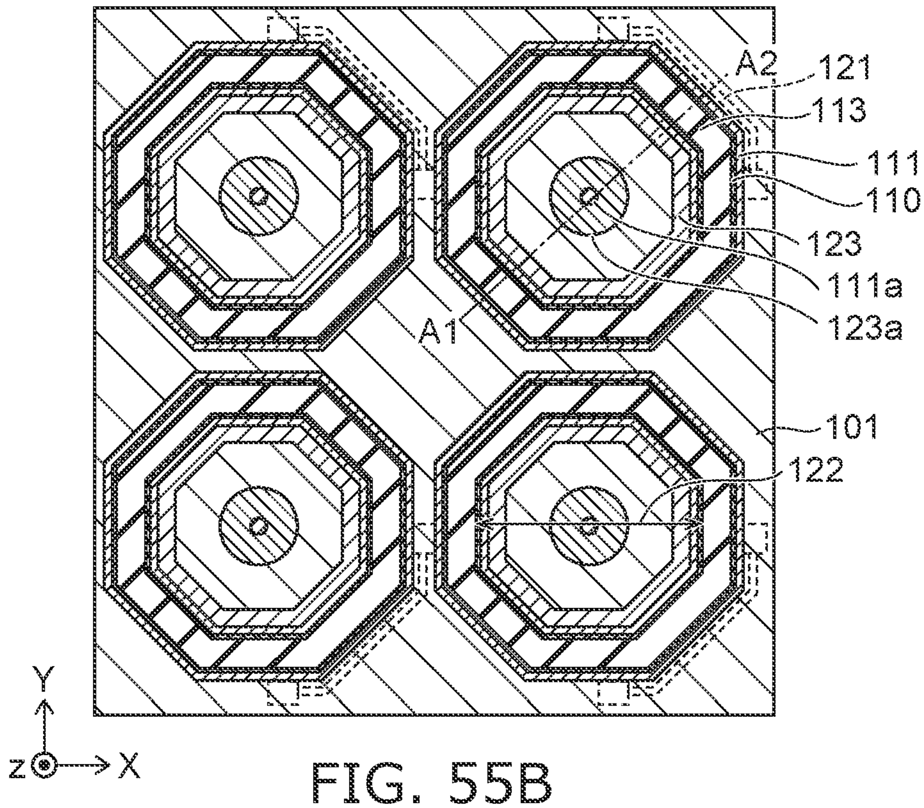

As shown in FIGS. 55A and 55B, the p-type avalanche layer 123 and a p-type avalanche layer 123*a* are formed in a pattern inside the element region 122 by a lithography process and an ion implantation process. For example, the p-type avalanche layers 123 and 123*a* are formed by ion-implanting boron with the conditions of an implantation acceleration voltage of 1 MeV and an implantation dose of $3.0\times10^{12}/cm^2$. An n-type avalanche layer 111*a* is formed in a pattern inside the element region 122 by a lithography process and an ion implantation process. For example, the n-type avalanche layer 111*a* is formed by performing ion implantation 2 times. In the ion implantation of the first time, phosphorus is implanted with the conditions of an implantation acceleration voltage of 700 keV and an implantation dose of $3.0\times10^{12}/cm^2$. In the ion implantation of the second time, phosphorus is implanted with the conditions of an implantation acceleration voltage of 3 MeV and an implantation dose of $1.0\times10^{12}/cm^2$.

Figure 56A:
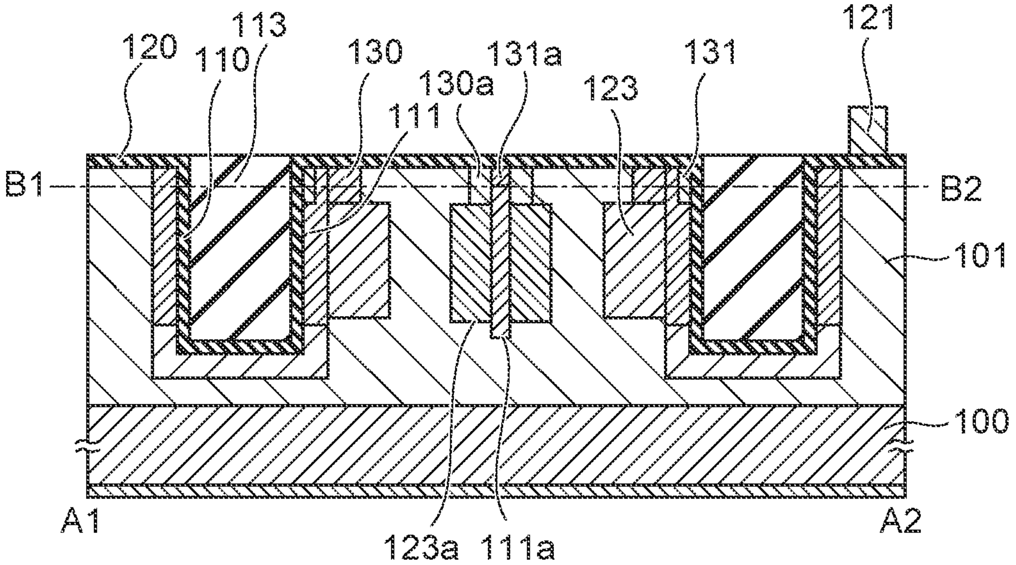
Figure 56B:
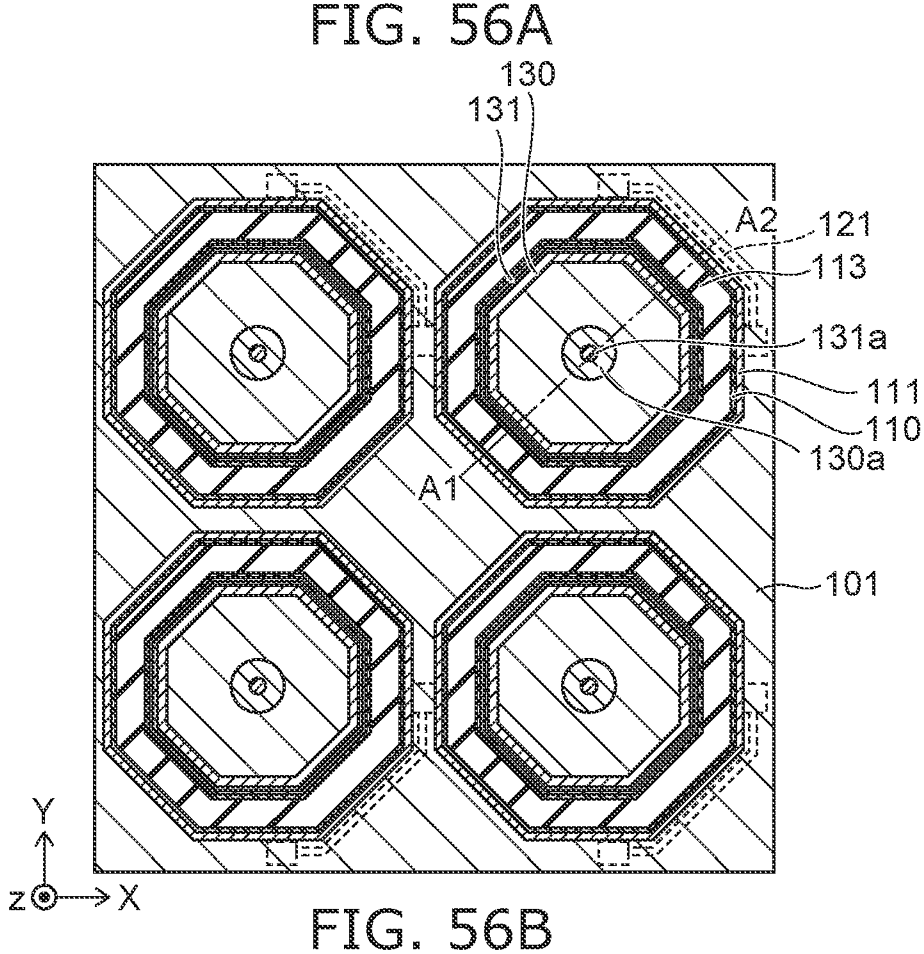

The n-type guard ring layer 130, an n-type guard ring layer 130*a*, the n-type cathode electrode 131, and an n-type cathode electrode 131*a* are formed as shown in FIGS. 56A and 56B. The n-type guard ring layer 130*a* and the n-type cathode electrode 131*a* can be formed simultaneously with the n-type guard ring layer 130 and the n-type cathode electrode 131 by modifying the opening pattern of the mask in the process for forming the n-type guard ring layer 130 and the n-type cathode electrode 131 shown in FIGS. 13A and 13B.

Figure 57A:
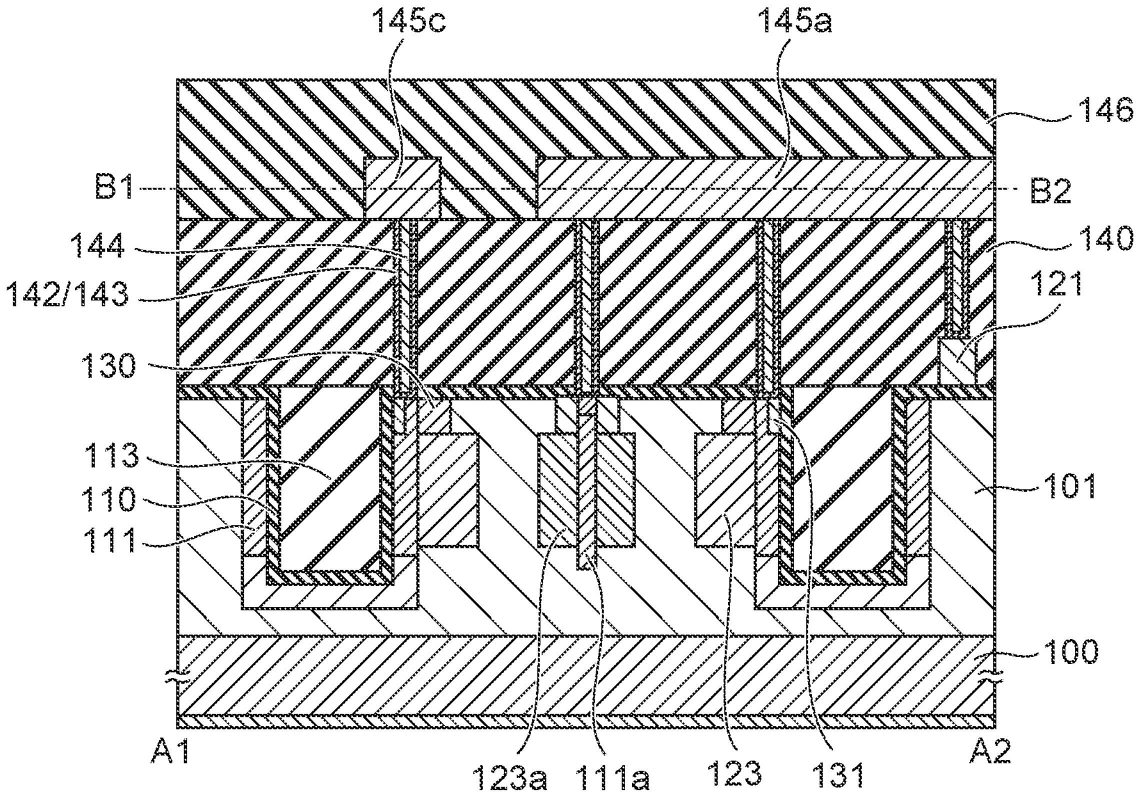
Figure 57B:
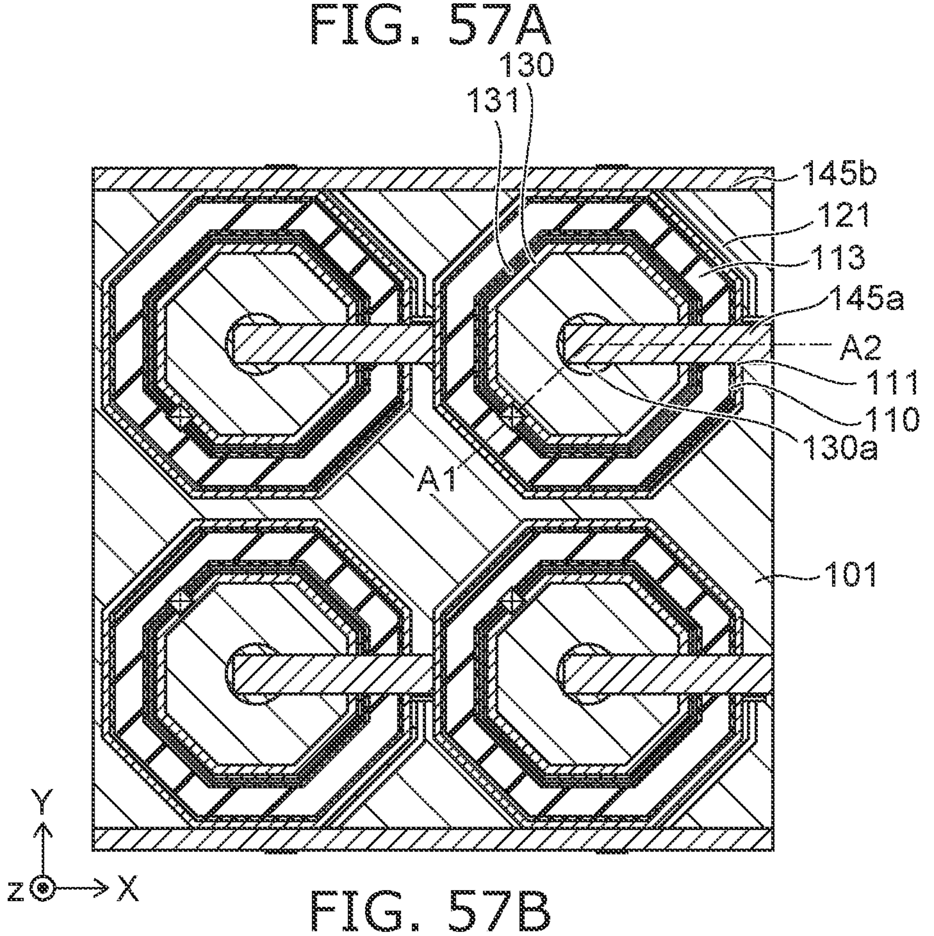

As shown in FIGS. 57A and 57B, the interconnects 145*a* and 145*b*, read pads (not illustrated), etc., are formed by performing processes similar to the processes shown in FIGS. 14A to 18. A back electrode 151 is formed under the p-type silicon substrate 100. The light detector 4 according to the fifth embodiment is manufactured by the processes described above.

Figure 58:
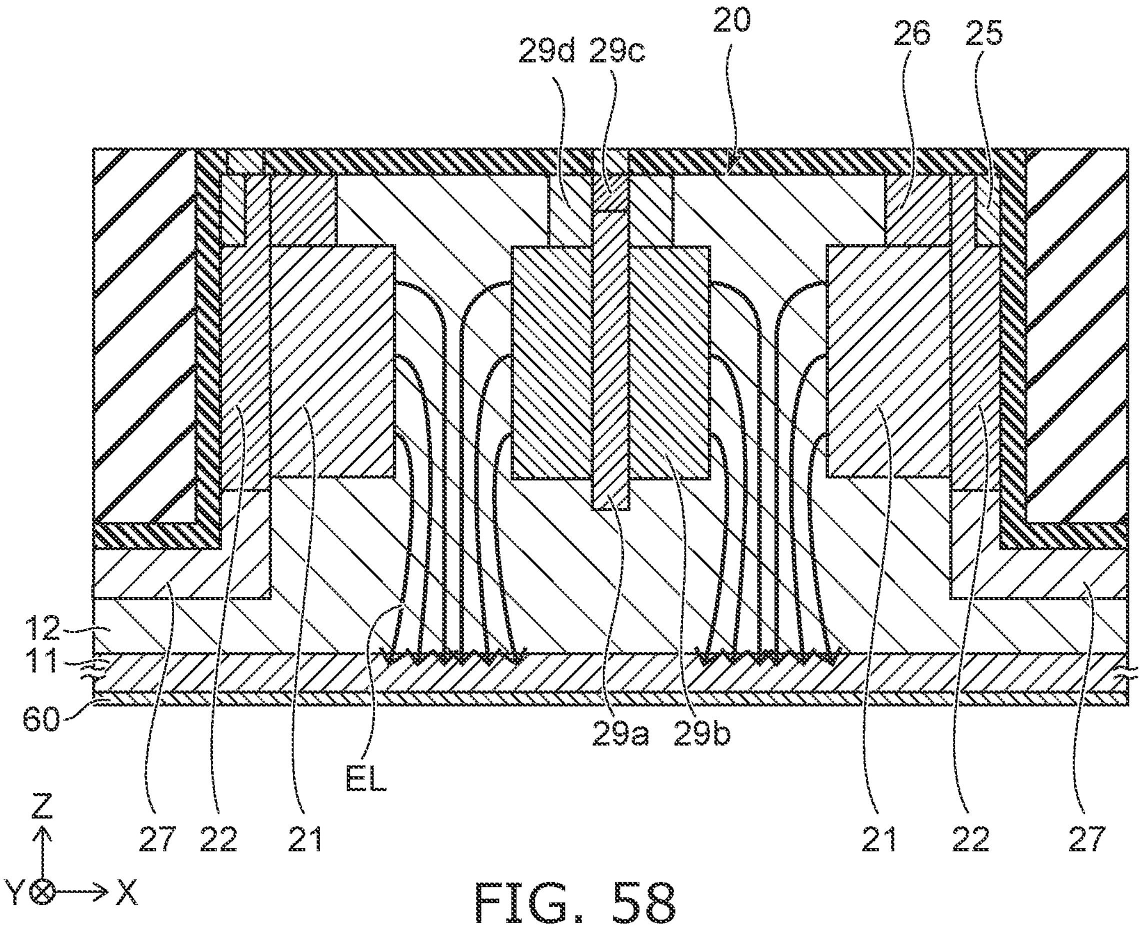
FIG. 58 is a schematic cross-sectional view showing a portion of the light detector according to the fifth embodiment.

FIG. 58 is a schematic cross-sectional view showing a portion of the light detector according to the fifth embodiment.

Operations of the light detector 5 will now be described. A reverse voltage is applied between the p-type semiconductor region 21 and the n-type semiconductor region 22 and between the p-type semiconductor region 29*b* and the n-type semiconductor region 29*a*. In other words, a negative operating voltage with respect to the pad 61 is applied to the electrode 60. The operating voltage is, for example, −60 V to −70 V. The signal when light is incident on the light detector 5 is read from the pad 61.

According to the fifth embodiment, a depletion layer spreads not only from the p-n junction between the p-type semiconductor region 21 and the n-type semiconductor region 22 but also from the p-n junction between the p-type semiconductor region 29*b* and the n-type semiconductor region 29*a*. For example, compared to the light detector 1, the region in which avalanche breakdown occurs is wider. Compared to the light detector 1, the sensitivity of the light detector 5 can be increased thereby.

Figure 59:
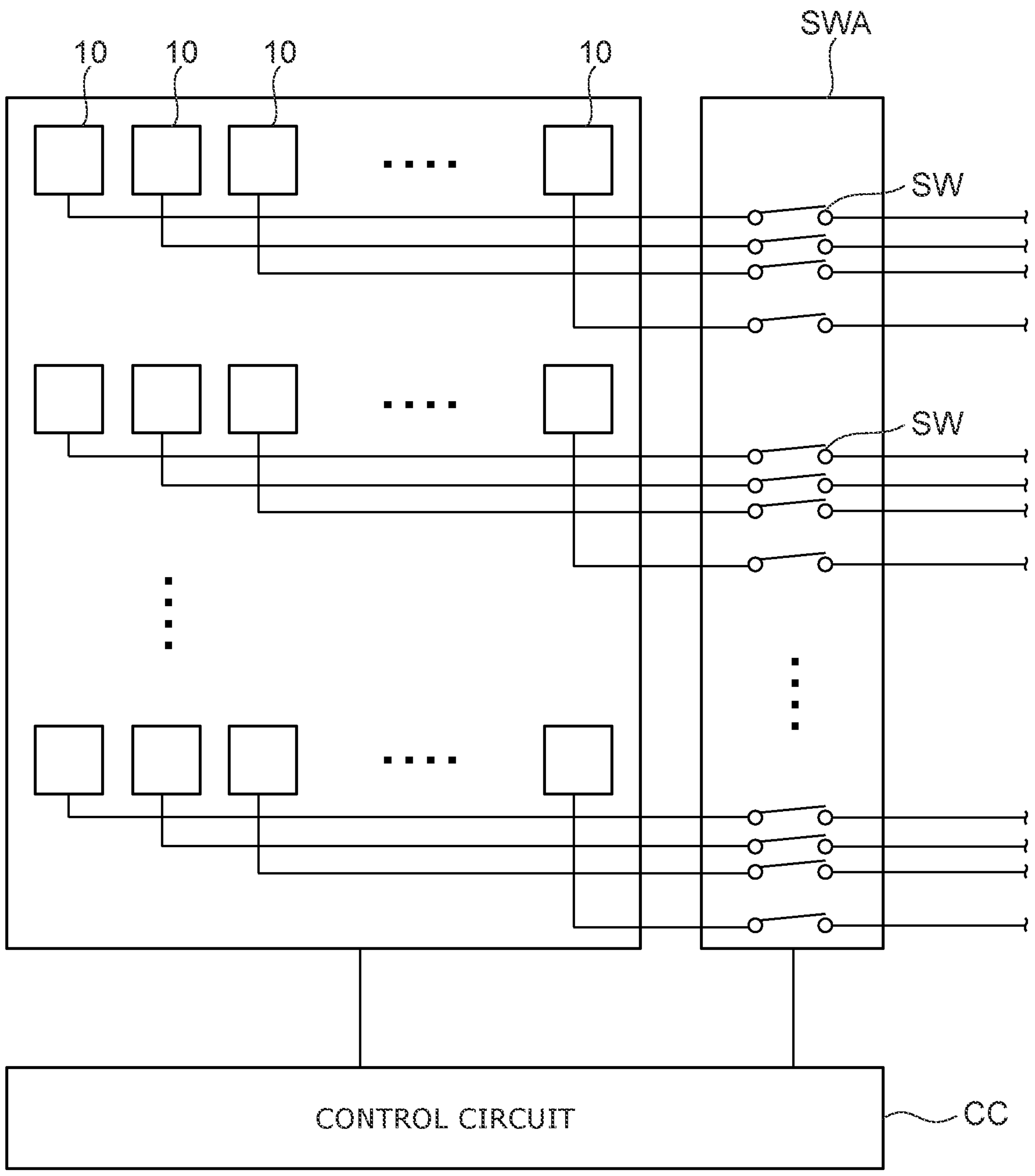
FIG. 59 is a schematic view illustrating an active quenching circuit.

FIG. 59 is a schematic view illustrating an active quenching circuit. In the light detector according to embodiments described above, a resistor that generates a large voltage drop is included as the quenching part 50. A control circuit and a switching element may be included instead of a resistor in the light detectors according to embodiments. In other words, an active quenching circuit for blocking the current is included as the quenching part 50.

As shown in FIG. 59, the active quenching circuit includes a control circuit CC and a switching array SWA. The control circuit CC includes a comparator, a control logic part, etc. The switching array SWA includes multiple switching elements SW. For example, at least a portion of the circuit elements included in the control circuit CC and the switching elements SW may be located on the p-type semiconductor layer 11 or may be located on a circuit board other than the p-type semiconductor layer 11.

One switching element SW may be provided for one element 20 as shown in FIG. 59, or one switching element SW may be provided for multiple elements 20. For example, one switching element SW is located between the first interconnect 51 and one p-type semiconductor region 21. Or, the switching element SW may be included in the first interconnect 51. When the quenching part 50 is electrically connected with the n-type semiconductor region 22, one switching element SW may be located between the second interconnect 52 and one n-type semiconductor region 22. The switching element SW may be included in the second interconnect 52.

Figure 60:
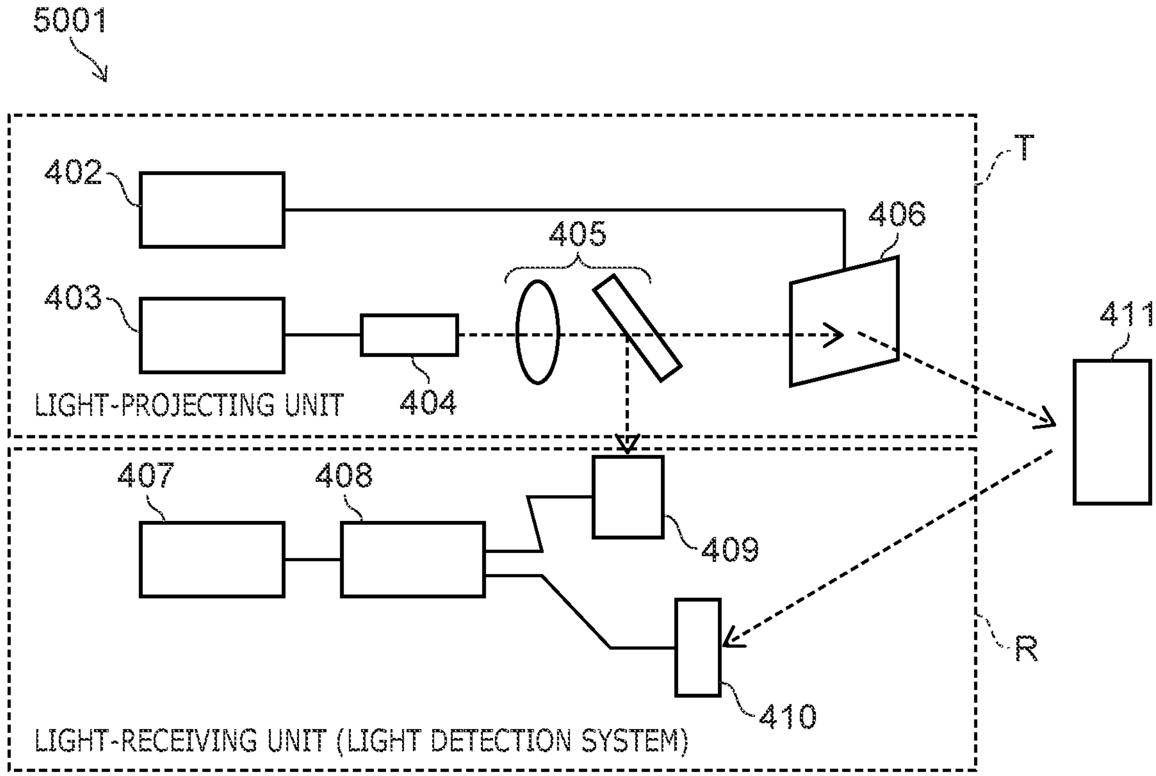
FIG. 60 is a schematic view illustrating a lidar (Laser Imaging Detection and Ranging (LIDAR)) device according to an embodiment.

FIG. 60 is a schematic view illustrating a lidar (Laser Imaging Detection and Ranging (LIDAR)) device according to an embodiment.

The embodiment is applicable to a long-distance subject detection system (LIDAR) or the like that includes a line light source and a lens. The lidar device 5001 includes a light-projecting unit T projecting laser light toward an object 411, and a light-receiving unit R (also called a light detection system) receiving the laser light from the object 411, measuring the time of the round trip of the laser light to and from the object 411, and converting the time into a distance.

In the light-projecting unit T, a light source 404 emits light. For example, the light source 404 includes a laser light oscillator and produces laser light. A drive circuit 403 drives the laser light oscillator. An optical system 405 extracts a portion of the laser light as reference light, and irradiates the rest of the laser light on the object 411 via a mirror 406. A mirror controller 402 projects the laser light onto the object 411 by controlling the mirror 406. Herein, "project" means to cause the light to strike.

In the light-receiving unit R, a reference light detector 409 detects the reference light extracted by the optical system 405. A light detector 410 receives the reflected light from the object 411. A distance measuring circuit 408 measures the distance to the object 411 based on the reference light detected by the reference light detector 409 and the reflected light detected by the light detector 410. An image recognition system 407 recognizes the object 411 based on the measurement results of the distance measuring circuit 408.

The lidar device 5001 employs light time-of-flight ranging (Time of Flight) in which the time of the round trip of the laser light to and from the object 411 is measured and converted into a distance. The lidar device 5001 is applied to an automotive drive-assist system, remote sensing, etc. Good sensitivity is obtained particularly in the near-infrared region when the light detectors of the embodiments described above are used as the light detector 410. Therefore, the lidar device 5001 is applicable to a light source of a wavelength band that is invisible to humans. For example, the lidar device 5001 can be used for obstacle detection for a mobile body.

Figure 61:
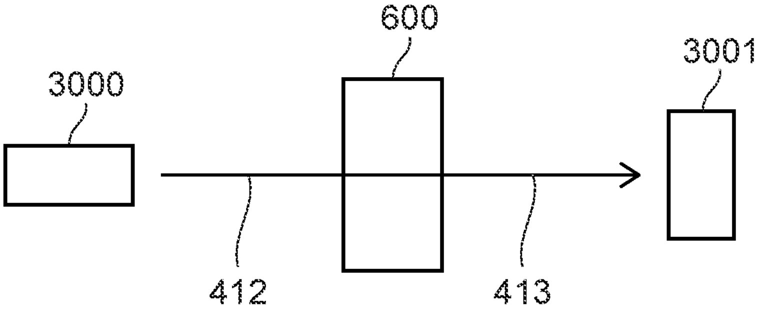
FIG. 61 describes the detection of the detection object of the lidar device.

FIG. 61 describes the detection of the detection object of the lidar device.

A light source 3000 emits light 412 toward an object 600 that is the detection object. A light detector 3001 detects light 413 that passes through the object 600, is reflected by the object 600, or is diffused by the object 600.

For example, the light detector 3001 can realize highly-sensitive detection when the light detector according to the embodiment described above is used. It is favorable to provide multiple sets of the light detector 410 and the light source 404 and to preset the arrangement relationship of the sets in the software (which is replaceable with a circuit). For example, it is favorable for the arrangement relationship of the sets of the light detector 410 and the light source 404 to be arranged at uniform spacing. Thereby, an accurate three-dimensional image can be generated by the output signals of each light detector 410 complementing each other.

Figure 62:
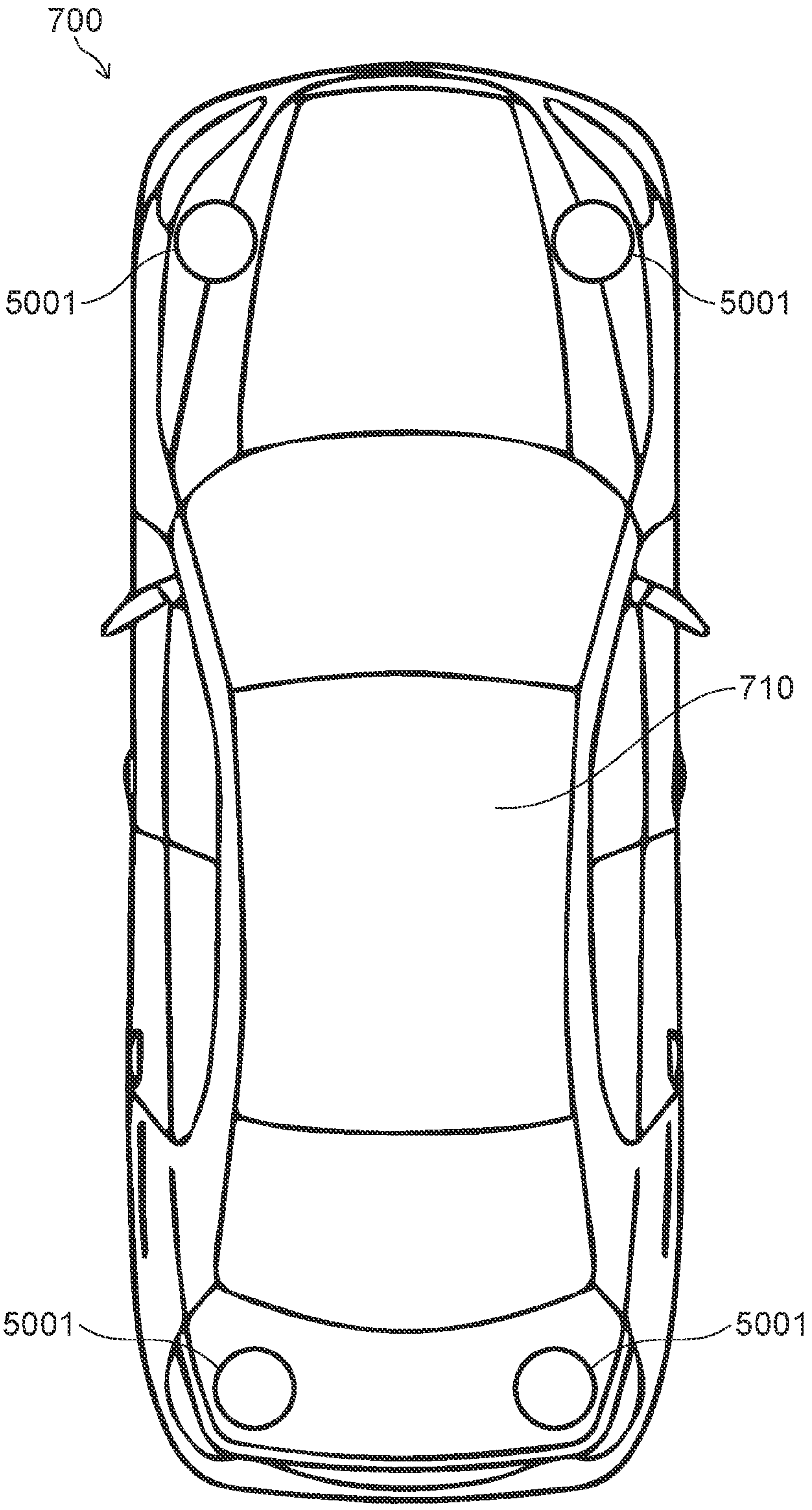
FIG. 62 is a schematic top view of a mobile body that includes the lidar device according to the embodiment.

FIG. 62 is a schematic top view of a mobile body that includes the lidar device according to the embodiment.

In the example of FIG. 62, the mobile body is a vehicle. The vehicle 700 according to the embodiment includes the lidar devices 5001 at four corners of a vehicle body 710. Because the vehicle according to the embodiment includes the lidar devices at the four corners of the vehicle body, the environment in all directions of the vehicle can be detected by the lidar devices.

Other than the vehicle illustrated in FIG. 62, the mobile body may be a drone, a robot, etc. The robot is, for example, an automatic guided vehicle (AGV). By including the lidar devices at the four corners of such mobile bodies, the environment in all directions of the mobile body can be detected by the lidar devices.

According to embodiments described above, the noise of the light detector can be improved.

The specific examples of the embodiments described above relate to a front-illuminated light detector in which light is incident on the element 20 via the insulating layer 35. Embodiments are applicable also to a back-illuminated light detector in which the light is incident on the element 20 via the p-type semiconductor layer 11. In such a case, the p-type semiconductor layer 11 is formed to be thinner.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the invention is not limited to these specific examples. For example, one skilled in the art may similarly practice the invention by appropriately selecting specific configurations of components included in the light detector such as each of the semiconductor layers, each of the semiconductor regions, the insulating part, the plug, the interconnect, the quenching part, the electrode, the pad, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all light detectors, light detection systems, lidar devices, and a mobile bodies practicable by an appropriate design modification by one skilled in the art based on the light detectors, the light detection systems, the lidar devices, and the mobile bodies described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A light detector, comprising:

an electrode;

a first semiconductor layer of a first conductivity type located on the electrode;

a plurality of elements located on the first semiconductor layer and arranged along a first direction and a second direction, the first direction and the second direction crossing each other, each of the plurality of elements including a first semiconductor region of the first conductivity type being electrically connected with the electrode via the first semiconductor layer, and a second semiconductor region located around the first semiconductor region in a first plane, the first plane being along the first and second directions, the second semiconductor region being of a second conductivity type;

a plurality of insulating parts located respectively around the plurality of elements in the first plane; and an intermediate part located around the plurality of insulating parts in the first plane, the intermediate part including a semiconductor.

2. The detector according to claim 1, wherein at least one of the plurality of insulating parts is a rounded quadrilateral, a polygon with interior angles of not less than 135 degrees, or a circular ring when viewed along a third direction, and the third direction is perpendicular to the first and second directions.

3. The detector according to claim 1, wherein a distance between the elements that are next to each other in the first direction is not less than 3 μm.

4. The detector according to claim 1, wherein the intermediate part includes:

a first intermediate region of the first conductivity type; and a second intermediate region located on the first intermediate region, and the second intermediate region is of the second conductivity type.

5. The detector according to claim 4, further comprising:

a contact plug located on the second intermediate region, the contact plug being electrically connected with the second intermediate region.

6. The detector according to claim 1, wherein each of the plurality of elements further includes a third semiconductor region surrounded with the first semiconductor region in the first plane, the third semiconductor region is of the first conductivity type, and a first-conductivity-type impurity concentration in the third semiconductor region is less than a first-conductivity-type impurity concentration in the first semiconductor region.

7. The detector according to claim 1, wherein each of the plurality of elements further includes a fourth semiconductor region surrounded with an upper portion of the second semiconductor region in the first plane, the fourth semiconductor region is of the second conductivity type, and a second-conductivity-type impurity concentration in the fourth semiconductor region is less than a second-conductivity-type impurity concentration in the second semiconductor region.

8. The detector according to claim 1, further comprising:

a plurality of fifth semiconductor regions respectively contacting bottom portions of the plurality of insulating parts, the plurality of fifth semiconductor regions being of the second conductivity type.

9. The detector according to claim 1, further comprising:

a plurality of sixth semiconductor regions located respectively between the intermediate part and the plurality of insulating parts, the plurality of sixth semiconductor regions being of the second conductivity type.

10. The detector according to claim 1, further comprising:

a resistance electrically connected with one of a plurality of the first semiconductor regions or one of a plurality of the second semiconductor regions, or a switching element electrically connected with at least one of the plurality of first semiconductor regions or at least one of the plurality of second semiconductor regions.

11. The detector according to claim 1, wherein
at least one of the plurality of elements includes an avalanche photodiode.

12. The detector according to claim 11, wherein
the avalanche photodiode operates in a Geiger mode.

13. The detector according to claim 1, further comprising:
a quenching part electrically connected with at least one of a plurality of the first semiconductor regions or at least one of a plurality of the second semiconductor regions.

14. The detector according to claim 13, further comprising:
a first electrode electrically connected with a plurality of the first semiconductor regions; and
a second electrode electrically connected with a plurality of the second semiconductor regions.

15. The detector according to claim 14, further comprising:
a first interconnect electrically connected with at least two of the plurality of first semiconductor regions; and
a second interconnect electrically connected with at least two of the plurality of second semiconductor regions,
the plurality of first semiconductor regions being electrically connected with the first electrode via at least one of the first interconnects,
the plurality of second semiconductor regions being electrically connected with the second electrode via at least one of the second interconnects.

16. A light detection system, comprising:
the light detector according to claim 1; and
a distance measuring circuit calculating a time-of-flight of light by using an output signal of the light detector.

17. A lidar device, comprising:
a light source irradiating light on an object; and
the light detection system according to claim 16 detecting light reflected by the object.

18. The device according to claim 17, further comprising:
an image recognition system generating a three-dimensional image based on an arrangement relationship of the light source and the light detector.

19. A mobile body, comprising:
the lidar device according to claim 16.

20. The detector according to claim 1, wherein
the plurality of elements are photodiodes,
the first conductivity type is p-type,
the second conductivity type is n-type,
the electrode is configured to function as an anode electrode,
each of the plurality of elements further includes:
a third semiconductor region of the first conductivity type surrounded with the first semiconductor region in the first plane, a first-conductivity-type impurity concentration in the third semiconductor region being less than a first-conductivity-type impurity concentration in the first semiconductor region; and
an n-type contact region provided on the second semiconductor region, the n-type contact region being configured to function as a cathode electrode, a second-conductivity-type impurity concentration in the n-type contact region being greater than a second-conductivity-type impurity concentration in the second semiconductor region,
the plurality of insulating parts is respectively located around a plurality of the second semiconductor regions in the first plane, and
a reverse voltage is applied between the first semiconductor region and the second semiconductor region when the light detector is operated.

21. A light detector, comprising:
a plurality of elements arranged along a first direction and a second direction, the first direction and the second direction crossing each other, each of the plurality of elements including
a first semiconductor region of a first conductivity type,
a second semiconductor region located around the first semiconductor region in a first plane, the first plane being along the first and second directions, the second semiconductor region being of a second conductivity type, and
a fourth semiconductor region of the second conductivity type surrounded with an upper portion of the second semiconductor region in the first plane, a second-conductivity-type impurity concentration in the fourth semiconductor region being less than a second-conductivity-type impurity concentration in the second semiconductor region;
a plurality of insulating parts located respectively around the plurality of elements in the first plane; and
an intermediate part located around the plurality of insulating parts in the first plane, the intermediate part including a semiconductor.

22. A light detector, comprising:
a plurality of elements arranged along a first direction and a second direction, the first direction and the second direction crossing each other, each of the plurality of elements including
a first semiconductor region of a first conductivity type, and
a second semiconductor region located around the first semiconductor region in a first plane, the first plane being along the first and second directions, the second semiconductor region being of a second conductivity type;
a plurality of insulating parts located respectively around the plurality of elements in the first plane;
an intermediate part located around the plurality of insulating parts in the first plane, the intermediate part including a semiconductor;
a quenching part electrically connected with at least one of a plurality of the first semiconductor regions or at least one of a plurality of the second semiconductor regions;
a first electrode electrically connected with a plurality of the first semiconductor regions;
a second electrode electrically connected with a plurality of the second semiconductor regions;
a first interconnect electrically connected with at least two of the plurality of first semiconductor regions; and
a second interconnect electrically connected with at least two of the plurality of second semiconductor regions,
the plurality of first semiconductor regions being electrically connected with the first electrode via at least one of the first interconnects,
the plurality of second semiconductor regions being electrically connected with the second electrode via at least one of the second interconnects.

23. A light detector, comprising:
a plurality of elements arranged along a first direction and a second direction, the first direction and the second direction crossing each other, the plurality of elements being photodiodes and each including a first semiconductor region of a first conductivity type, the first conductivity type being p-type, a second semiconductor region located around the first semiconductor region in a first plane, the first plane being along the first and second directions, the second semiconductor region being of a second conductivity type, the second conductivity type being n-type, a reverse voltage being applied between the first semiconductor region and the second semiconductor region when the light detector is operated, a third semiconductor region surrounded with the first semiconductor region in the first plane, the third semiconductor region being of the first conductivity type, a first-conductivity-type impurity concentration in the third semiconductor region being less than a first-conductivity-type impurity concentration in the first semiconductor region, a p-type contact region provided on the third semiconductor region, the p-type contact region being configured to function as an anode electrode, a first-conductivity-type impurity concentration in the p-type contact region being greater than the first-conductivity-type impurity concentration in the third semiconductor region, and an n-type contact region provided on the second semiconductor region, the n-type contact region being configured to function as a cathode electrode, a second-conductivity-type impurity concentration in the n-type contact region being greater than a second-conductivity-type impurity concentration in the second semiconductor region;

a plurality of insulating parts located respectively around a plurality of the second semiconductor regions in the first plane; and an intermediate part located around the plurality of insulating parts in the first plane, the intermediate part including a semiconductor.

24. A light detector, comprising:

a semiconductor layer of a first conductivity type, a plurality of elements located on the semiconductor layer and arranged along a first direction and a second direction, the first direction and the second direction crossing each other, each of the plurality of elements including a first semiconductor region of the first conductivity type, a second semiconductor region located around the first semiconductor region in a first plane, the first plane being along the first and second directions, the second semiconductor region being of a second conductivity type, and a third semiconductor region of the first conductivity type surrounded with the first semiconductor region in the first plane, a first-conductivity-type impurity concentration in the third semiconductor region being less than a first-conductivity-type impurity concentration in the first semiconductor region;

a plurality of insulating parts located respectively around the plurality of elements in the first plane;

an intermediate part located around the plurality of insulating parts in the first plane, the intermediate part including a semiconductor;

a first semiconductor layer of the first conductivity type, the semiconductor layer being located on the first semiconductor layer; and an electrode located under the first semiconductor layer, a plurality of the first semiconductor regions of the semiconductor layer being electrically connected with the electrode via the first semiconductor layer, the electrode being configured to function as an anode electrode, the plurality of elements being photodiodes, the first conductivity type being p-type, the second conductivity type being n-type, each of the plurality of elements further including a third semiconductor region of the first conductivity type surrounded with the first semiconductor region in the first plane, a first-conductivity-type impurity concentration in the third semiconductor region being less than a first-conductivity-type impurity concentration in the first semiconductor region, a p-type contact region located on the third semiconductor region, the p-type contact region being configured to function as an anode electrode, a first-conductivity-type impurity concentration in the p-type contact region being greater than a first-conductivity-type impurity concentration in the third semiconductor region, and an n-type contact region located on the second semiconductor region, the n-type contact region being configured to function as a cathode electrode, a second-conductivity-type impurity concentration in the n-type contact region being greater than a second-conductivity-type impurity concentration in the second semiconductor region, the plurality of insulating parts located respectively around a plurality of the second semiconductor regions in the first plane, and a reverse voltage being applied between the first semiconductor region and the second semiconductor region when the light detector is operated.

25. A light detector, comprising:

a semiconductor layer of a first conductivity type, a plurality of elements located on the semiconductor layer and arranged along a first direction and a second direction, the first direction and the second direction crossing each other, each of the plurality of elements including a first semiconductor region of the first conductivity type, a second semiconductor region located around the first semiconductor region in a first plane, the first plane being along the first and second directions, the second semiconductor region being of a second conductivity type, and a third semiconductor region of the first conductivity type surrounded with the first semiconductor region in the first plane, a first-conductivity-type impurity concentration in the third semiconductor region being less than a first-conductivity-type impurity concentration in the first semiconductor region;

a plurality of insulating parts located respectively around the plurality of elements in the first plane;

an intermediate part located around the plurality of insulating parts in the first plane, the intermediate part including a semiconductor, wherein the plurality of elements are photodiodes, the first conductivity type is p-type, the second conductivity type is n-type, each of the plurality of elements includes:

a third semiconductor region of the first conductivity type surrounded with the first semiconductor region in the first plane, a first-conductivity-type impurity concentration in the third semiconductor region being less than a first-conductivity-type impurity concentration in the first semiconductor region; and a p-type contact region located on the third semiconductor region, the p-type contact region being configured to function as an anode electrode, a first-conductivity-type impurity concentration in the p-type contact region being greater than a first-conductivity-type impurity concentration in the third semiconductor region, the intermediate part includes a second intermediate region and a third intermediate region, a lower end of the second intermediate region is positioned lower than lower ends of the plurality of insulating parts, the third intermediate region is located on the second intermediate region and configured to function as a cathode electrode, a second-conductivity-type impurity concentration in the third intermediate region is greater than a second-conductivity-type impurity concentration in the second intermediate region, a reverse voltage is applied between the first semiconductor region and the second semiconductor region when the light detector is operated, the plurality of insulating parts is respectively located around a plurality of the first semiconductor regions in the first plane, and a portion of each of a plurality of the second semiconductor regions is positioned below a respective one of the plurality of insulating parts.

26. A light detector, comprising:

a semiconductor layer of a first conductivity type, a plurality of elements located on the semiconductor layer and arranged along a first direction and a second direction, the first direction and the second direction crossing each other, each of the plurality of elements including a first semiconductor region of the first conductivity type, a second semiconductor region located around the first semiconductor region in a first plane, the first plane being along the first and second directions, the second semiconductor region being of a second conductivity type, and a third semiconductor region of the first conductivity type surrounded with the first semiconductor region in the first plane, a first-conductivity-type impurity concentration in the third semiconductor region being less than a first-conductivity-type impurity concentration in the first semiconductor region;

a plurality of insulating parts located respectively around the plurality of elements in the first plane;

an intermediate part located around the plurality of insulating parts in the first plane, the intermediate part including a semiconductor;

a first semiconductor layer of the first conductivity type, the semiconductor layer being located on the first semiconductor layer; and an electrode located under the first semiconductor layer, a plurality of the first semiconductor regions of the semiconductor layer being electrically connected with the electrode via the first semiconductor layer, the plurality of elements being photodiodes, the first conductivity type being p-type, the second conductivity type being n-type, the electrode being configured to function as an anode electrode, each of the plurality of elements further including a third semiconductor region of the first conductivity type surrounded with the first semiconductor region in the first plane, a first-conductivity-type impurity concentration in the third semiconductor region being less than a first-conductivity-type impurity concentration in the first semiconductor region, a p-type semiconductor region, a first-conductivity-type impurity concentration in the third semiconductor region being less than a first-conductivity-type impurity concentration in the p-type semiconductor region, an n-type semiconductor region, the first semiconductor region being positioned between the second semiconductor region and the n-type semiconductor region in the first plane, the third semiconductor region being positioned between the first semiconductor region and the n-type semiconductor region in the first plane, the p-type semiconductor region being positioned between the third semiconductor region and the n-type semiconductor region in the first plane, a first n-type contact region located on the n-type semiconductor region, the n-type contact region being configured to function as a cathode electrode, a second-conductivity-type impurity concentration in the first n-type contact region being greater than a second-conductivity-type impurity concentration in the n-type semiconductor region, and a second n-type contact region located on the second semiconductor region, the n-type contact region being configured to function as a cathode electrode, a second-conductivity-type impurity concentration in the second n-type contact region being greater than a second-conductivity-type impurity concentration in the second semiconductor region, the plurality of insulating parts located respectively around a plurality of the second semiconductor regions in the first plane, and a reverse voltage being applied between the first semiconductor region and the second semiconductor region and between the p-type semiconductor region and the n-type semiconductor region when the light detector is operated.

* * * * *